US011940842B2

United States Patent
Kang et al.

(10) Patent No.: US 11,940,842 B2
(45) Date of Patent: Mar. 26, 2024

(54) ELECTRONIC DEVICE INCLUDING FLEXIBLE DISPLAY

(71) Applicant: Samsung Electronics Co., Ltd., Suwon-si (KR)

(72) Inventors: Youngmin Kang, Suwon-si (KR); Junyoung Choi, Suwon-si (KR); Moonchul Shin, Suwon-si (KR); Yeonggyu Yoon, Suwon-si (KR); Seungjoon Lee, Suwon-si (KR); Joongyeon Cho, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 268 days.

(21) Appl. No.: 17/505,076

(22) Filed: Oct. 19, 2021

(65) Prior Publication Data
US 2022/0113765 A1    Apr. 14, 2022

Related U.S. Application Data

(63) Continuation of application No. PCT/KR2021/013940, filed on Oct. 8, 2021.

(30) Foreign Application Priority Data

Oct. 12, 2020  (KR) .......................... 10-2020-0131405
Dec. 22, 2020  (KR) .......................... 10-2020-0181060

(51) Int. Cl.
*G06F 1/16*    (2006.01)
*H05K 5/02*    (2006.01)
*H05K 7/18*    (2006.01)

(52) U.S. Cl.
CPC .......... *G06F 1/1652* (2013.01); *G06F 1/1681* (2013.01); *H05K 5/0226* (2013.01); *H05K 7/183* (2013.01); *G06F 2200/1612* (2013.01)

(58) Field of Classification Search
CPC ................ G06F 1/1652; G06F 1/1681; G06F 2200/1612; G06F 1/16; G06F 1/1624; H05K 5/0226; H05K 7/183; G09F 9/30
See application file for complete search history.

(56) References Cited

U.S. PATENT DOCUMENTS 10,742,784 B1    8/2020  Jo et al.
10,868,264 B2   12/2020  Shin et al.
(Continued)

FOREIGN PATENT DOCUMENTS

CN    108259649 A    7/2018
CN    111508362 A    8/2020
(Continued)

OTHER PUBLICATIONS

International Search Report with Written Opinion and English translation dated Jan. 14, 2022; International Appln. No. PCT/KR2021/013940.

(Continued)

*Primary Examiner* — Lisa Lea-Edmonds
(74) *Attorney, Agent, or Firm* — Jefferson IP Law, LLP

(57) ABSTRACT

An electronic device is provided with a flexible display. The electronic device includes a housing, a flexible display, a display support structure including a plurality of support bars supporting a rear surface of the flexible display, and a display support disposed to correspond to the flexible display, a first guide rail including a recess formed along a path in which the display support structure is moved when the flexible display is drawn outside the housing or introduced into the inner space of the housing, a second guide rail including a recess formed along the path and into which end portions of the plurality of support bars are inserted, and a rotation part.

23 Claims, 34 Drawing Sheets

(56) References Cited

U.S. PATENT DOCUMENTS

| | | |
|---|---|---|
| 10,972,592 B2 | 4/2021 | Song et al. |
| 11,042,195 B1 | 6/2021 | Hong et al. |
| 11,574,570 B2* | 2/2023 | Kang .................... G06F 1/1652 |
| 11,595,505 B2* | 2/2023 | Noh .................... H04M 1/0241 |
| 11,595,510 B2* | 2/2023 | Noh .................... G06F 1/1637 |
| 11,625,067 B2* | 4/2023 | Kim .................... G06F 3/0346 |
| | | 345/619 |
| 11,709,594 B2* | 7/2023 | Noh .................... H04M 1/0237 |
| | | 345/173 |
| 2019/0172377 A1 | 6/2019 | Kim et al. |
| 2020/0267851 A1 | 8/2020 | Hou et al. |
| 2021/0044683 A1* | 2/2021 | He .................... G06F 1/1652 |
| 2022/0113765 A1* | 4/2022 | Kang .................... G06F 1/1652 |
| 2023/0075243 A1* | 3/2023 | Song .................... H04M 1/0268 |
| 2023/0103303 A1* | 4/2023 | Kang .................... G06F 1/1624 |
| | | 361/679.27 |
| 2023/0145655 A1* | 5/2023 | Shin .................... G06F 1/1652 |
| | | 361/807 |
| 2023/0152850 A1* | 5/2023 | Kang .................... H04M 1/0268 |
| | | 361/679.01 |
| 2023/0152859 A1* | 5/2023 | Kang .................... G06F 1/1652 |
| | | 361/679.01 |
| 2023/0156116 A1* | 5/2023 | Yoon .................... G09F 9/30 |
| | | 455/575.4 |
| 2023/0156945 A1* | 5/2023 | Cho .................... G06F 1/1656 |
| | | 361/807 |
| 2023/0161382 A1* | 5/2023 | Kwak .................... G06F 1/1652 |
| | | 345/173 |
| 2023/0176615 A1* | 6/2023 | Choi .................... G06F 1/1624 |
| | | 361/679.55 |
| 2023/0177990 A1* | 6/2023 | Kang .................... G09G 3/035 |
| | | 345/694 |
| 2023/0188630 A1* | 6/2023 | Kim .................... G06F 1/16 |
| | | 455/575.4 |
| 2023/0251688 A1* | 8/2023 | Han .................... G06F 1/1652 |
| | | 361/679.27 |

FOREIGN PATENT DOCUMENTS

| | | |
|---|---|---|
| EP | 3 893 473 A1 | 10/2021 |
| KR | 10-2016-0141255 A | 12/2016 |
| KR | 10-2019-0113128 A | 10/2019 |
| KR | 10-2020-0099455 A | 8/2020 |
| KR | 10-2020-0099612 A | 8/2020 |
| KR | 10-2306982 B1 | 10/2021 |

OTHER PUBLICATIONS

Extended European Search Report dated Dec. 12, 2023, issued in European Application No. 21880432.6-1224.

* cited by examiner

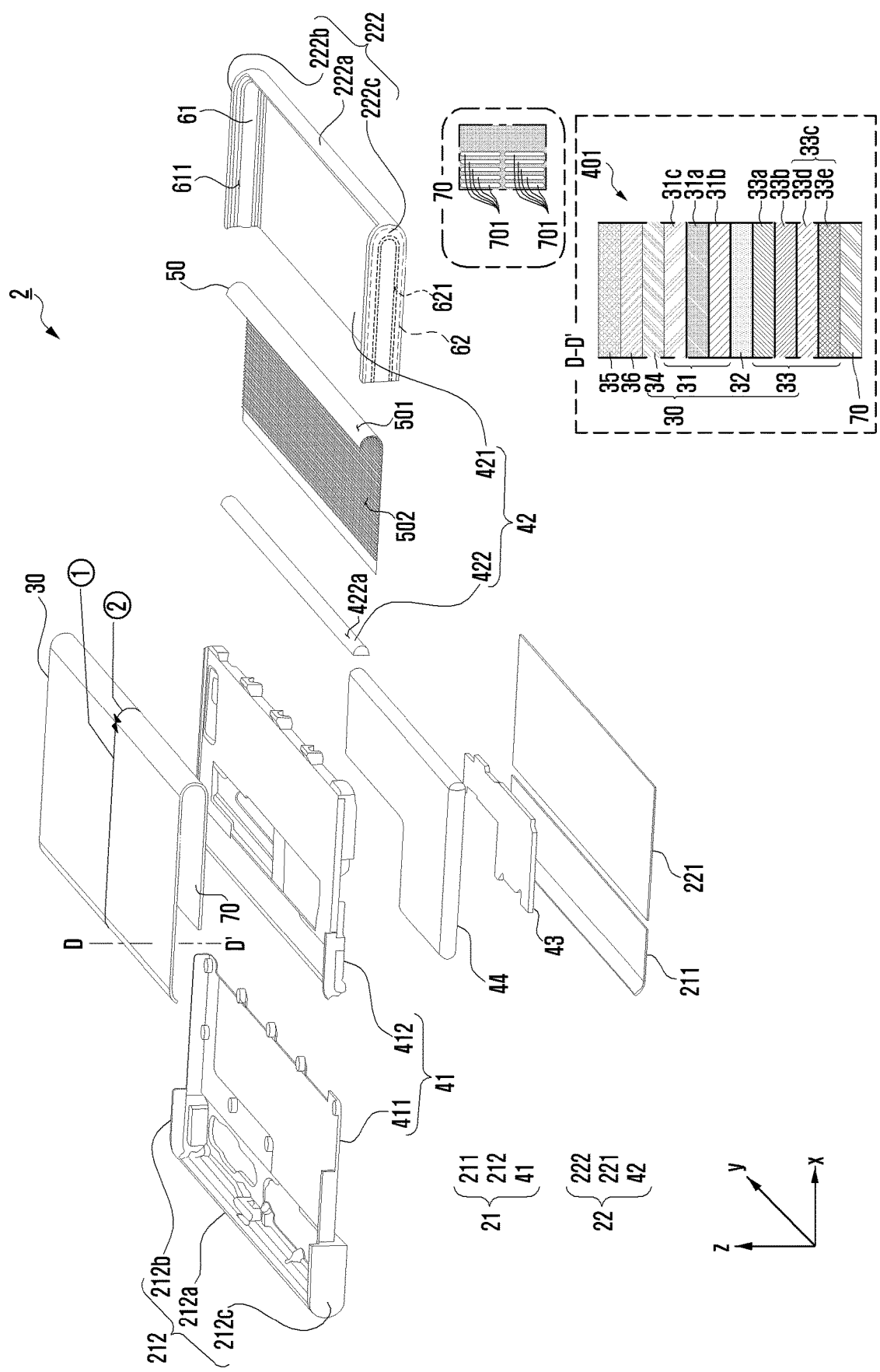

ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/KR2021/013940, filed on Oct. 8, 2021, which is based on and claims the benefit of a Korean patent application number 10-2020-0131405, filed on Oct. 12, 2020, in the Korean Intellectual Property Office, and of a Korean patent application number 10-2020-0181060, filed on Dec. 22, 2020, in the Korean Intellectual Property Office, the disclosure of each of which is incorporated by reference herein in its entirety.

TECHNICAL FIELD

The disclosure relates to an electronic device including a flexible display.

BACKGROUND ART

With the development of digital technology, electronic devices are being provided in various forms such as smart phones, tablet personal computers (PCs), or personal digital assistants (PDA). Electronic devices are being designed to provide a larger screen while maintaining portability.

The above information is presented as background information only, and to assist with an understanding of the disclosure. No determination has been made, and no assertion is made, as to whether any of the above might be applicable as prior art with regard to the disclosure.

DISCLOSURE OF INVENTION

Technical Problem

The electronic device may be, for example, implemented to expand a screen in a slide manner. A portion of a flexible display may be drawn out from an inner space of the electronic device, thus, a screen may be expanded. When the screen is expanded or reduced, friction between sliding related elements may make it difficult to smoothly perform a sliding operation.

Aspects of the disclosure are to address at least the above-mentioned problems and/or disadvantages, and to provide at least the advantages described below. Accordingly, an aspect of the disclosure is to provide an electronic device including a flexible display that enables a smooth and soft slide operation.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a housing, a flexible display disposed in the housing so that at least a portion thereof is drawn outside the housing or introduced into an inner space of the housing, a display support structure including a plurality of support bars supporting a rear surface of the flexible display, wherein the plurality of support bars each include a first end portion, a second end portion, and a display support disposed to correspond to the flexible display between the first end portion and the second end portion, a first guide rail including a recess formed along a path in which the display support structure is moved when at least a portion of the flexible display is drawn outside the housing or introduced into the inner space of the housing, and into which the first end portions of the plurality of support bars are inserted, a second guide rail including a recess formed along the path and into which second end portions of the plurality of support bars are inserted, and a rotation part rotatably disposed in at least one of the first end portions in the recess of the first guide rail and rotatably disposed in at least one of the second end portions in the recess of the second guide rail.

Advantageous Effects of Invention

Because an electronic device including a flexible display according to various embodiments of the disclosure can expand or reduce a screen by a smooth and soft slide operation, reliability of the electronic device can be improved.

Further, effects obtainable or predicted by various embodiments of the disclosure may be directly or implicitly disclosed in a detailed description of the embodiments of the disclosure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which:

FIG. 4 is an exploded view illustrating the electronic device of FIG. 2A according to an embodiment of the disclosure;

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
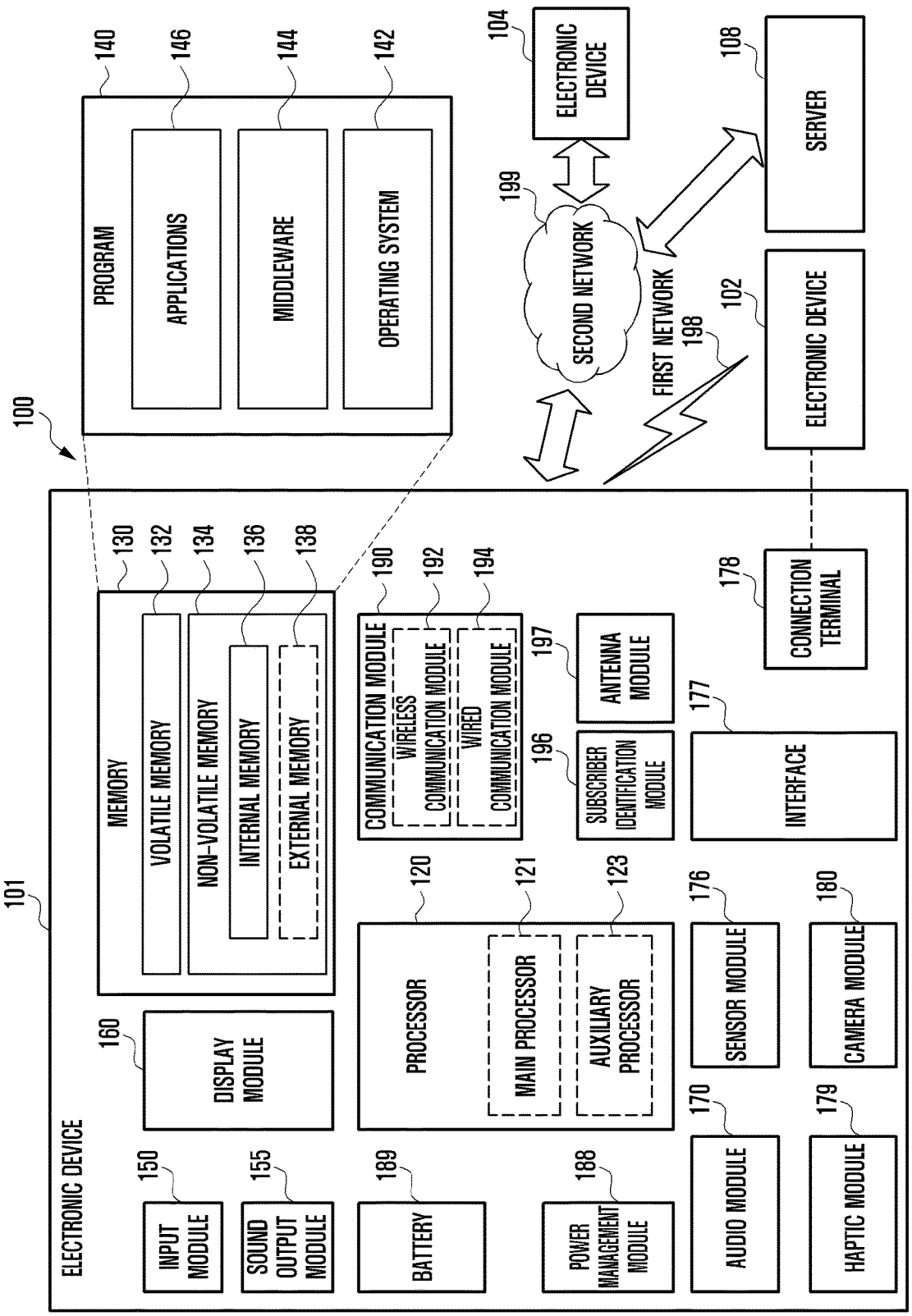
FIG. 1 is a block diagram illustrating an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identity module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176 (e.g., the sensor module 176, the camera module 180, or the antenna module 197)

may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, an auxiliary processor 123 (e.g., a neural network processing device) may include a hardware structure specialized for processing an artificial intelligence model. The artificial intelligence model may be created through machine learning. Such learning may be performed, for example, in the electronic device 101 itself on which artificial intelligence is executed, or may be performed through a separate server (e.g., the server 108). The learning algorithm may include, for example, supervised learning, unsupervised learning, semi-supervised learning, or reinforcement learning, but is not limited thereto. The artificial intelligence model may include a plurality of artificial neural network layers. An artificial neural network may be any of a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-networks, or a combination of two or more of the above-mentioned networks, but is not limited to the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and/or an external memory 138.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high-definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). The connection terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or a standard of the Infrared Data Association (IrDA)) or the second network 199 (e.g., a long-range communication network, such as a legacy cellular network, 5th generation network, a next generation network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network and a next-generation communication technology, such as a new radio access technology. An NR access technology may support high-speed transmission of high-capacity data (i.e., an enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) in order to achieve, for example, a high data transmission rate. The wireless communication module 192 may support various technologies for securing performance in a high-frequency band, such as beamforming, massive multiple-input and multiple-output (MIMO), and full-dimensional multiple-input and multiple-output (FD-MIMO), an array antenna, analog beam-forming, or a large-scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate for realizing eMBB (e.g., 20 Gbps or more), loss coverage for realizing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a PCB). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, an RFIC that is disposed on or adjacent to a first surface (e.g., the bottom surface) of the printed circuit board and is capable of supporting a predetermined high-frequency band (e.g., a mmWave band), and a plurality of antennas (e.g., array antennas) that is disposed on or adjacent to a second surface (e.g., the top surface or the side surface) of the printed circuit board and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, a mobile edge computing (MEC), or client-server computing technology may be used, for example. The electronic device 101 may provide an ultra-low delay service using, for example, distributed computing or mobile edge computing. In another embodiment of the disclosure, the external electronic device 104 may include an Internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on a 5G communication technology and an IoT-related technology.

An electronic device according to an embodiment of the disclosure may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

As used herein, each of such phrases as "A or B," "at least one of A and B," "at least one of A or B," "A, B, or C," "at least one of A, B, and C," and "at least one of A, B, or C" may include any one of, or all possible combinations of the items enumerated together in a corresponding one of the phrases.

As used herein, such terms as "1st" and "2$^{nd}$," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
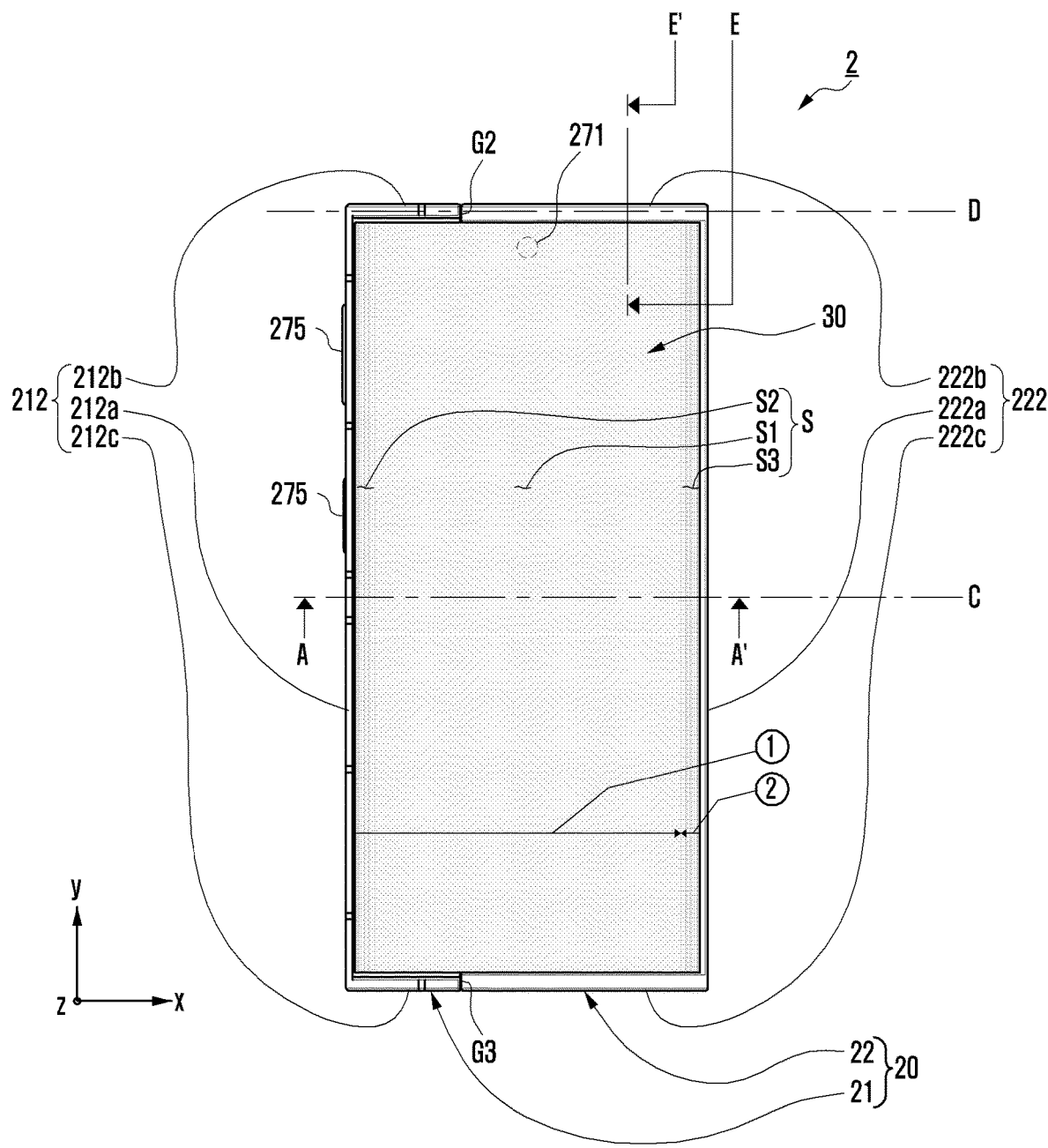
FIG. 2A is a front perspective view illustrating an electronic device in a closed state according to an embodiment of the disclosure.

FIG. 2A is a front perspective view illustrating an electronic device in a closed state according to an embodiment of the disclosure.

Figure 2B:
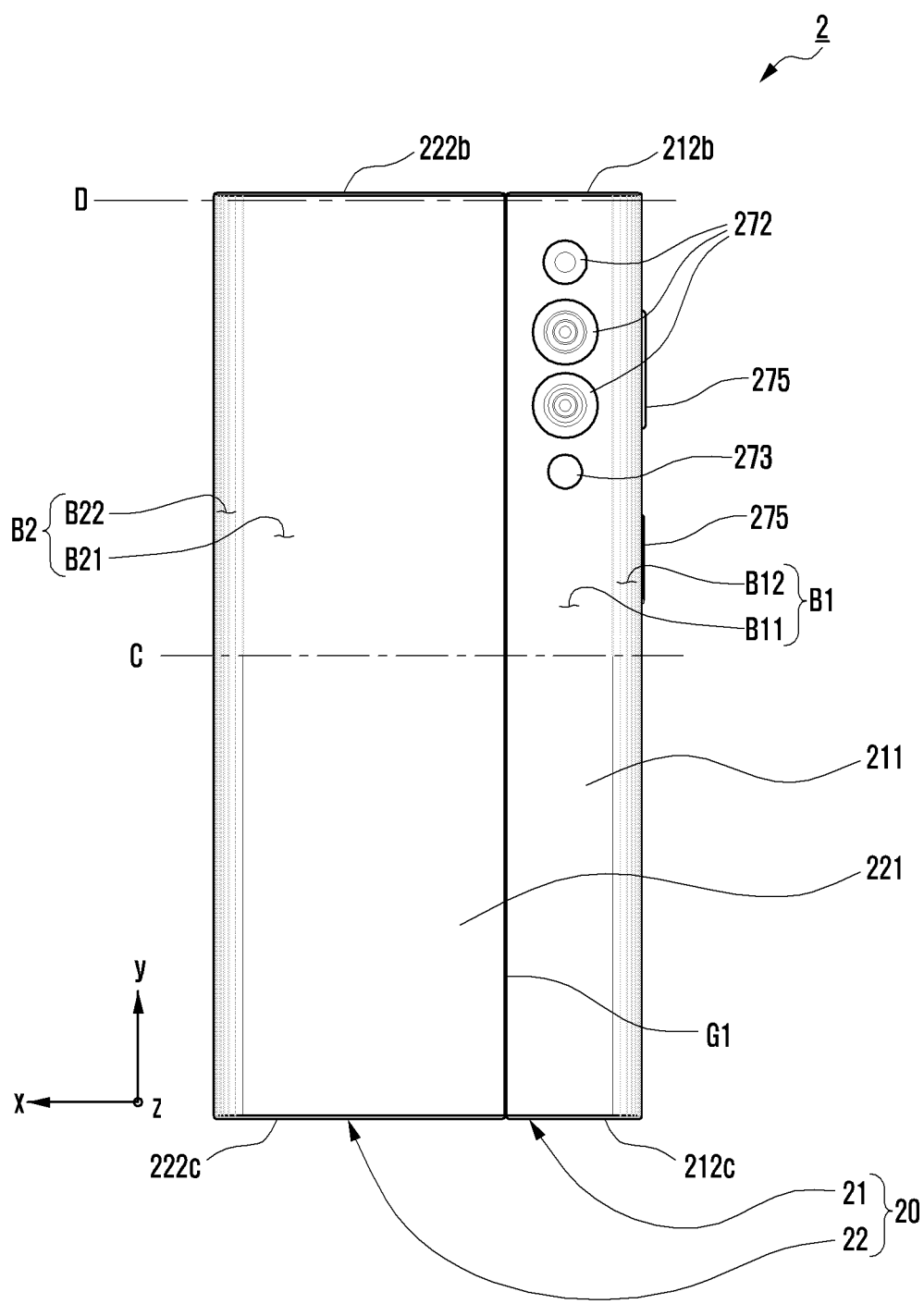
FIG. 2B is a rear perspective view illustrating an electronic device in a closed state according to an embodiment of the disclosure.

FIG. 2B is a rear perspective view illustrating an electronic device in a closed state according to an embodiment of the disclosure.

Figure 3A:
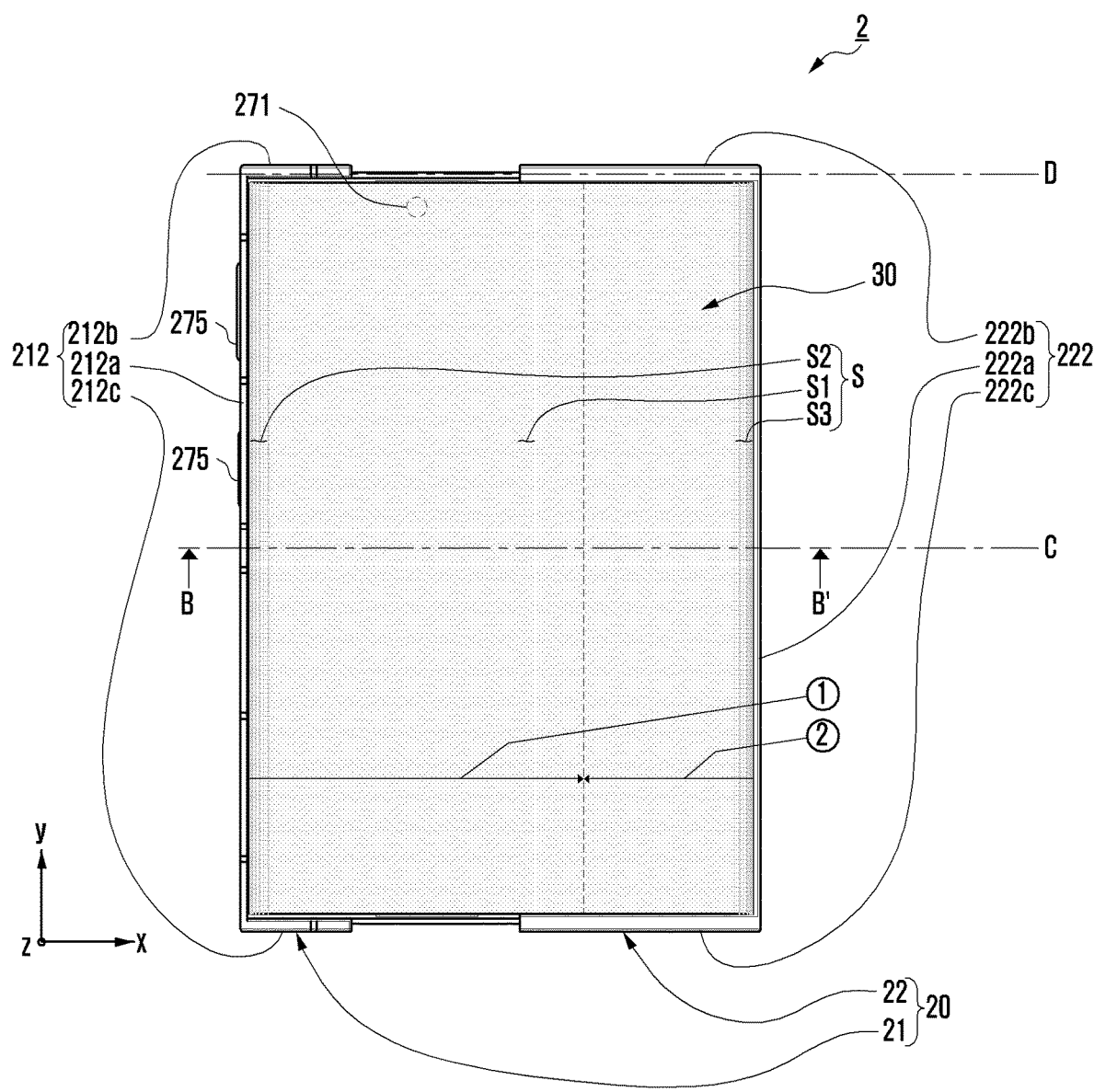
FIG. 3A is a front perspective view illustrating an electronic device in an open state according to an embodiment of the disclosure.

FIG. 3A is a front perspective view illustrating an electronic device in an open state according to an embodiment of the disclosure.

Figure 3B:
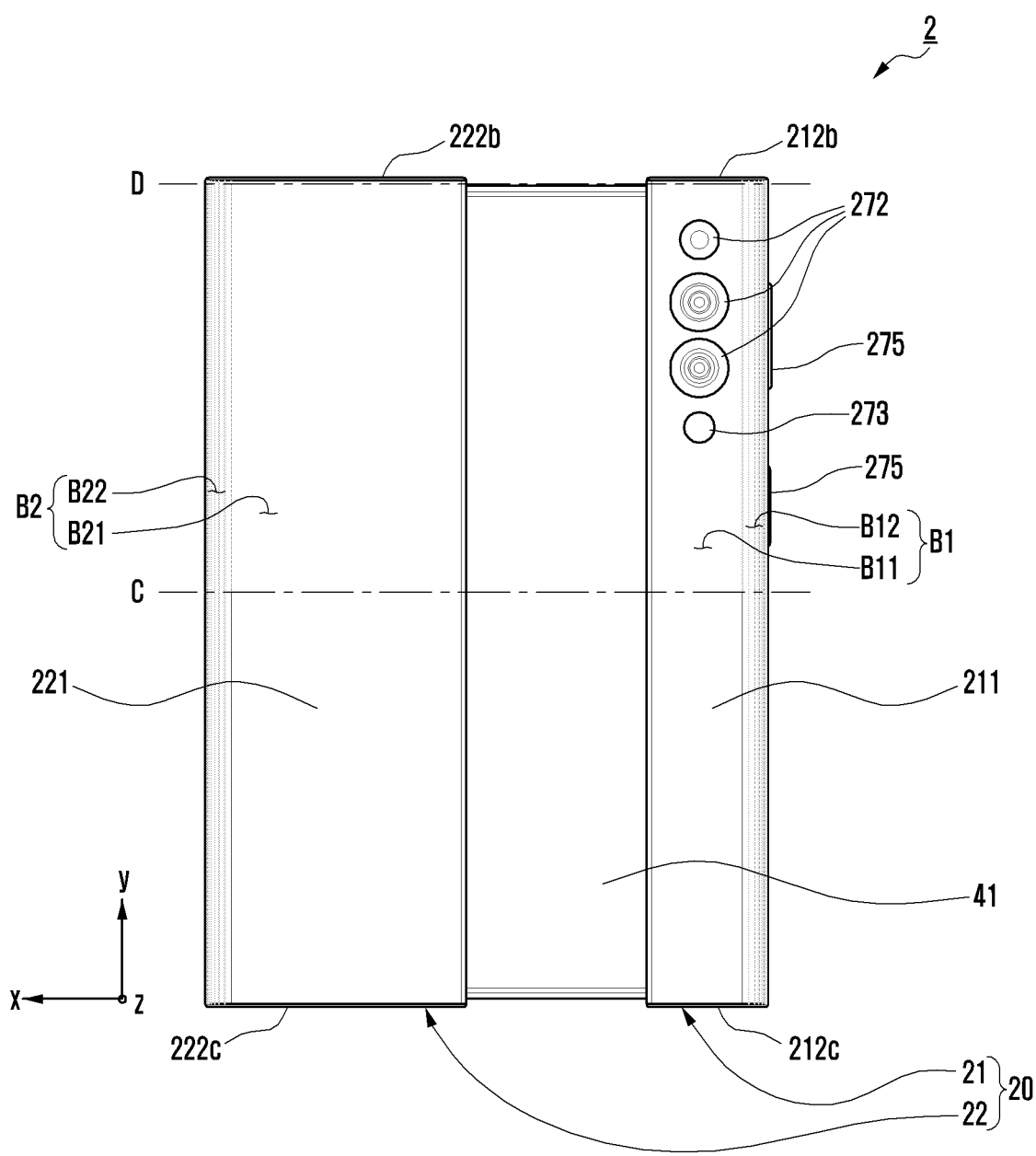
FIG. 3B is a rear perspective view illustrating an electronic device in an open state according to an embodiment of the disclosure.

FIG. 3B is a rear perspective view illustrating an electronic device in an open state according to an embodiment of the disclosure.

Referring to FIGS. 2A, 2B, 3A, and 3B, an electronic device 2 may include a housing (or housing structure) 20 and a flexible display 30. The housing 20 may include a first housing part (or first housing structure) 21 and a second housing part (or second housing structure) 22. The second housing part 22 may be slidable with respect to the first housing part 21. A sliding structure for sliding of the second housing part 22 may be provided between the first housing part 21 and the second housing part 22. The sliding structure may include, for example, a guide rail and a slide or a roller guided and moved by the guide rail. The sliding structure may be implemented in various other methods. The flexible display 30 may form a screen (or display area) S visible from the outside of the electronic device 2. The flexible display 30 may include a first area ① corresponding to the first housing part 21 and a second area ② extended from the first area ① and corresponding to the second housing part 22. At least a portion of the second area ② may be drawn outside the electronic device 2 or introduced into the electronic device 2 according to sliding of the second housing part 22, thus, a size of the screen S may vary. The second area ② is a bent portion of the flexible display 30 in a state change (e.g., switch between a closed state and an open state) of the electronic device 2 and may be referred to as, for example, other terms such as a 'bendable area' or a 'bendable section.' FIG. 2A illustrates the electronic device 2 in a state in which the screen S is not expanded, and FIG. 3A illustrates the electronic device 2 in a state in which the screen S is expanded. The state in which the screen S is not expanded is a state in which the second housing part 22 is not moved in a first direction (e.g., +x axis direction) with respect to the first housing part 21, and may be referred to as a closed state of the electronic device 2. The state in which the screen S is expanded is a state in which the second housing part 22 is not moved further in the first direction, i.e., is moved to the maximum in the first direction, and may be referred to as an open state of the electronic device 2. In some embodiments, the open state may include a fully open state (see FIG. 3A) or an intermediated state. The intermediate state may refer to a state between a closed state (see FIG. 2A) and a fully open state. In some embodiments, when the second housing part 22 is at least partially moved in the first direction with respect to the first housing part 21, it may be referred to as 'slide-out' of the second housing part 22. In some embodiments, when the second housing part 22 is moved at least partially in a second direction (e.g., −x axis direction) opposite to the first direction with respect to the first housing part 21, it may be referred to as 'slide-in' of the second housing part 22. Hereinafter, the first direction may be referred to as a 'slide-out direction' and the second direction may be referred to as a 'slide-in direction.' In the electronic device 2 having an expandable screen S corresponding to slide-out of the second housing part 22, the flexible display 30 may be referred to as other terms such as an 'expandable display' or a 'slide-out display.'

According to an embodiment, the screen S may include a first flat portion S1, a first curved portion S2, and/or a second curved portion S3. The first flat portion S1 may be interposed between the first curved portion S2 and the second curved portion S3. The first curved portion S2 and the second curved portion S3 may be curved from the first flat portion S1 toward the rear surface of the electronic device 2 (e.g., a surface positioned opposite to the screen S). The first curved portion S2 and the second curved portion S3 may be, for example, substantially symmetrical with the first flat portion S1 interposed therebetween. The first flat portion S1 may expand or contract according to a change in state of the electronic device 2 (e.g., switch between a closed state and an open state). Even when a state of the electronic device 2 changes, the second curved portion S3 may be provided in substantially the same shape. A portion forming the second curved portion S3 among the second area ② of the flexible display 30 may vary according to a change in a state of the electronic device 2. The first curved portion S2 may be positioned opposite to the second curved portion S3 in a closed state or an open state of the electronic device 2 to improve an aesthetic impression of the screen S. According to some embodiments, the first flat portion S1 may be implemented in an expanded form without the first curved portion S2.

According to an embodiment, the first housing part 21 may include a first back cover 211 and a first side cover 212. The first back cover 211 may be positioned at the opposite side of the screen S. The first back cover 211 may overlap a partial area of the screen S when viewed from above the screen S (e.g., when viewed in a −z axis direction). The first side cover 212 may partially enclose a space between the first back cover 211 and the screen S, and form a side portion of the electronic device 2. The first side cover 212 may include, for example, a first cover portion 212a, a second cover portion 212b, and/or a third cover portion 212c. The first cover portion 212a may be positioned toward the first curved portion S2 of the screen S. The second cover portion 212b may be extended from one end portion of the first cover portion 212a in a slide-out direction (e.g., +x-axis direction). The third cover portion 212c may be extended in a slide-out direction from the other end portion of the first cover portion 212a. According to an embodiment, the first cover portion 212a, the second cover portion 212b, and the third cover portion 212c may be integrally formed, and include the same material (e.g., metal (e.g., aluminum, stainless steel (STS), or magnesium), or polymer).

According to an embodiment, the second housing part 22 may include a second back cover 221 and a second side cover 222. The second back cover 221 may be positioned at the opposite side of the screen S. The second back cover 221 may overlap a partial area of the screen S when viewed from above the screen S. The second side cover 222 may partially enclose a space between the second back cover 221 and the screen S, and form a side portion of the electronic device 2. The second side cover 222 may include, for example, a first cover portion 222a positioned toward a second curved portion S3 of the screen S, a second cover portion 222b extended in a slide-in direction (e.g., −x-axis direction) from one end portion of the first cover portion 222a, and/or a third cover portion 222c extended in the slide-in direction from the other end portion of the first cover portion 222a. According to an embodiment, the first cover portion 222a, the second cover portion 222b, and the third cover portion 222c of the second side cover 222 may be integrally formed, and include the same material (e.g., metals (e.g., aluminum, stainless steel (STS), or magnesium), or polymer). The first cover portion 212a of the first side cover 212 and the first cover portion 222a of the second side cover 222 may be extended parallel to each other in a third direction (e.g., y-axis direction) orthogonal to a slide-out direction (or slide-in direction). The second cover portion 212b of the first side cover 212 and the second cover portion 222b of the second side cover 222 may be positioned toward one edge of the screen S. The third cover portion 212c of the first side cover 212 and the third cover portion 222c of the second side cover 222 may be positioned toward the other edge of the screen S. The housing 20 may include a first boundary portion G1 between the first housing part 21 and the second housing part 22 corresponding to the first back cover 211 and the second back cover 221. The housing 20 may include a second boundary portion G2 between the first housing part 21 and the second housing part 22 corresponding to the second cover portion 212b of the first side cover 212 and the second cover portion 222b of the second side cover 222. The housing 20 may include a third boundary portion G3 between the first housing part 21 and the second housing part 22 corresponding to the third cover portion 212c of the first side cover 212 and the third cover portion 222c of the second side cover 222. When viewed from above the screen S (e.g., when viewed in a −z-axis direction), the second boundary portion G2 and the third boundary portion G3 may be aligned in a third direction (e.g., y-axis direction). The first boundary portion G1, the second boundary portion G2, and the third boundary portion G3 may correspond to a portion where the first housing part 21 and the second housing part 22 substantially abut against an external shape of the electronic device 2 when the electronic device 2 is switched from an open state to a closed state.

According to an embodiment, the electronic device 2 may include a first support structure 41 (see FIG. 3B) coupled to the first housing part 21 or formed at least partially integrally with the first housing part 21. The first area ① of the flexible display 30 may be coupled to the first support structure 41. The electronic device 2 may include a second support structure (reference numeral 42 of FIG. 4) positioned in the second housing part 22 corresponding to the second area ② of the flexible display 30. In slide-out of the second housing part 22, due to the spatial position relationship between the first support structure 41 coupled to the first area ① and the second support structure (reference numeral 42 of FIG. 4) corresponding to at least a portion of the second area ②, at least a portion of the second area ② may be drawn outside through between the first cover portion 222a and the second support structure (reference numeral 42 of FIG. 4). In slide-in of the second housing part 22, due to the spatial position relationship between the first support structure 41 coupled to the first area ① and the second support structure (reference numeral 42 of FIG. 4) corresponding to at least a portion of the second area ②, at least a portion of the second area ② may be introduced into the housing 20 through between the first cover portion 222a and the second support structure (reference numeral 42 of FIG. 4). One surface of the first support structure 41 coupled to the first area ① of the flexible display 30 may include, for example, a flat area and a curved area. A flat area of the first support structure 41 may contribute to formation of the first flat portion S1 of the screen S. A curved area of the first support structure 41 may contribute to formation of the first curved portion S2 of the screen S. The second curved portion S3 of the screen S may be formed to correspond to the curved portion of the second support structure (reference numeral 42 of FIG. 4).

According to an embodiment, the first back cover 211 may form a first rear surface B1 of the electronic device 2, and the second back cover 221 may form a second rear surface B2 of the electronic device 2. The first rear surface B1 may include, for example, a second flat portion B11 parallel to the first flat portion S1 of the screen S, and/or a third curved portion B12 bent from the second flat portion B11 toward the first curved portion S2 corresponding to the first curved portion S2 of the screen S. The second rear surface B2 may include, for example, a third flat portion B21 parallel to the first flat portion S1 of the screen S, and/or a fourth curved portion B22 curved from the third flat portion B21 toward the second curved portion S3 corresponding to the second curved portion S3 of the screen S. The second flat portion B11 and the third flat portion B21 may be formed with substantially no difference in height. In some embodiments, the second flat portion B11 may be implemented in an expanded form without the third curved portion B12, or the third flat portion B21 may be implemented in an expanded form without the fourth curved portion B22.

According to an embodiment, the first back cover 211 and/or the second back cover 221 may be opaque. The first back cover 211 and/or the second back cover 221 may be formed with, for example, coated or colored glass, ceramic, polymer, metal (e.g., aluminum, stainless steel (STS), or magnesium) or a combination of at least two of the above materials.

According to some embodiments, in a state in which the second area ② of the flexible display 30 is at least partially introduced into an inner space of the housing 20 (e.g., in a closed state of the electronic device 2), at least a portion of the second area ② may be visible from the outside through the second rear surface B2. In this case, at least a partial area of the second back cover 221 may be transparent or translucent. In some embodiments, when there is a member interposed between the second back cover 221 and at least a portion of the second area ② in a closed state of the electronic device 2, at least a partial area of the member may include an opening or may be formed to be transparent or translucent.

According to an embodiment, a sliding structure related to the second housing part 22 may include an elastic structure. For example, when the second housing part 22 is moved to a preset distance by an external force, the second housing part 22 may be switched from a closed state to an open state or from an open state to a closed state without any external force due to the elastic structure included in the sliding structure (e.g., semi-automatic slide motion). In some embodiments, when a signal is generated through an input device included in the electronic device 2, the electronic device 2 may be switched from a closed state to an open state or from an open state to a closed state due to a driving device such as a motor connected to the second housing part 22. For example, when a signal is generated through a hardware button or a software button provided through the screen S, the electronic device 2 may be switched from a closed state to an open state or from an open state to a closed state. In some embodiments, when signals are generated from various sensors such as a pressure sensor, the electronic device 2 may be switched from a closed state to an open state or from an open state to a closed state.

According to an embodiment, the electronic device 2 may include a first camera module 271, a plurality of second camera modules 272, and/or a flash (or light emitting module) 273. The first camera module 271 and/or the plurality of second camera modules 272 may include one or more lenses, an image sensor, and/or an image signal processor. The flash 273 may include, for example, a light emitting diode or a xenon lamp.

The first camera module 271 (e.g., the camera module 180 of FIG. 1) may be aligned with, for example, an opening (e.g., through hole or notch) formed in the screen S to be positioned inside the electronic device 2. External light may pass through the opening and a partial area of a transparent cover overlapped with the opening to be introduced into the first camera module 271. The transparent cover may serve to protect the flexible display 30 from the outside and be implemented into, for example, a flexible member such as a plastic film (e.g., polyimide film) or ultra-thin glass (UTG).

According to some embodiments, the first camera module 271 may be disposed at the bottom of at least a portion of the screen S, and perform related functions (e.g., taking an image) without visual distinguishment (or exposure) of a position thereof. For example, the first camera module 271 may be positioned in the rear surface of the screen S, or below or beneath the screen S. The first camera module 271 may be aligned and positioned in a recess formed in the rear surface of the flexible display 30. When viewed from above the screen S (e.g., when viewed in a −z axis direction), the first camera module 271 may be disposed to overlap at least a portion of the screen S to obtain an image of an external subject without being exposed to the outside. In this case, a partial area of the flexible display 30 overlapped at least partially with the first camera module 271 may include a different pixel structure and/or wiring structure compared to other areas. For example, some areas of the flexible display 30 overlapped at least partially with the first camera module 271 may have different pixel densities compared to other areas. A pixel structure and/or a wiring structure formed in a partial area of the flexible display 30 overlapped at least partially with the first camera module 271 may reduce a light loss between the outside and the first camera module 271. According to some embodiments, pixels may not be disposed in a partial area of the flexible display 30 overlapped at least partially with the first camera module 271.

The plurality of second camera modules 272 (e.g., the camera module 180 of FIG. 1) and/or the flash 273 may be, for example, positioned in the first housing part 21 corresponding to the first rear surface B1 of the electronic device 2. The plurality of second camera modules 272 may have different properties (e.g., angle of view) or functions and include, for example, a dual camera or a triple camera. In some embodiments, the plurality of second camera modules 272 may include lenses having different angles of view, and the electronic device 2 may control to change a camera module performed therein based on a user's selection. As another example, the plurality of second camera modules 272 may include at least one of a wide-angle camera, a telephoto camera, a color camera, a monochrome camera, or an infrared (IR) camera (e.g., time of flight (TOF) camera, structured light camera). The IR camera may operate, for example, as at least a portion of a sensor module (not illustrated) (e.g., the sensor module 176 of FIG. 1).

According to various embodiments (not illustrated), the electronic device 2 may include various sensor modules (e.g., the sensor module 176 of FIG. 1). The sensor module may generate an electrical signal or data value corresponding to an internal operating state or an external environmental state of the electronic device 2. The sensor module may include at least one of, for example, a proximity sensor, a gesture sensor, a gyro sensor, an atmospheric sensor, a magnetic sensor, an acceleration sensor, a grip sensor, a color sensor, an infrared (IR) sensor, a biometric sensor (e.g., fingerprint sensor, heart rate monitor (HRM) sensor, etc.), a temperature sensor, a humidity sensor, or an illuminance sensor. According to an embodiment, the sensor module may include an optical sensor, and may be aligned with an opening (e.g., through hole or notch) formed in the flexible display 30 to be positioned inside the electronic device 2. In this case, external light may pass through the opening and a partial area of the transparent cover overlapped with the opening to be introduced into the optical sensor.

According to some embodiments, the sensor module may be disposed at the bottom of at least a portion of the screen S of the flexible display 30, and perform related functions without visual distinguishment (or exposure) of a position thereof. For example, the sensor module may be positioned in the rear surface of the screen S of the flexible display 30, or below or beneath the screen S of the flexible display 30. The sensor module may be aligned and positioned in a recess formed in the rear surface of the flexible display 30. When viewed from above the screen S (e.g., when viewed in a −z axis direction), the sensor module may be disposed to overlap at least a portion of the screen S, and perform a corresponding function without being exposed to the outside. In this case, a partial area of the flexible display 30 overlapped at least partially with the sensor module may include a pixel structure and/or a wiring structure different from that of the other areas. For example, some areas of the flexible display 30 at least partially overlapped with the sensor module may have different pixel densities compared to other areas. A pixel structure and/or a wiring structure formed in a partial area of the flexible display 30 at least partially overlapped with the sensor module may reduce a loss when various types of signals (e.g., light or ultrasound) related to the sensor module pass between the outside and the sensor module. According to some embodiments, a plurality of pixels may not be disposed in a partial area of the flexible display 30 at least partially overlapped with the sensor module.

According to an embodiment, the electronic device 2 may include one or more key input devices 275 (e.g., the input module 150 of FIG. 1). In some embodiments (not illustrated), the key input device may include at least one sensor module.

According to various embodiments, the electronic device 2 may omit at least one of the components or may additionally include other components. For example, the electronic device 2 may include a microphone positioned inside the housing 20 and a microphone hole formed in the housing 20 corresponding thereto. According to some embodiments, the electronic device 2 may include a plurality of microphones capable of detecting a direction of a sound. For example, the electronic device 2 may include a speaker positioned inside the housing 20, and a speaker hole formed in the housing 20 corresponding thereto. For example, the electronic device 2 may include a receiver for calls positioned inside the housing 20, and a receiver hole formed in the housing 20 corresponding thereto. In some embodiments, the microphone hole and the speaker hole may be implemented as one hole, or the speaker hole may be omitted as in a piezo speaker. For example, the electronic device 2 may include a connector (e.g., USB connector) (e.g., the connection terminal 178 of FIG. 1) positioned inside the housing 20, and a connector hole formed in the housing 20 corresponding thereto. The electronic device 2 may transmit and/or receive power and/or data to and from an external electronic device electrically connected to the connector through the connector hole. According to various embodiments, the electronic device 2 may include the electronic device 101 of FIG. 1 or may include at least one of components of the electronic device 101 of FIG. 1.

FIG. 4 is an exploded perspective view illustrating the electronic device of FIG. 2A according to an embodiment of the disclosure.

Figure 5:
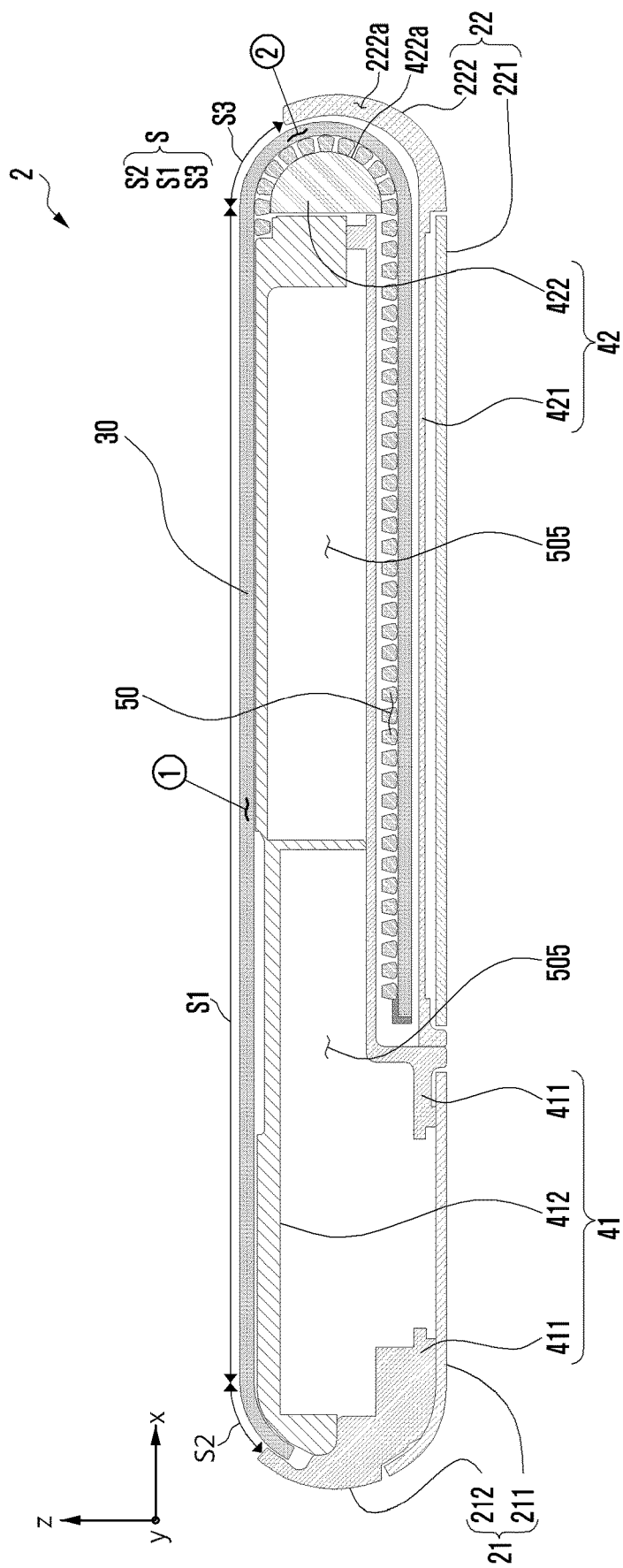
FIG. 5 illustrates a cross-sectional structure of an electronic device taken along line A-A' of FIG. 2A according to an embodiment of the disclosure.

FIG. 5 illustrates a cross-sectional structure of the electronic device taken along line A-A' of FIG. 2A according to an embodiment of the disclosure.

Figure 6:
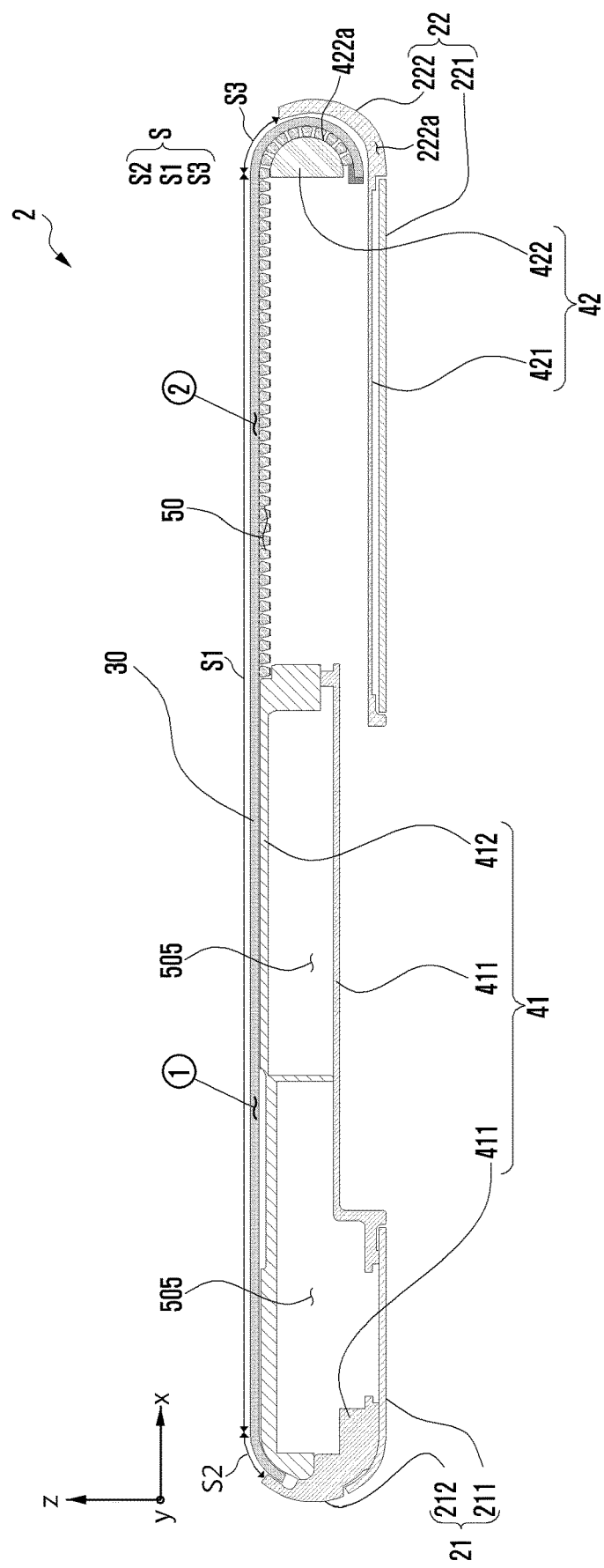
FIG. 6 illustrates a cross-sectional structure of an electronic device taken along line B-B' of FIG. 3A according to an embodiment of the disclosure.

FIG. 6 illustrates a cross-sectional structure of the electronic device taken along line B-B' of FIG. 3A according to an embodiment of the disclosure.

Referring to FIGS. 4, 5, and 6, the electronic device 2 may include the first housing part 21, the second housing part 22, the flexible display 30, a printed circuit board 43, a battery 44, a display support structure 50, a third support structure 61, and/or a fourth support structure 62.

According to an embodiment, the first housing part 21 may include the first back cover 211, the first side cover 212, and/or the first support structure 41. The first support structure 41 may be coupled to the first side cover 212 or may be formed integrally at least partially with the first housing part 21. The first support structure 41 is a frame structure (e.g., first bracket) capable of withstanding a load and may contribute to durability or rigidity of the electronic device 2.

The first support structure 41 may include a plurality of support members, for example, a first support member 411 and a second support member 412. The first support member 411 may be integrally formed with the first side cover 212. The second support member 412 may be coupled to the first support member 411 and/or the first side cover 212 using various methods such as bolt fastening or bonding. The first back cover 211 may be disposed in the first support member 411. The first area ① of the flexible display 30 may be disposed in the second support member 412. For example, the first area ① of the flexible display 30 may be disposed in the second support member 412 using a heat-reactive adhesive material, a photo-reactive adhesive material, a general adhesive, and/or a double-sided tape. The first support structure 41 is not limited to the illustrated example and may be implemented in various other forms.

According to an embodiment, the second housing part 22 may include the second back cover 221, the second side cover 222, and/or the second support structure 42. The second support structure 42 may be coupled to the second side cover 222 or may be integrally formed at least partially with the second side cover 222. The second support structure 42 is a frame structure (e.g., second bracket) capable of withstanding a load and may contribute to durability or rigidity of the electronic device 2. The second support structure 42 may include a plurality of support members, for example, a third support member 421 and a fourth support member 422. The third support member 421 may be integrally formed with the second side cover 222. The second back cover 221 may be disposed in the third support member 421. The fourth support member 422 may be coupled to the second side cover 222 using various methods such as bolt fastening or bonding. The fourth support member 422 may include a curved portion 422a positioned to correspond to the first cover portion 222a of the second side cover 222 and facing the first cover portion 222a. In some embodiments, the fourth support member 422 may be referred to as a 'curved member,' a 'curved support member,' or a 'curved support structure.' One end portion of the fourth support member 422 may be coupled to the second cover portion 222b or a separate support member disposed in the second cover portion 222b. The other end portion of the fourth support member 422 may be coupled to the third cover portion 222c or a separate support member disposed in the third cover portion 222c. In slide-out of the second housing part 22, the fourth support member 422 may move away from the first support structure 41 coupled to the first area ① of the flexible display 30, and at least a portion of the second area ② included in the flexible display 30 may be drawn outside through a curved space between the first cover portion 222a and the fourth support member 422. In slide-in of the second housing part 22, the fourth support member 422 may come close to the first support structure 41 coupled to the first area ①, and at least a portion of the second area ② may be introduced into the housing 20 through a curved space between the first cover portion 222a and the fourth support member 422.

In some embodiments, the electronic device 2 may include a sliding driver connecting the first housing part 21 and the second housing part 22. The sliding driver may contribute to smooth slide-out or slide-in of the second housing part 22 with respect to the first housing part 21. The sliding driver may drivably connect the first housing part 21 and the second housing part 22 such that the second housing part 22 substantially moves in a slide-out direction (e.g., +x-axis direction) or a slide-in direction (e.g., −x-axis direction) with respect to the first housing part 21. The sliding driver may provide a driving force for a sliding operation of the second housing part 22 with respect to the first housing part 21. For example, the sliding driver may include a resilient structure, and the resilient structure may provide a driving force that enables the second housing part 22 to slide out or slide in without an external force by a user. For another example, the sliding driver may include a driving device such as a motor, and provide a driving force that enables the second housing part 22 to slide out or slide in without an external force by a user.

According to an embodiment, the sliding driver may include at least one hinge. The hinge may include, for example, a link assembly. The link assembly may include a link structure (e.g., links and a joint connecting the same) connecting the second support member 412 and the fourth support member 422, and an elastic member (e.g., torsion spring) positioned in the link structure. For example, in slide-out of the second housing part 22, the elastic member may act an elastic force to spread the link structure. The sliding driver may be implemented into various other types of hinges. The sliding driver is not limited to the hinge and may be implemented in various other forms.

The printed circuit board 43 (e.g., a rigid PCB (RPCB), a flexible PCB (FPCB), or a rigid-flexible PCB (RFPCB)), and/or the battery 44 may be disposed at or coupled to the first support structure 41 in an inner space 505 of the first housing part 21. The PCB 43 and the battery 44 may not overlap each other when viewed from above the screen S (e.g., when viewed in a −z axis direction). The PCB 43 may be electrically connected to the flexible display 30 through, for example, a flexible PCB (FPCB) (not illustrated). In the PCB 43, for example, a processor (e.g., the processor 120 of FIG. 1), a memory (e.g., the memory 130 of FIG. 1), and/or an interface (e.g., the interface 177 of FIG. 1)) may be mounted. The electronic device 2 may include various other elements disposed on the PCB 43 or electrically connected to the PCB 43. The battery 44 is a device for supplying power to at least one component of the electronic device 2 and may include, for example, a non-rechargeable primary cell, a rechargeable secondary cell, or a fuel cell. The battery 44 may be integrally disposed inside the electronic device 2 or may be detachably disposed from the electronic device 2. At least one electronic component included in the electronic device 2 may be positioned in the second housing part 22 in the inner space of the electronic device 2.

The display support structure 50 may be disposed at or coupled to the rear surface of the flexible display 30. The rear surface of the flexible display 30 may refer to a surface positioned opposite to a surface in which light is emitted from a display panel including a plurality of pixels. In an embodiment, the display support structure 50 may be disposed at a rear surface of the second area ② included in the flexible display 30. When the second housing part 22 slides out or slides in, the display support structure 50 may move by friction with the curved portion 422a of the fourth support member 422. The display support structure 50 may support the second area ② so that the second area ② of the flexible display 30 maintains a form smoothly connected to the first area ① of the flexible display 30. In a closed state or an open state of the electronic device 2, a portion of the display support structure 50 may support the second area ② between the curved portion 422a of the fourth support member 422 and the second area ②. In an open state of the electronic device 2, for example, a part of the display support structure 50 may support the first flat portion S1 included in the screen S. The display support structure 50 may, for example, contribute such that the second area ② moves while maintaining a form smoothly connected to the first area ① in a switch between the closed state (see FIG. 5) and the open state (see FIG. 6) of the electronic device 2.

The display support structure 50 may include a first surface 501 facing the second area ② of the flexible display 30 and a second surface 502 positioned opposite to the first surface 501. In an embodiment, the display support structure 50 may include a multi-bar structure (or multi-bar assembly). The multi-bar structure may include a form in which, for example, a plurality of support bars extended in a third direction (e.g., y-axis direction) orthogonal to a first direction (e.g., +x-axis direction) of slide-out are arranged in the second surface 502. The multi-bar structure may have flexibility due to portions having a relatively thin thickness between the plurality of support bars. In some embodiments, the multi-bar structure may be implemented without portions connecting the plurality of support bars. In some embodiments, the multi-bar structure may be referred to as other terms such as a 'flexible track.'

According to an embodiment, the electronic device 2 may include a rail part for guiding a movement of the display support structure 50. The third support structure 61 may be disposed at or coupled to the second cover portion 222b of the second side cover 222, and include a first guide rail 611. The fourth support structure 62 may be disposed at or coupled to the third cover portion 222c of the second side cover 222, and include a second guide rail 621. One side of the display support structure 50 may be positioned at or inserted into the first guide rail 611, and the other side of the display support structure 50 may be positioned at or inserted into the second guide rail 621. The first guide rail 611 and the second guide rail 621 may include grooves or recesses corresponding to a movement path of the display support structure 50. The display support structure 50 may be guided and moved by the first guide rail 611 and the second guide rail 621. The first guide rail 611 and the second guide rail 621 may be substantially symmetrical based on a center line C of the electronic device 2 extended in a direction (e.g., x-axis direction) of slide-out or slide-in. The center line C of the electronic device 2 may serve as a reference line for symmetry with respect to the screen S. In some embodiments, the third support structure 61 and the second cover portion 222b of the second side cover 222 may be integrally formed, and the fourth support structure 62 and the third cover portion 222c of the second side cover 222 may be integrally formed.

A sliding structure for slide-out or slide-in of the second housing part 22 may be provided between the first housing part 21 and the second housing part 22. In an embodiment, the first support structure 41 may include a first slide (not illustrated) positioned at or inserted into the first guide rail 611 of the third support structure 61. The first support structure 41 may include a second slide (not illustrated) positioned at or inserted into the second guide rail 621 of the fourth support structure 62. When the electronic device 2 is switched between the closed state of FIG. 5 and the open state of FIG. 6, there may be sliding between the first slide and the first guide rail 611 and between the second slide and the second guide rail 621.

According to some embodiments, the electronic device 2 may further include a support sheet 70 disposed at or coupled to the rear surface of the flexible display 30. In this case, the display support structure 50 may be disposed in the support sheet 70. The support sheet 70 may contribute to durability of the flexible display 30. The support sheet 70 may reduce an influence of a load or stress that may occur in a switch between the closed state of FIG. 5 and the open state of FIG. 6 on the flexible display 30. The support sheet 70 may prevent the flexible display 30 from being damaged by a force transmitted therefrom when the second housing part 22 is moved.

A cross-sectional structure 401 taken along line D-D' of FIG. 4 may include, for example, the flexible display 30, a transparent cover 35, an optically transparent adhesive member 36, and/or the support sheet 70. The flexible display 30 may be coupled to the transparent cover 35 using the optically transparent adhesive member 36 (e.g., optical clear adhesive (OCA), optical clear resin (OCR), or super view resin (SVR)). The transparent cover 35 (e.g., window) may cover the flexible display 30 to protect the flexible display 30 from the outside. The transparent cover 35 may be implemented in the form of a thin film (e.g., thin film layer) having flexibility. The transparent cover 35 may include, for example, a plastic film (e.g., polyimide film) or thin glass (e.g., ultrathin glass). In some embodiments, the transparent cover 35 may include a plurality of layers. For example, the transparent cover 35 may have a form in which various coating layers are disposed on a plastic film or thin glass. For example, the transparent cover 35 may have a form in which at least one protective layer or coating layer including a polymer material (e.g., polyester (PET), polyimide (PI), or thermoplastic polyurethane (TPU)) is disposed in a plastic film or thin glass.

The flexible display 30 may include, for example, a display panel 31, a base film 32, a lower panel 33, or an optical layer 34. The display panel 31 may be interposed between the optical layer 34 and the base film 32. The base film 32 may be interposed between the display panel 31 and the lower panel 33. The optical layer 34 may be interposed between the optically transparent adhesive member 36 and the display panel 31. An adhesive member (not illustrated) of various polymers may be disposed between the display panel 31 and the base film 32, between the base film 32 and the lower panel 33, and/or between the display panel 31 and the optical layer 34. The display panel 31 may include, for example, a light emitting layer 31a, a thin film transistor (TFT) film 31b and/or an encapsulation (e.g., thin-film encapsulation (TFE)) 31c. The light emitting layer 31a may include, for example, a plurality of pixels implemented into light emitting devices such as organic light-emitting diodes (OLEDs) or micro LEDs. The light emitting layer 31a may be disposed in the TFT film 31b through organic material evaporation. The TFT film 31b may be interposed between the light emitting layer 31a and the base film 32. The TFT film 31b may refer to a film structure in which at least one TFT is disposed on a flexible substrate (e.g., PI film) through a series of processes such as deposition, patterning, and etching. The at least one TFT may control a current to a light emitting element of the light emitting layer 31a to turn on or off the pixel or adjust brightness of the pixel. The at least one TFT may be implemented into, for example, an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The display panel 31 may include a storage capacitor, and the storage capacitor may maintain a voltage signal to the pixel, maintain a voltage applied to the pixel within one frame, or reduce a change in a gate voltage of the TFT due to leakage during a light emission time. By a routine (e.g., initialization, data write) controlling at least one TFT, the storage capacitor may maintain a voltage applied to the pixel at a predetermined time interval. In an embodiment, the display panel 31 may be implemented based on an OLED, and the encapsulation 31c may cover the light emitting layer 31a.

Electrodes and organic materials that emit light in OLEDs may react very sensitive to oxygen and/or moisture to lose luminescent properties thereof. The encapsulation 31c may seal the light emitting layer 31a so that oxygen and/or moisture do not penetrate to the OLED. The base film 32 may include a flexible film made of a polymer or plastic such as PI or PET. The base film 32 may serve to support and protect the display panel 31. In some embodiments, the base film 32 may be referred to as a 'protective film,' a 'back film,' or a 'back plate.'

The lower panel 33 may include a plurality of layers for various functions. An adhesive member (not illustrated) of various polymers may be disposed between the plurality of layers included in the lower panel 33. The lower panel 33 may include, for example, a light blocking layer 33a, a buffer layer 33b, or a lower layer 33c. The light blocking layer 33a may be interposed between the base film 32 and the buffer layer 33b. The buffer layer 33b may be interposed between the light blocking layer 33a and the lower layer 33c. The light blocking layer 33a may block at least a portion of light incident from the outside. For example, the light blocking layer 33a may include an emboss layer. The emboss layer may be a black layer including an uneven pattern. The buffer layer 33b may mitigate an external shock applied to the flexible display 30. For example, the buffer layer 33b may include a sponge layer or a cushion layer. The lower layer 33c may diffuse, disperse, or dissipate a heat generated in the electronic device 2 or the flexible display 30. The lower layer 33c may absorb or shield electromagnetic waves. The lower layer 33c may mitigate an external impact applied to the electronic device 2 or the flexible display 30. For example, the lower layer 33c may include a composite sheet 33d or a copper sheet 33e. In an embodiment, the composite sheet 33d may be a sheet processed by combining layers or sheets having different properties. For example, the composite sheet 33d may include at least one of polyimide and graphite. The composite sheet 33d may be replaced with a single sheet including one material (e.g., polyimide or graphite). The composite sheet 33d may be interposed between the buffer layer 33b and the copper sheet 33e. The copper sheet 33e may be replaced with various other metal sheets. In some embodiments, at least a portion of the lower layer 33c is a conductive member (e.g., metal plate), which may help to reinforce rigidity of the electronic device 2, shield ambient noise, and be used for dissipating a heat emitted from peripheral heat dissipating components (e.g., display driving circuit (e.g., DDI)). The conductive member may include, for example, at least one of copper (Cu), aluminum (Al), stainless steel (SUS), or CLAD (e.g., a stacked member in which SUS and Al are alternately disposed). The lower layer 33c may include various layers for various other functions. According to various embodiments (not illustrated), at least one additional polymer layer (e.g., layer including PI, PET, or TPU) other than the base film 32 may be further disposed in the rear surface of the display panel 31. In various embodiments, at least one of the plurality of layers (e.g., the light blocking layer 33a, the buffer layer 33b, the composite sheet 33d, and the copper sheet 33e) included in the lower panel 33 may be omitted. In various embodiments, the disposition order of the plurality of layers included in the lower panel 33 is not limited to the embodiment of FIG. 4 and may be variously changed. The optical layer 34 may include, for example, a polarizing layer (or polarizer), or a retardation layer (or retarder). The polarization layer and the retardation layer may improve outdoor visibility of the screen. The optical layer 34 may, for example, selectively transmit light generated from a light source of the display panel 31 and vibrating in a predetermined direction. In some embodiments, a single layer in which the polarization layer and the retardation layer are combined may be provided, and such a layer may be defined as a 'circular polarization layer.' The optically transparent adhesive member 36 may be interposed between the transparent cover 35 and the optical layer 34. In some embodiments, the polarization layer (or circular polarization layer) may be omitted, and in this case, a black pixel define layer (PDL) and/or a color filter may be provided to replace the polarization layer. The electronic device 2 may include a touch sensing circuit (e.g., a touch sensor) (not illustrated). The touch sensing circuit may be implemented into a transparent conductive layer (or film) based on various conductive materials such as indium tin oxide (ITO). In an embodiment, the touch sensing circuit may be disposed between the transparent cover 35 and the optical layer 34 (e.g., add-on type). In another embodiment, the touch sensing circuit may be disposed between the optical layer 34 and the display panel 31 (e.g., on-cell type). In another embodiment, the display panel 31 may include a touch sensing circuit or a touch sensing function (e.g., in-cell type). In some embodiments, the display panel 31 may be formed based on an OLED and include an encapsulation 31c disposed between the light emitting layer 31a and the optical layer 34. The encapsulation 31c may serve as a pixel protection layer for protecting the plurality of pixels of the light emitting layer 31a. In an embodiment (not illustrated), the flexible display 30 may include a conductive pattern such as a metal mesh (e.g., aluminum metal mesh) as a touch sensing circuit disposed in the encapsulation 31c between the encapsulation 31c and the optical layer 34. For example, the metal mesh may have greater durability than that of a transparent conductive layer implemented with ITO corresponding to bending of the flexible display 30. In some embodiments, the flexible display 30 may further include a pressure sensor (not illustrated) capable of measuring the intensity (pressure) of the touch. A plurality of layers included in the display panel 31 or the lower panel 33, a stacking structure or a stacking order thereof may vary. The flexible display 30 may be implemented by omitting some of the components or adding other components according to a provision form thereof or a convergence trend.

According to an embodiment, the support sheet 70 may cover at least a portion of the lower panel 33 of the flexible display 30 and be attached to the rear surface of the lower panel 33. The support sheet 70 may be made of various metallic materials and/or non-metallic materials (e.g., polymers). The support sheet 70 may include, for example, stainless steel. As another example, the support sheet 70 may include engineering plastic. In some embodiments, the support sheet 70 may be implemented integrally with the flexible display 30.

According to an embodiment, the support sheet 70 may include a lattice structure overlapped at least partially with a portion (e.g., the second area ②, the first curved portion S2 of the screen S) in which the flexible display 30 is bent. The lattice structure may include, for example, a plurality of openings (or slits) 701. For example, the plurality of openings 701 may be periodically formed, have substantially the same shape, and be repeatedly arranged at regular intervals. The lattice structure may contribute to flexibility of the second area ②, and the second area ② may be more flexible than the first area ① due to the lattice structure. In some embodiments, the support sheet may include a recess pattern (not illustrated) including a plurality of recesses by replacing the lattice structure. In various embodiments, the lattice structure or the recess pattern contributing to flexibility of the flexible display 30 may be extended to at least a portion of the first flat portion S1 of the screen S. In some embodiments, the support sheet 70 including a lattice structure or a recess pattern, or a corresponding conductive member may be formed with a plurality of layers. The support sheet 70 may make elements (e.g., multi-bar structure) positioned inside the electronic device 2 substantially invisible through the flexible display 30. The lattice structure of the support sheet 70 corresponding to the second area ② of the flexible display 30 includes a plurality of openings 701, but the multi-bar structure (e.g., the display support structure 50) may transmit light of a substantially invisible level through the flexible display 30. The lattice structure of the support sheet 70 corresponding to the second area ② of the flexible display 30 includes a plurality of openings 70, but a plurality of support bars of a multi-bar structure may prevent a phenomenon viewing to be protruded through the flexible display 30.

In an expanded state (e.g., the open state of FIG. 6) of the screen S, a non-smooth screen may be formed because of lifting due to elasticity of the flexible display 30 and/or the support sheet 70. In an embodiment, in order to prevent such a lifting phenomenon, a tension device (or tension structure) (not illustrated) for the flexible display 30 and/or the support sheet 70 may be formed. The tension device may contribute to a smooth slide operation while maintaining a tension applied to the flexible display 30 and/or the support sheet 70. The tensioning device may apply a tension to the flexible display 30 and the support sheet 70 using, for example, a belt (e.g., wire type or chain type belt). As another example, the tension device may apply a tension to the flexible display 30 and the support sheet 70 using an elastic member such as a spring. When the tension by the tensioning device is in a threshold range, the second area ② of the flexible display 30 may be maintained in a form smoothly connected to the first area ① of the flexible display 30 without lifting in the closed state of FIG. 5 or the open state of FIG. 6. When the tension by the tensioning device is in a threshold range, the second area ② may be moved while maintaining a form smoothly connected to the first area ① without lifting in a switch between the closed state of FIG. 5 and the open state of FIG. 6. When the tension by the tensioning device is in a threshold range, the slide operation may be smoothly implemented in a switch between the closed state of FIG. 5 and the open state of FIG. 6. For example, when the tension by the tensioning device is lower than the threshold range, the second area ② may be lifted or may not be disposed smoothly in the first area ① due to elasticity of the flexible display 30 and/or elasticity of the support sheet 70. For another example, when the tension by the tensioning device is greater than the threshold range, the second area ② may be smoothly connected to the first area ① without lifting, but it may be difficult that the slide operation is smoothly or softly performed in a switch between the closed state of FIG. 5 and the open state of FIG. 6.

According to an embodiment, in order to reduce a frictional force between the curved portion 422a of the fourth support member 422 and the display support structure 50, a lubricant (e.g., grease) may be interposed between the curved portion 422a and the display support structure 50. In some embodiments, in order to reduce a frictional force between the curved portion 422a of the fourth support member 422 and the display support structure 50, the surface of the curved portion 422a or the surface of the display support structure 50 may be coated with a lubricant.

According to some embodiments, the fourth support member (e.g., curved member, curved support member, or curved support structure) 422 may be replaced with a rotation member such as a roller or a pulley. For example, one end portion of a rotation shaft of the rotation member may be rotatably coupled to the third support structure 61, and the other end portion of a rotation shaft of the rotation member may be rotatably coupled to the fourth support structure 62. In some embodiments, the rotation member may be defined or interpreted as a curved member, a curved support member, or a curved support structure implemented rotatably based on friction with the display support structure 50.

Although not illustrated, the electronic device including an expandable screen is not limited to the electronic device 2 according to the embodiment of FIG. 4 and may be provided in various other forms. In some embodiments, the electronic device may be implemented such that the flexible display may be positioned in a rolled-up state in an inner space of the electronic device (or housing) in a reduced screen state. In this case, the flexible display may be referred to as a 'rollable display.' The electronic device including a rollable display may include the display support structure 50 of FIG. 4 and a rail part (e.g., the first guide rail 611, the second guide rail 612 of FIG. 4) for guiding a movement of the display support structure 50.

Figure 7:
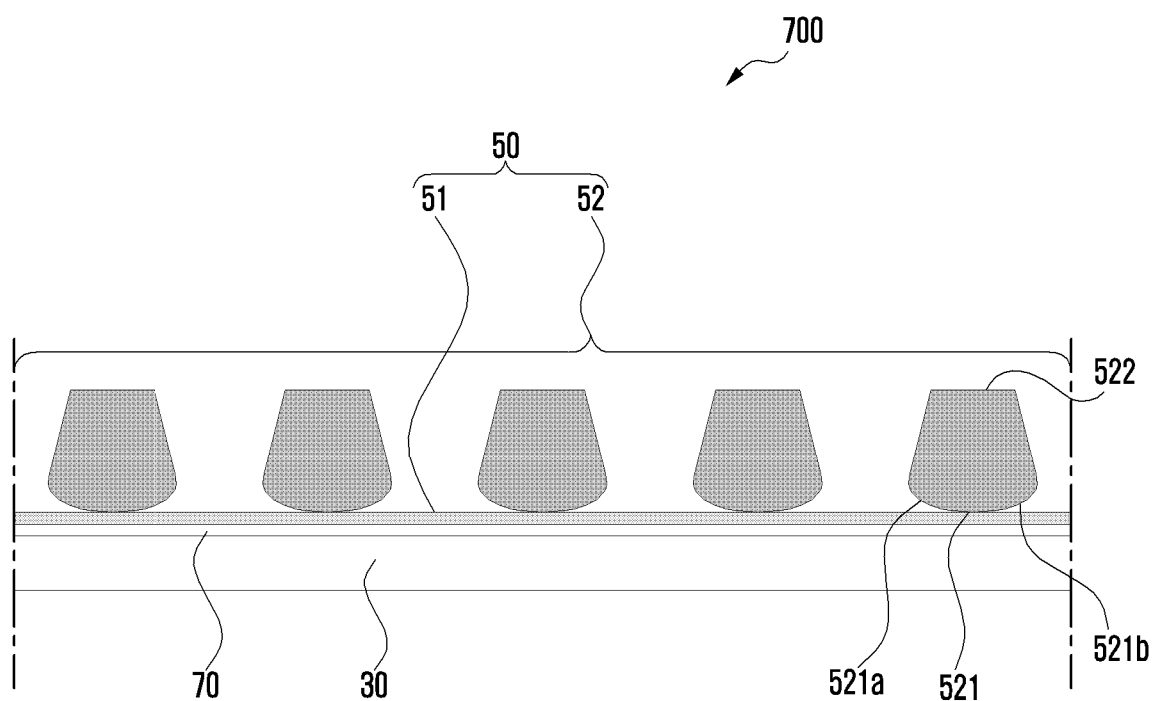
FIG. 7 illustrates a cross-sectional structure of a display assembly according to an embodiment of the disclosure.

FIG. 7 illustrates a cross-sectional structure of a display assembly according to an embodiment of the disclosure.

Referring to FIG. 7, a display assembly 700 may include, for example, the flexible display 30, the display support structure 50, or the support sheet 70.

According to an embodiment, the display support structure (e.g., multi-bar structure) 50 may include a first layer 51 and a second layer 52 including a plurality of support bars (or multi-bar structure). The first layer 51 may be interposed between the support sheet 70 and the second layer 52. The first layer 51 may have a film shape or a sheet shape having flexibility. The plurality of support bars may have substantially the same cross-sectional shape and be arranged at a predetermined distance from each other. In some embodiments, some of the plurality of support bars may be arranged with a first separation distance, and other portions of the plurality of support bars may be arranged with a second separation distance different from the first separation distance. Due to a form in which the plurality of support bars are separated and disposed on the first layer 51, and flexibility of the first layer 51, the display support structure 50 may have flexibility. The first layer 51 may include first areas in which a plurality of support bars are disposed, and second areas between the first areas. The display support structure 50 may be bent due to the second areas.

The plurality of support bars included in the second layer 52 may include a first surface 521 facing the first layer 51 and a second surface 522 positioned opposite to the first surface 521. In an embodiment, the plurality of support bars may have a cross-sectional shape (e.g., trapezoidal shape) narrowing in a direction from the first surface 521 to the second surface 522. Such a cross-sectional shape may contribute so that the display support structure 50 is bent with a smaller radius of curvature. The cross-sectional shape of the plurality of support bars is not limited to the illustrated embodiment and may vary. In some embodiments, the second surface 522 may be formed in a curved shape corresponding to the curved portion 422a included in the fourth support member 422 of FIG. 4. In some embodiments, the second surface 522 may be formed as a curved surface having a convex shape in a direction from the first surface 521 to the second surface 522.

According to an embodiment, both edge areas 521a and 521b of the first surface 521 included in the plurality of support bars may be formed in a curved shape or inclined shape separated from the first layer 51. Both edge areas 521a and 521b having a curved shape or inclined surface shape may contribute so that the first layer 51 smoothly bends. The both edge areas 521a and 521b of the curved shape or inclined surface shape may contribute to flexibility so that the display support structure 50 may be bent with a smaller radius of curvature.

When there is a switch between the closed state of FIG. 5 and the open state of FIG. 6, a stress acting on the first layer 51 of the display support structure 50 may include a tensile stress or a bending stress. A tensile stress acting on the first layer 51 may be, for example, proportional to a tensile force acting on the first layer 51 and be inversely proportional to a cross-sectional area of the first layer 51. A bending stress acting on the first layer 51 may be proportional to, for example, the modulus of elasticity (degree of resistance to tension or compression) of the first layer 51 and/or a thickness of the first layer 51 and be inversely proportion to a radius of curvature of the curved portion 422a included in the fourth support member 422 of FIG. 4. In order to prevent breakage of the first layer 51 in a switch between the closed state of FIG. 5 and the open state of FIG. 6, a shape or material of the first layer 51 may be selected in consideration of such a tensile stress or bending stress. For example, the first layer 51 may include a non-metal material (e.g., polymer) or a metal material. The first layer 51 may be formed in a thickness to secure a bending property of the display support structure 50.

According to an embodiment, the first layer 51 and the second layer 52 may include the same material. For example, the first layer 51 and the second layer 52 may be integrally formed. As another example, the display support structure 50 may be formed by providing each of the first layer 51 and the second layer 52 and then bonding them together.

According to some embodiments, the first layer 51 and the second layer 52 may include different materials. The second material included in the second layer 52 may have greater strength or greater rigidity (or rigidity property) than that of the first material included in the first layer 51.

According to an embodiment, the first layer 51 and the second layer 52 may include a metal material. For example, the first layer 51 and the second layer 52 may include the same metal material. As another example, the first layer 51 may include a first metal material, and the second layer 52 may include a second metal material different from the first metal material. The first metal material of the first layer 51 may include a material having bonding affinity with the support sheet 70 and the second metal material of the second layer 52.

According to some embodiments, the first layer 51 may include a first polymer and the second layer 52 may include a second polymer different from the first polymer. The first polymer included in the first layer 51 may have greater softness (or softness property) than that of the second polymer included in the second layer 52. The first polymer may be various, such as, for example, PET, PI, or TPU. The first polymer may contribute to a bonding force between the support sheet 70 and the second layer 52 and durability of the display support structure 50. The first polymer may include a material having bonding affinity with the second polymer of the second layer 52 and the support sheet 70. The first layer 51 may be formed in a thickness to secure a bending property of the display support structure 50 according to a soft property of the first polymer. The second polymer included in the second layer 52 may have greater strength or rigidity (or stiffness property) than that of the first polymer included in the first layer 51. The second polymer may include, for example, engineering plastic (e.g., polycarbonate (PC) or polymethyl methacrylate (PMMA)). As another example, the second polymer may include a material (e.g., fiber reinforced plastic (FRP)) in which engineering plastic is mixed with various reinforcing substrates such as glass fiber or carbon fiber. Due to a rigid nature of the second polymer, the second layer 52 may support the second area ② in order to remain a form in which the second area ② of the flexible display 30 (see FIG. 4, 5, or 6) is smoothly disposed with the first area ① of the flexible display 30 (see FIG. 4, 5, or 6). When the second layer 52 including a second polymer is disposed in the support sheet 70 without the first layer 51, it may be difficult to secure a bonding force between the second layer 52 and the support sheet 70 due to the hard nature of the second polymer.

According to some embodiments, the first layer 51 may include a polymer and the second layer 52 may include a metal material. In this case, in order to increase a mechanical bonding force between the first layer 51 and the second layer 52, a bonding structure in which a part of the first layer 51 is positioned in a hole or groove formed in the second layer 52 may also be provided (e.g., anchor effect).

According to some embodiments, the first layer 51 may be omitted, and in this case, the support sheet 70 may replace the first layer 51.

According to some embodiments, the display support structure 50 or the first layer 51 may serve as the support sheet 70 and in this case, the support sheet 70 may be omitted.

According to some embodiments, when a motion is transmitted between the display support structure 50 and the fourth support member 422 of FIG. 4, the second layer 52 of the display support structure 50 may have enough elasticity to secure a frictional force with the fourth support member 422 so as to reduce a loss thereof. The second layer 52 may be extended between the fourth support member 422 and the second area ② of the flexible display 30 to have an elastic modulus that may elastically contact the curved portion 422a included in the fourth support member 422 of FIG. 4.

Figure 8:
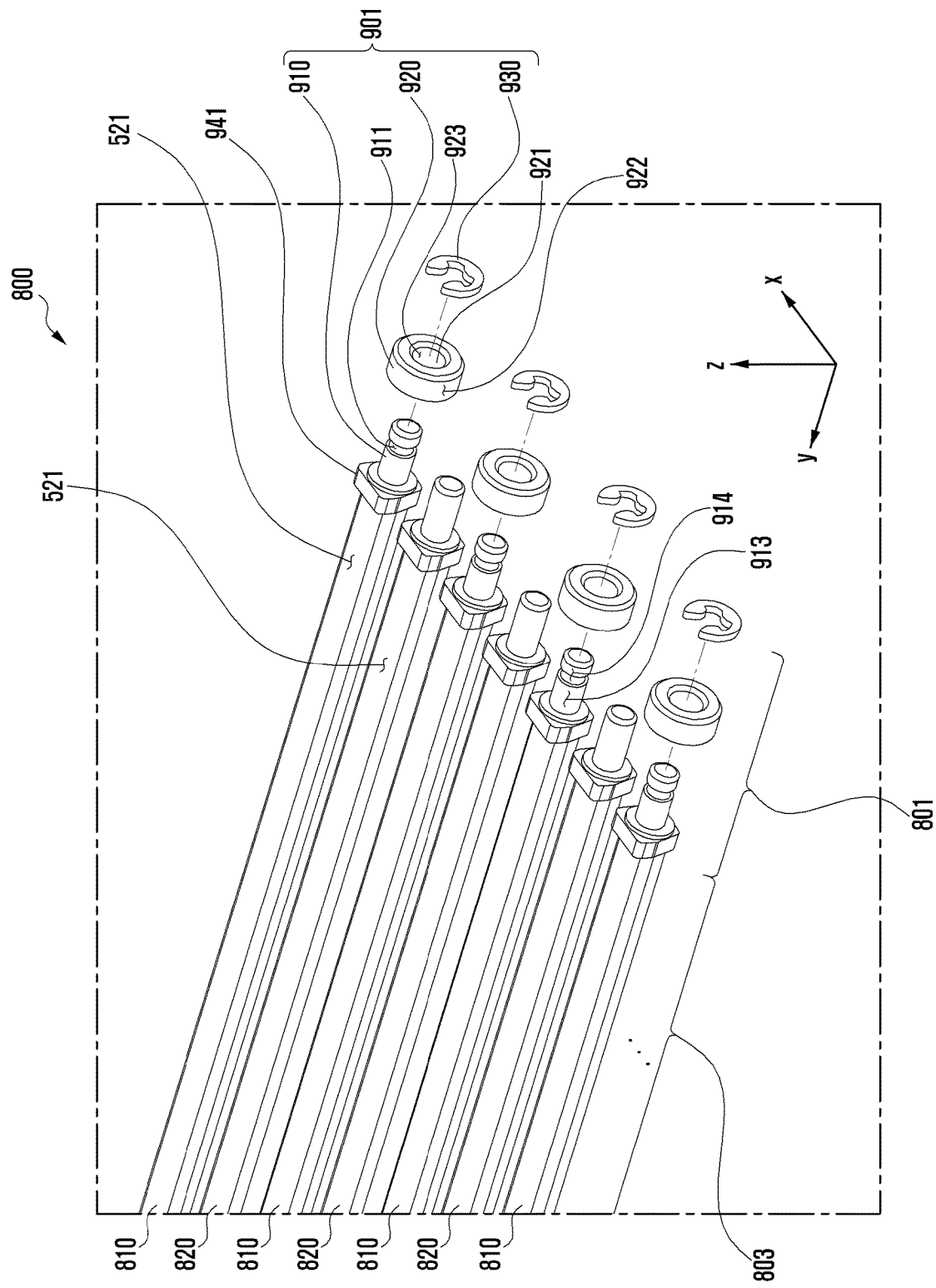
FIG. 8 is an exploded view illustrating a plurality of support bars included in a display support structure according to an embodiment of the disclosure.

FIG. 8 is an exploded view illustrating a plurality of support bars included in a display support structure according to an embodiment of the disclosure.

Figure 9:
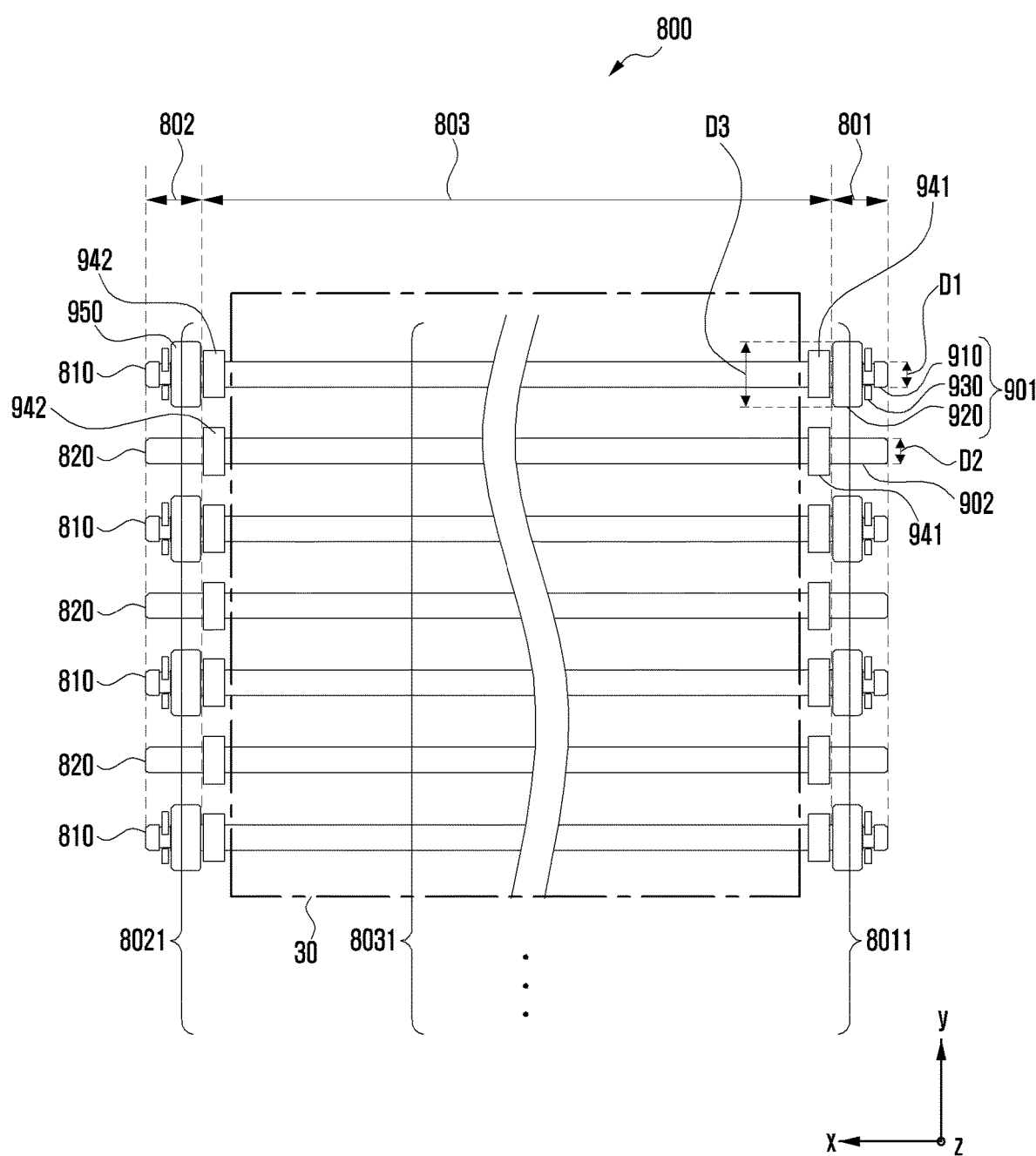
FIG. 9 illustrates a plurality of support bars of FIG. 8 according to an embodiment of the disclosure.

FIG. 9 illustrates a plurality of support bars of FIG. 8 according to an embodiment of the disclosure.

Referring to FIGS. 8 and 9, each of the plurality of support bars (or multi support bars) 800 may include a first portion 801, a second portion 802, and a third portion 803 between the first portion 801 and the second portion 802. The third portion 803 may be extended straight in a direction (e.g., +y-axis direction) from the first portion 801 to the second portion 802. In some embodiments, the first portion 801 is one end portion of the support bar and may be referred to as a 'first end portion,' and the second portion 802 is the other end portion of the support bar and may be referred to as a 'second end portion.' The second area ② (see FIG. 4) of the flexible display 30 may be positioned to correspond to third portions 8031 of a plurality of support bars 800 between first portions 8011 and second portions 8021 of the plurality of support bars 800. In some embodiments, the third portion 803 is a part that supports the second area ② of the flexible display 30 among the support bars and may be referred to as a 'support' or a 'display support.' In an embodiment, in the plurality of support bars 800, a first type support bar 810 and a second type support bar 820 may be repeatedly arranged.

For example, the first portion 801 included in a first type support bar 810 may include a rotation device 901. The rotation device 901 may include a protrusion-shaped first shaft 910 extended in a direction (e.g., −y-axis direction) from the second portion 802 to the first portion 801, a rotation part (or rotation member) 920 rotatably coupled to the first shaft 910, and/or a separation prevention part (or separation prevention member) 930 fastened to the first shaft 910. The first shaft 910 may have, for example, a round bar shape having a first diameter D1. The first shaft 910 and the third portion 803 of the first type support bar 810 may be integrally formed and include the same material (e.g., metal material). The rotation part 920 may be, for example, a rotation member or a rolling member such as a circular ring-shaped roller including a hole 921, and include a circular outer circumferential surface (or cylindrical surface) 922 and a circular inner circumferential surface 923. The rotation part 920 may be rotatably positioned in the first shaft 910 penetrating the hole 921. In an embodiment, the first shaft 910 may include a first extension portion 913 in which the rotation part 920 is rotatably positioned, and a second extension portion 914 extended from the first extension portion 913 and protruded from the rotation part 920. In some embodiments, the first shaft 910 may be referred to as another term such as a 'first pin.' In order to reduce a loss of motion transmission or a loss of force transmission by reducing a frictional force between the first shaft 910 and the rotation part 920, a lubricant (e.g., grease) may be interposed between the first shaft 910 and the rotation part 920 or the surface of the first shaft 910 and/or the inner circumferential surface 923 of the rotation part 920 may be coated with a lubricant. The separation prevention part 930 may prevent the rotation part 920 from being separated from the first shaft 910. The separation prevention part 930 may be, for example, an E-ring (e.g., E-type separation prevention ring). The first shaft 910 (e.g., the second extension portion 914) may include a recess 911 formed in the cylindrical surface, and the E-ring may be fastened to the first shaft 910 in the recess 911. The rotation part 920 may be interposed between the third portion 803 and the E-ring, and the E-ring may prevent the rotation part 920 from being separated. The second portion 802 included in the first type support bar 810 may be formed in substantially the same manner as the first portion 801. The second portion 802 may include a rotation device including a rotation part 950 substantially symmetrical to the rotation device 901 of the first portion 801 based on the third portion 803.

According to an embodiment, the third portion 803 included in the second type support bar 820 may be substantially the same as the third portion 803 included in the first type support bar 810.

According to an embodiment, the first portion 801 included in the second type support bar 820 may include a protrusion-shaped second shaft 902 extended in a direction (e.g., −y-axis direction) from the second portion 802 to the first portion 801. The second shaft 902 may have, for example, a round bar shape having a second diameter D2. The second shaft 902 and the third portion 803 of the second type support bar 820 may be integrally formed and include the same material (e.g., metal material). The second shaft 902 and the first shaft 910 included in the first type support bar 810 may be extended in the same length in a y-axis direction. In some embodiments, the first shaft 910 and the second shaft 902 may be extended at different lengths in the y-axis direction. The second portion 802 included in the second type support bar 820 may include a shaft symmetrical to the second shaft 902 based on the third portion 803. In some embodiments, the second shaft 902 may be referred to as another term such as a 'second pin.' In an embodiment, the rotation part 920 of the first portion 801 included in the first type support bar 810 and the second shaft 902 of the first portion 801 included in the second type support bar 820 adjacent thereto may be positioned separately so as not to interfere with each other. The rotation part 950 of the second portion 802 included in the first type support bar 810 and the shaft of the second portion 802 included in the second type support bar 820 adjacent thereto may be positioned separately so as not to interfere with each other.

According to an embodiment, the first diameter D1 of the first shaft 910 included in the first type support bar 810 and the second diameter D2 of the second shaft 902 included in the second type support bar 820 may be the same. In some embodiments, the second diameter D2 may be smaller or larger than the first diameter D1. The second diameter D2 may be smaller than a third diameter D3 of the outer circumferential surface 922 of the rotation part 920 included in the first type support bar 810.

According to an embodiment, the third portion 803 included in the first type support bar 810 and/or the second type support bar 820 may include a first wall 941 that faces the rotation part 920 and formed at an end portion thereof. The second portion 802 included in the first type support bar 810 and/or the second type support bar 820 may include a second wall 942 symmetrical to the first wall 941 based on the third portion 803. The first surface 521 (see FIGS. 7 and 8) of each of the plurality of support bars 800 may be interposed between the first wall 941 and the second wall 942. An area between the first wall 941 and the second wall 942 among the third portion 803 may have, for example, a cross-sectional shape of the support bar illustrated in FIG. 7. The flexible display 30 may be positioned to face the first surface 521 (see FIGS. 7 and 8) between the first wall 941 and the second wall 942 of each of the plurality of support bars 800. In some embodiments, the first wall 940 or the second wall 942 may be omitted.

The rotation device 901 is not limited to the embodiment of FIGS. 8 and 9 and may be implemented in various other forms. This will be described with reference to FIGS. 10, 11 and 12.

Figure 10:
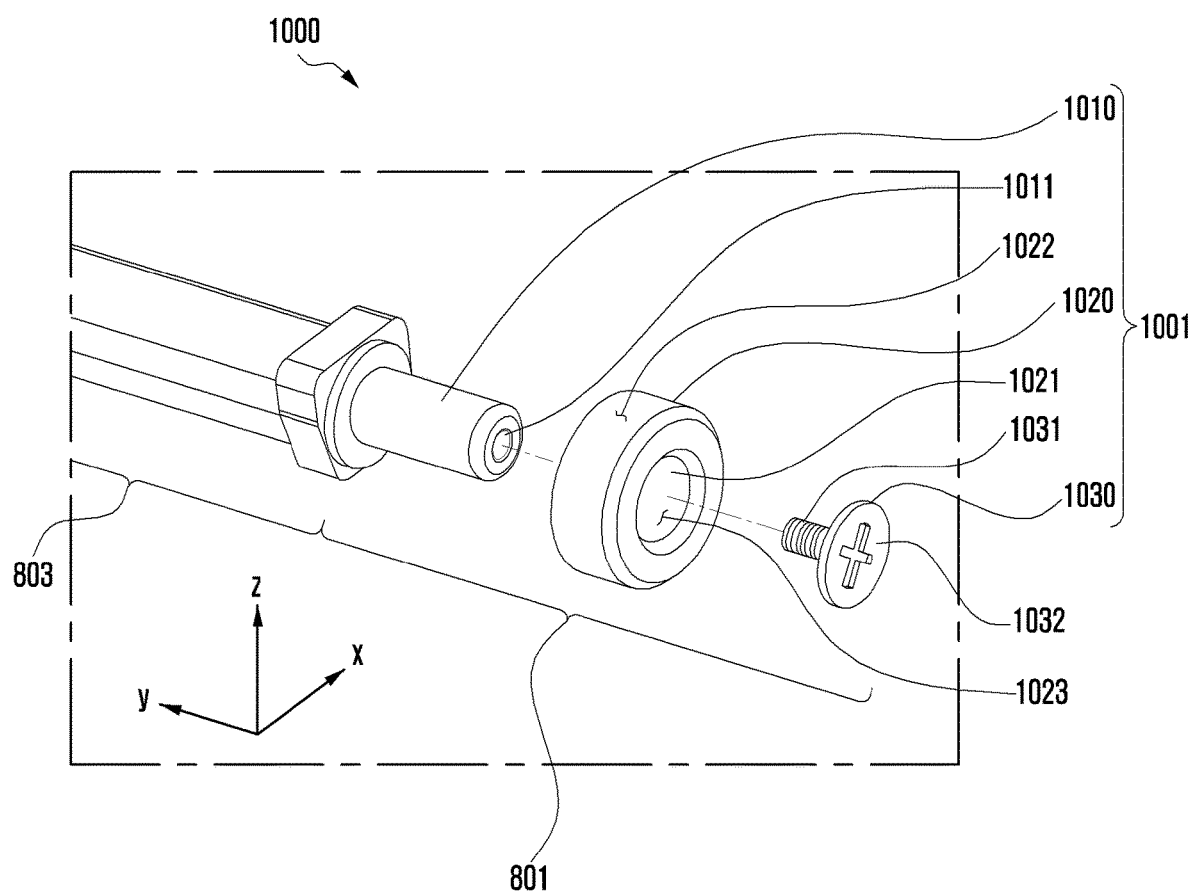
FIGS. 10, 11, and 12 illustrate a portion of a support bar according to various embodiments of the disclosure.
Figure 11:
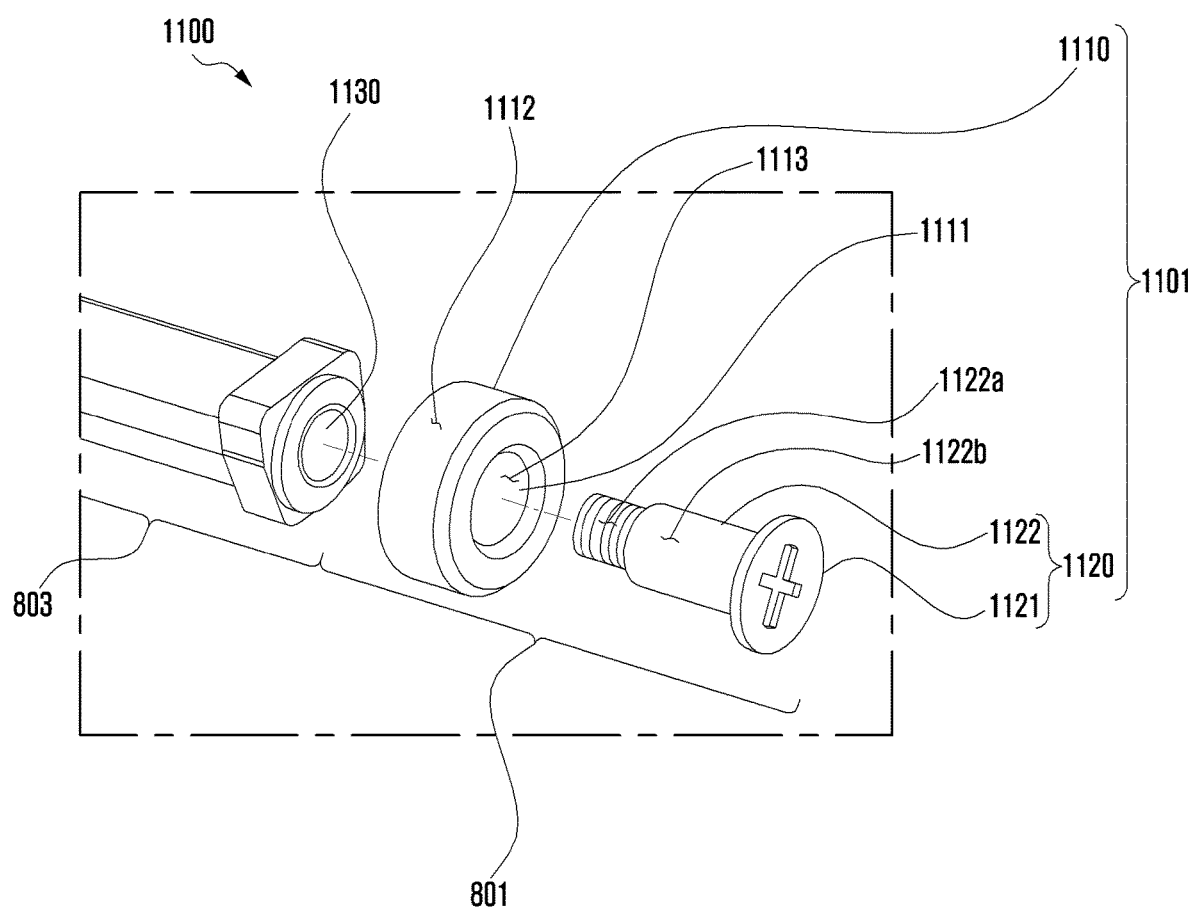
Figure 12:
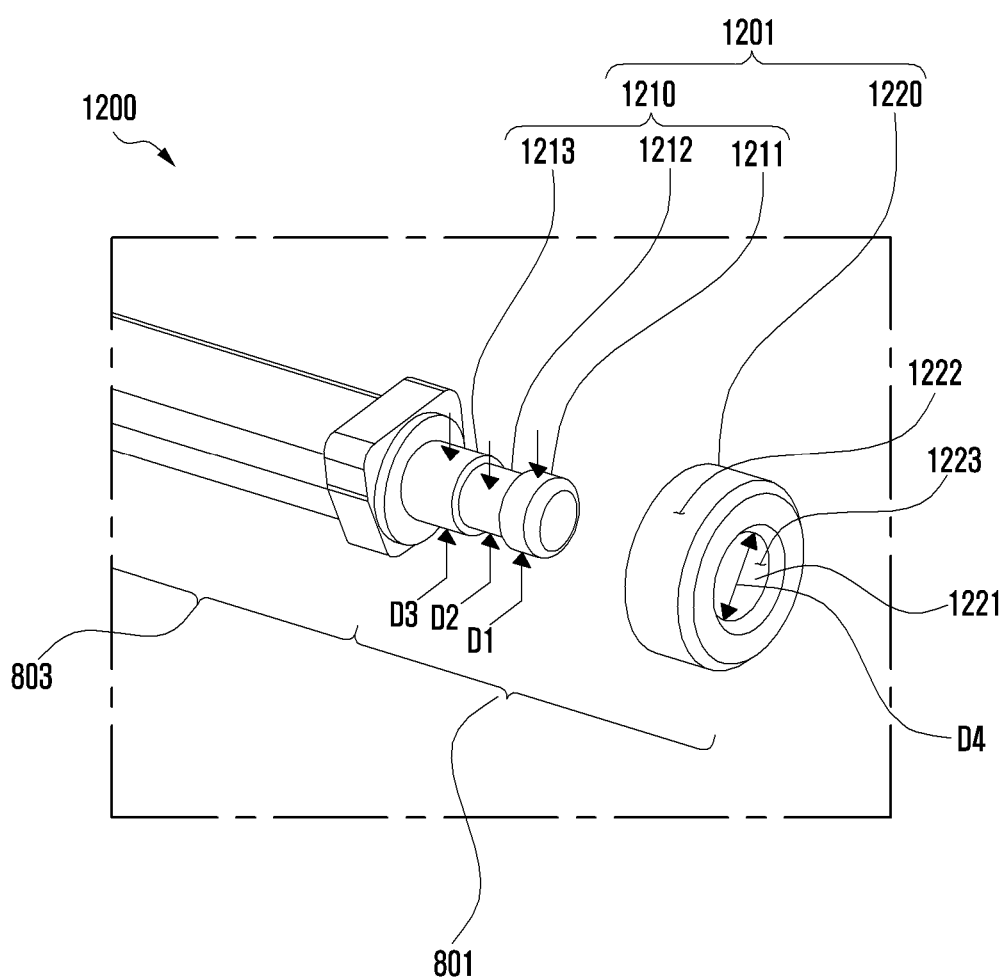

FIGS. 10, 11, and 12 illustrate a portion of a support bar according to various embodiments of the disclosure.

Referring to FIG. 10, a rotation device 1001 included in the first portion 801 of a support bar 1000 may include, for example, a first shaft 1010, a rotation part 1020, and/or a separation prevention part 1030. The first shaft 1010 may be extended from the third portion 803 and have a round bar shape having a diameter. The rotation part 1020 may be a circular ring-shaped roller including a hole 1021 and include a circular outer circumferential surface 1022 and a circular inner circumferential surface 1023. The rotation part 1020 may be rotatably positioned in the first shaft 1010 penetrating the hole 1021. In order to reduce a loss of motion transmission or a loss of force transmission by reducing a frictional force between the first shaft 1010 and the rotation part 1020, a lubricant (e.g., grease) may be interposed between the first shaft 1010 and the rotation part 1020 or a surface of the first shaft 1010 and/or the inner circumferential surface 1023 of the rotation part 1020 may be coated with a lubricant. The separation prevention part 1030 may prevent the rotation part 1020 from being separated from the first shaft 1010 and include, for example, a bolt. A thread formed in a shaft 1031 of the bolt may be fastened to a bolt fastening hole 1011 formed in the first shaft 1010. The rotation part 1020 may be interposed between the third portion 803 and a head 1032 of the bolt, and the head 1032 of the bolt may prevent the rotation part 1020 from being separated.

Referring to FIG. 11, a rotation device 1101 included in the first portion 801 of a support bar 1100 may include, for example, a rotation part 1110 and/or a bolt 1120. The rotation part 1110 may be a circular ring-shaped roller including a hole 1111, and include a circular outer circumferential surface 1112 and a circular inner circumferential surface 1113. The bolt 1120 may include a head 1121 and a round bar-shaped shaft 1122. The shaft 1122 of the bolt 1120 may include a thread 1122*a* and an unthreaded portion 1122*b* between the head 1121 and the thread 1122*a*. The rotation part 1110 may be rotatably positioned in the unthreaded portion 1122*b* included in the shaft 1122 of the bolt 1120 penetrating the hole 1111. The thread 1122*a* of the shaft 1122 may be fastened to a bolt fastening hole 1130 formed in the third portion 803. The rotation part 1110 may be interposed between the third portion 803 and the head 1121 of the bolt 1120, and the head 1121 of the bolt may prevent the rotation part 1120 from being separated. In order to reduce a loss of motion transmission or a loss of force transmission by reducing a frictional force between the rotation part 1110 and the unthreaded portion 1122*b*, a lubricant (e.g., grease) may be interposed between the rotation part 1110 and the unthreaded portion 1122*b* or the inner circumferential surface 1113 of the rotation part 1110 and/or the surface of the unthreaded portion 1122*b* may be coated with a lubricant.

Referring to FIG. 12, a rotation device 1201 included in the first portion 801 of a support bar 1200 may include, for example, a first shaft 1210 and a rotation part 1220. The first shaft 1210 may have a round bar shape extended from the third portion 803. In an embodiment, the first shaft 1210 may include a first area 1211 of a first diameter D1, a second area 1212 of a second diameter D2, and a third area 1213 of a third diameter D3. The second area 1211 may be interposed between the first area 1211 and the third area 1213, and the third area 1213 may be interposed between the third portion 803 and the second area 1212. The second diameter D2 may be smaller than the first diameter D2 and the third diameter D2. The first diameter D1 may be the same as or different from the third diameter D3. In some embodiments, the second diameter D2 and the third diameter D3 may be formed identically.

The rotation part 1220 may be, for example, a circular ring shaped-roller including a hole 1221, and include a circular outer circumferential surface 1222 and a circular inner circumferential surface 1223. The rotation part 1220 may be rotatably positioned in the second area 1212 of the first shaft 1210 penetrating the hole 1221. In an embodiment, in assembly for positioning the rotation part 1220 in the second area 1212 of the first shaft 1210, when pressing the rotation part 1220 so that the first area 1211 of the first shaft 1210 passes through the hole 1221 of the rotation part 1220, interference may occur. Interference may occur because, for example, the first diameter D1 of the first area 1211 is larger than a fourth diameter D4 of the inner circumferential surface 1223 of the rotation part 1120. When an external force corresponding to the interference is applied, due to elasticity of the first shaft 1210 and/or the rotation part 1220, the first area 1211 of the first shaft 1210 may pass through the hole 1221 of the rotation part 1220. In a state in which the rotation part 1220 is positioned in the second area 121 of the first shaft 1210, the first area 1211 of the first shaft 1210 may prevent the rotation part 1220 from being separated from the first shaft 1210. In order to reduce a loss of motion transmission or a loss of force transmission by reducing a frictional force between the second area 1212 and the rotation part 1220, a lubricant (e.g., grease) may be interposed between the second area 1212 and the rotation part 1220 or a surface of the second area 1212 and/or the inner circumferential surface 1223 of the rotation part 1220 may be coated with a lubricant.

According to some embodiments, the rotation part 920 according to the embodiment of FIG. 8, the rotation part 1020 of FIG. 10, the rotation part 1110 of FIG. 11, or the rotation part 1220 of FIG. 12 may be implemented into a rolling bearing, and some components corresponding thereto may be modified or omitted. The rolling bearing may include, for example, an outer ring forming a circular outer circumferential surface (e.g., the outer circumferential surface 922 of FIG. 8, the outer circumferential surface 1022 of FIG. 10, the outer circumferential surface 1112 of FIG. 11, or the outer circumferential surface 1222 of FIG. 12), an inner ring forming a circular inner circumferential surface (e.g., the inner circumferential surface 923 of FIG. 8, the outer circumferential surface 1023 of FIG. 10, the outer circumferential surface 1113 of FIG. 11, or the outer circumferential surface 1223 of FIG. 12), rolling elements such as balls or rollers positioned between the inner ring and the outer ring, and a retainer holding rolling members at regular intervals. In some embodiments, the rotation part 920 according to the embodiment of FIG. 8, the rolling member 1020 of FIG. 10, the rolling member 1110 of FIG. 11, or the rotation part 1220 of FIG. 12 may be implemented into a sliding bearing, and some components corresponding thereto may be modified or omitted. Other various types of radial bearings may be utilized as the rotation part.

At least one component included in the display support structure 50 of FIG. 4 based on the embodiment of FIG. 8, the embodiment of FIG. 10, the embodiment of FIG. 11, or the embodiment of FIG. 12 may be made of, for example, a material (e.g., metal or engineering plastic) having stiffness or bearing force that does not substantially deform corresponding to a force acting in a switch between the closed state of FIG. 5 and the open state of FIG. 6. Therefore, the display support structure 50 may reduce a loss of motion or a force in a switch between the closed state of FIG. 5 and the open state of FIG. 6.

Figure 13:
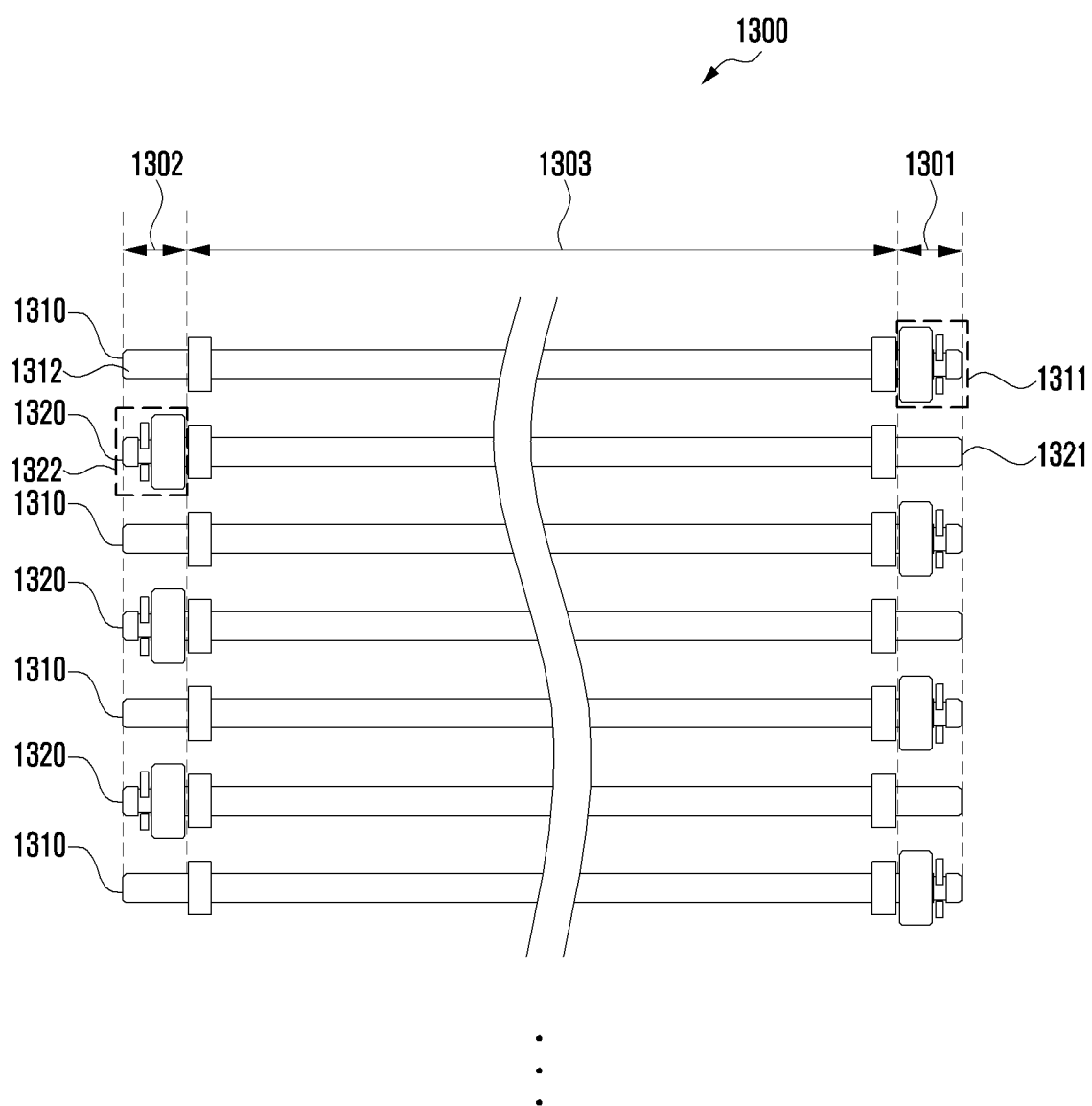
FIG. 13 illustrates a plurality of support bars included in the display support structure of FIG. 4 according to an embodiment of the disclosure.

FIG. 13 illustrates a plurality of support bars included in the display support structure of FIG. 4 according to an embodiment of the disclosure.

Referring to FIG. 13, each of a plurality of support bars (or multi-support bars) 1300 may include a first portion 1301, a second portion 1302, and a third portion 1303 between the first portion 1301 and the second portion 1302. The third portion 1303 may be substantially the same as the third portion 803 according to the embodiment of FIG. 8 or 9. In an embodiment, in the plurality of support bars 1300, a third type support bar 1310 and a fourth type support bar 1320 may be repeatedly arranged.

For example, the first portion 1301 included in the third type support bar 1310 may be substantially the same as the first portion 801 included in the first type support bar 810 according to the embodiment of FIG. 8 or 9. For example, the first portion 1301 included in the third type support bar 1310 may include a rotation device 1311 (e.g., the rotation device 901 of FIG. 8). The second portion 1302 included in the third type support bar 1310 may be substantially the same as the second portion 802 included in the second type support bar 820 according to the embodiment of FIG. 9. For example, the second portion 1302 included in the third type support bar 1310 may include a shaft 1312.

The first portion 1301 included in the fourth type support bar 1320 may be substantially the same as the first portion 801 included in the second type support bar 820 according to the embodiment of FIG. 8 or 9. For example, the first portion 1301 included in the fourth type support bar 1320 may include a shaft 1321 (e.g., the second shaft 902 of FIG. 8). The second portion 1302 included in the fourth type support bar 1320 may be substantially the same as the second portion 802 included in the first type support bar 810 according to the embodiment of FIG. 9. For example, the second portion 1302 included in the fourth type support bar 1320 may include a rotation device 1322. In an embodiment, the rotation device 1311 of the first portion 1301 included in the third type support bar 1310 and the shaft 1321 of the first portion 1301 included in the fourth type support bar 1320 adjacent thereto may be positioned separately so as not to interfere with each other. The shaft 1312 of the second portion 1302 included in the third type support bar 1310 and the rotation device 1322 of the second portion 1302 included in the fourth type support bar 1320 adjacent thereto may be positioned separately so as not to interfere with each other.

Figure 14:
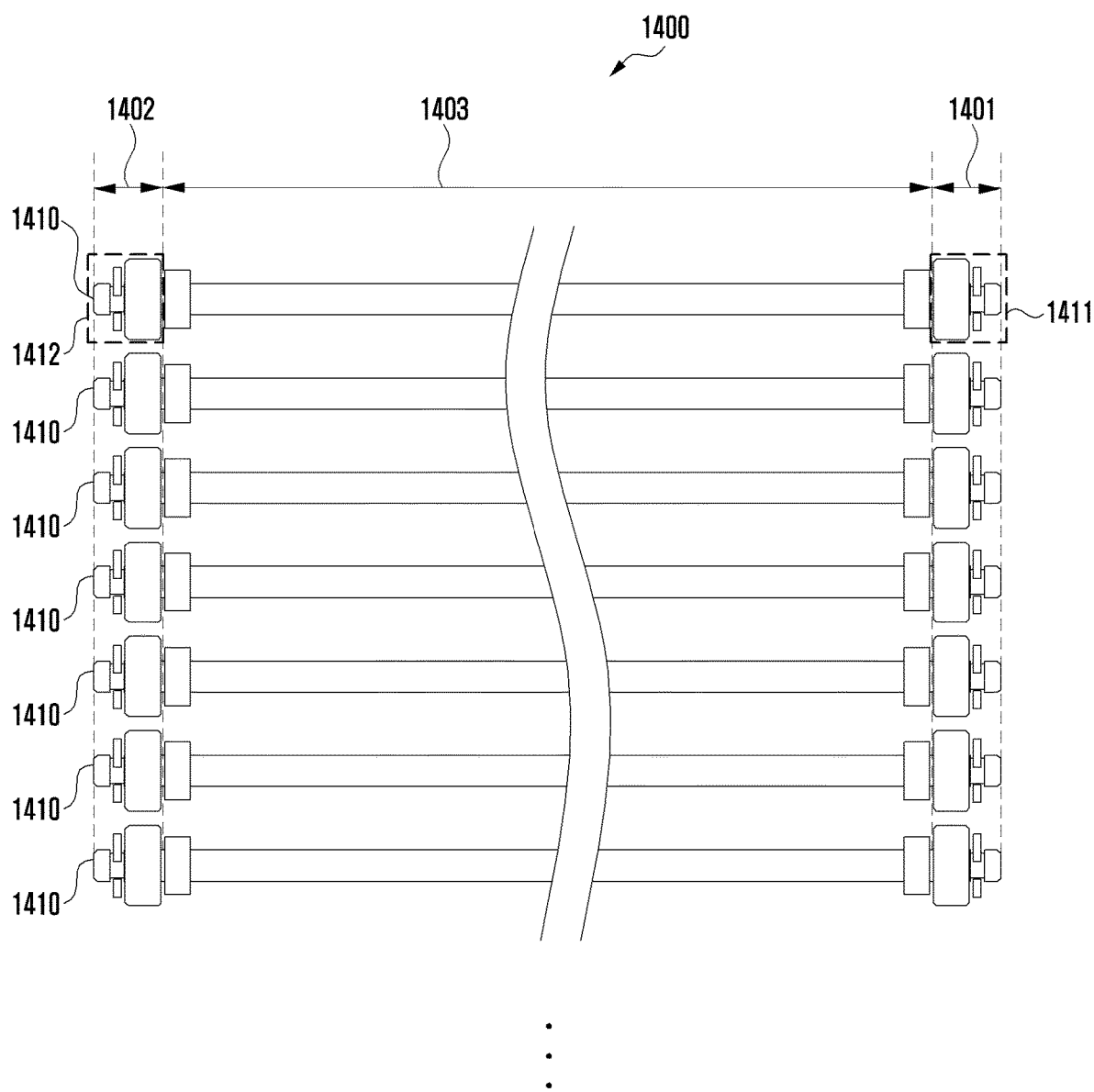
FIG. 14 illustrates a plurality of support bars included in the display support structure of FIG. 4 according to an embodiment of the disclosure.

FIG. 14 illustrates a plurality of support bars included in the display support structure of FIG. 4 according to an embodiment of the disclosure.

Referring to FIG. 14, each of a plurality of support bars (or multi-support bars) 1400 may include a first portion 1401, a second portion 1402, and a third portion 1403 between the first portion 1401 and the second portion 1402. In an embodiment, in the plurality of support bars 1400, a first type support bar 1410 may be repeatedly arranged. The first type support bar 1410 may be substantially the same as the first type support bar 810 according to the embodiment of FIG. 8. For example, the first type support bar 1410 may include a rotation device 1411 (e.g., the rotation device 901 of FIG. 8) positioned in the first portion 1401 and a rotation device 1412 positioned in the second portion 1402. In an embodiment, the rotation device 1411 of the first portion 1401 included in the first type support bar 1410 and the rotation device 1411 of the first portion 1401 included in another first type support bar 1410 adjacent thereto may be positioned separately so as not to interfere with each other. The rotation device 1412 of the second portion 1402 included in the first type support bar 1410 and the rotation device of the second portion 1402 included in another first type support bar 1410 adjacent thereto may be positioned separately so as not to interfere with each other.

Figure 15:
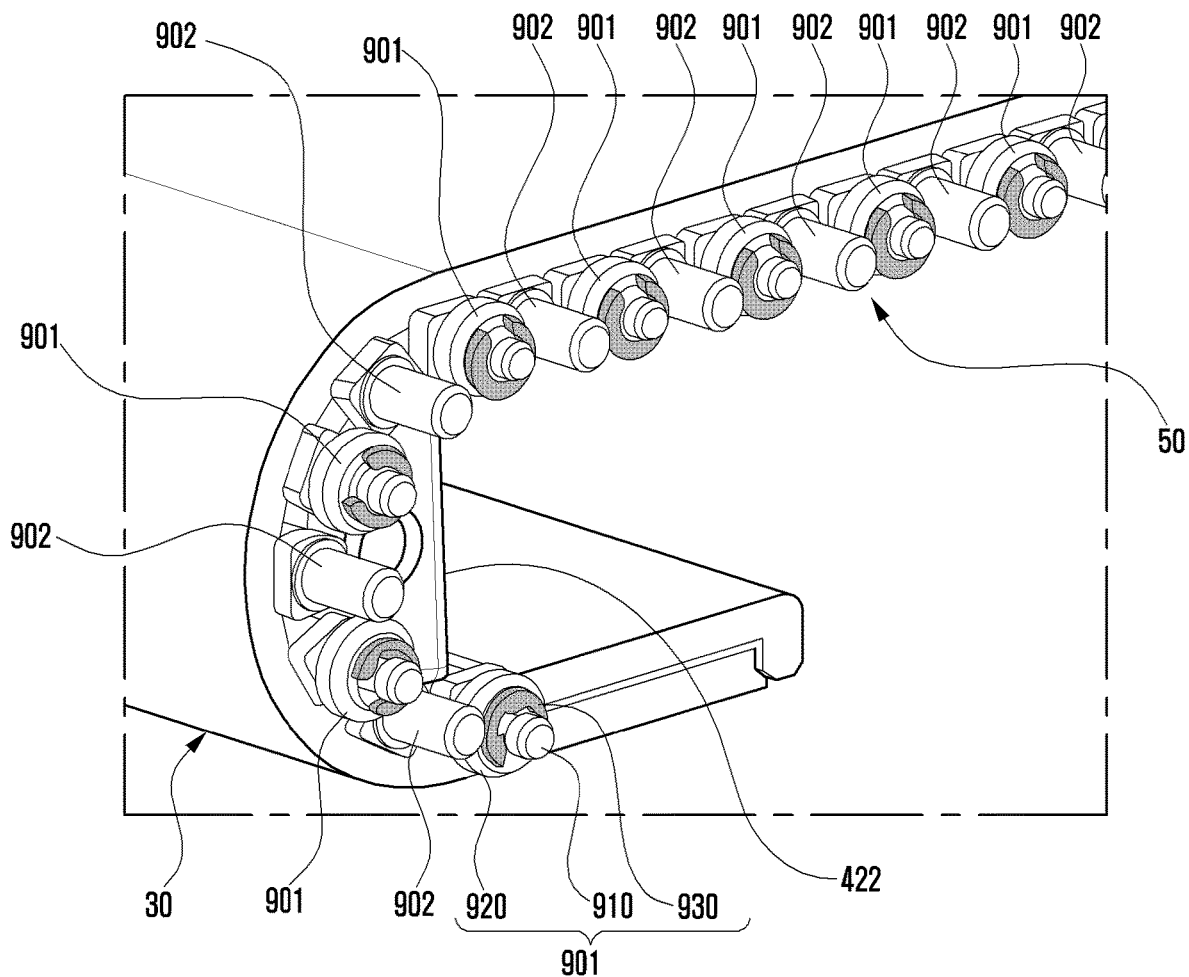
FIG. 15 illustrates a state in which a flexible display and a display support structure including a plurality of support bars are coupled according to an embodiment of the disclosure.

FIG. 15 illustrates a state in which a flexible display and display support structure including s plurality of support bars (see FIG. 8 or 9) are coupled to each other according to an embodiment of the disclosure.

Figure 16:
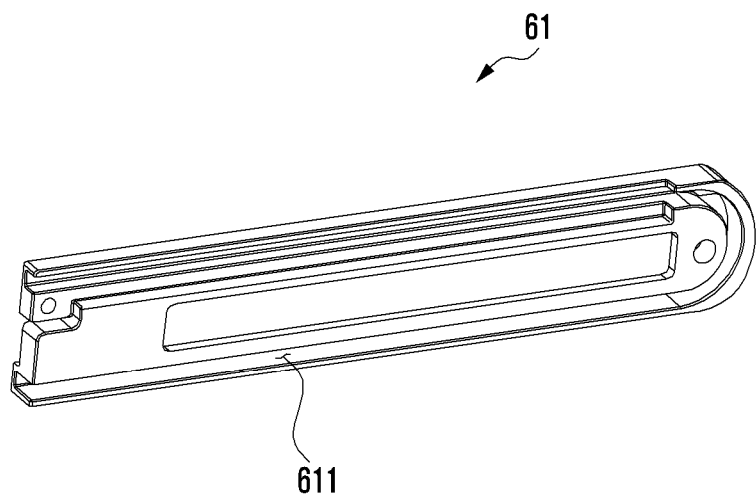
FIG. 16 illustrates a third support structure of FIG. 4 according to an embodiment of the disclosure.

FIG. 16 illustrates the third support structure of FIG. 4 according to an embodiment of the disclosure.

Referring to FIGS. 4, 8, 9, 15, and 16, the first portion 801 of the plurality of support bars 800 may be positioned at or inserted into the first guide rail 611 included in the third support structure 61. The first guide rail 611 may include a groove or a recess corresponding to a movement path of the display support structure 50. In a state change of the electronic device 2 (e.g., switch between the closed state of FIG. 5 and the open state of FIG. 6), the first portion 801 of the plurality of support bars 800 may be guided and moved to the first guide rail 611. The second portion 802 of the plurality of support bars 800 may be positioned at or inserted into the second guide rail 621 of the fourth support structure 62. In a state change of the electronic device 2, the second portion 802 of the plurality of support bars 800 may be guided and moved to the second guide rail 621. In a state change of the electronic device 2, when the first portion 801 of the plurality of support bars 800 is guided and moved to the first guide rail 611, the rotation part 920 positioned in the first portion 801 may rotate by friction with the first guide rail 611, thereby reducing friction between the display support structure 50 and the first guide rail 611. In a state change of the electronic device 2, when the second portion 802 of the plurality of support bars 800 is guided and moved to the second guide rail 621, the rotation part 950 positioned in the second portion 802 may rotate by friction with the second guide rail 621, thereby reducing a frictional force between the display support structure 50 and the second guide rail 621. In a state change of the electronic device 2, when a friction force between the display support structure 50 and the first guide rail 611 and a friction force between the display support structure 50 and the second guide rail 621 are reduced, a smooth and soft sliding motion may be implemented by reducing a loss of motion transmission or a loss of force transmission. For example, in a state change of the electronic device 2, the rotation part 920 positioned in the first portion 801 and the rotation part 950 positioned in the second portion 802 may reduce an influence of friction between the display support structure 50 and the guide rail on the sliding operation while the display support structure 50 moves while changing a direction corresponding to the curved portion 422a. Even when the display support structure 50 is implemented including a plurality of support bars 1300 according to the embodiment of FIG. 13 or a plurality of support bars 1400 according to the embodiment of FIG. 14, a smooth and soft sliding operation may be implemented due to the same principle.

Figure 17:
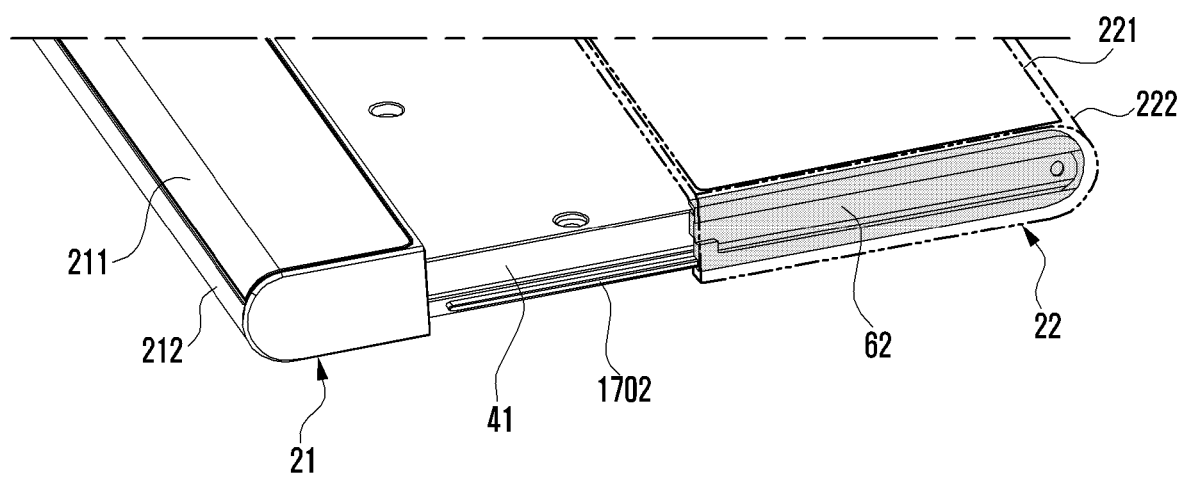
FIG. 17 illustrates a first housing part and a second housing part according to an embodiment of the disclosure.

FIG. 17 illustrates a first housing part and a second housing part according to an embodiment of the disclosure.

Referring to FIG. 17, a duplicate description of the first side cover 212, the first back cover 211, the second side cover 222, and the second back cover 221 illustrated in FIG. 17 will be omitted. Referring to FIG. 17, a sliding structure for slide-out or slide-in of the second housing part 22 may be provided between the first housing part 21 and the second housing part 22. In an embodiment, the first support structure 41 may include a second slide 1702 positioned or inserted to correspond to the second guide rail 621 (see FIG. 4) of the fourth support structure 62. The first support structure 41 may include a first slide (not illustrated) positioned or inserted to correspond to the first guide rail 611 included in the third support structure 61 of FIG. 4. In a state change of the electronic device 2 (e.g., switch between the closed state of FIG. 5 and the open state of FIG. 6), there may be sliding between the first slide and the first guide rail 611 and between the second slide 1702 and the second guide rail 621.

Figure 18:
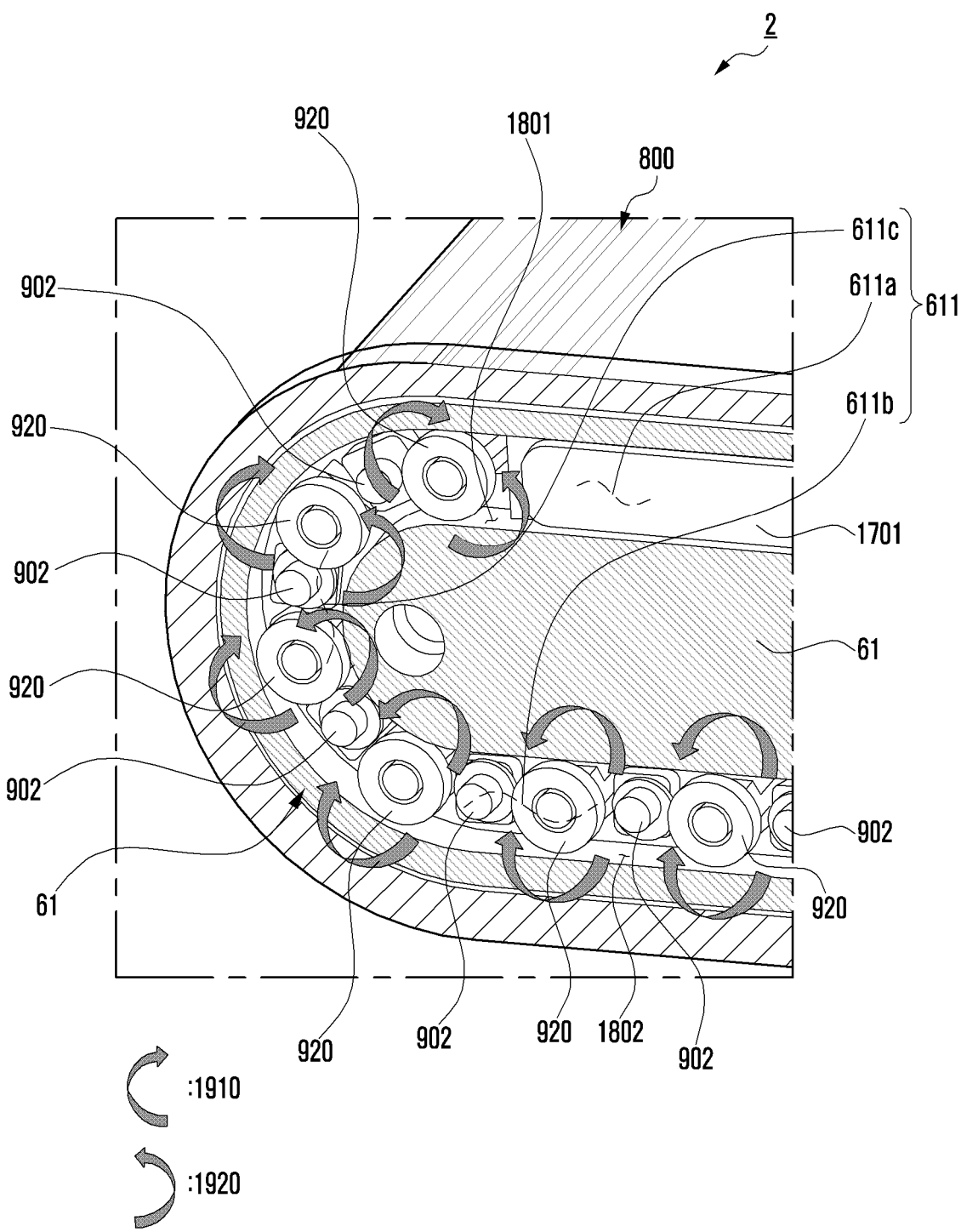
FIG. 18 illustrates a cross-sectional structure of a portion of an electronic device in a closed state according to an embodiment of the disclosure.

FIG. 18 illustrates a cross-sectional structure of a part of an electronic device in a closed state according to an embodiment of the disclosure.

Figure 19:
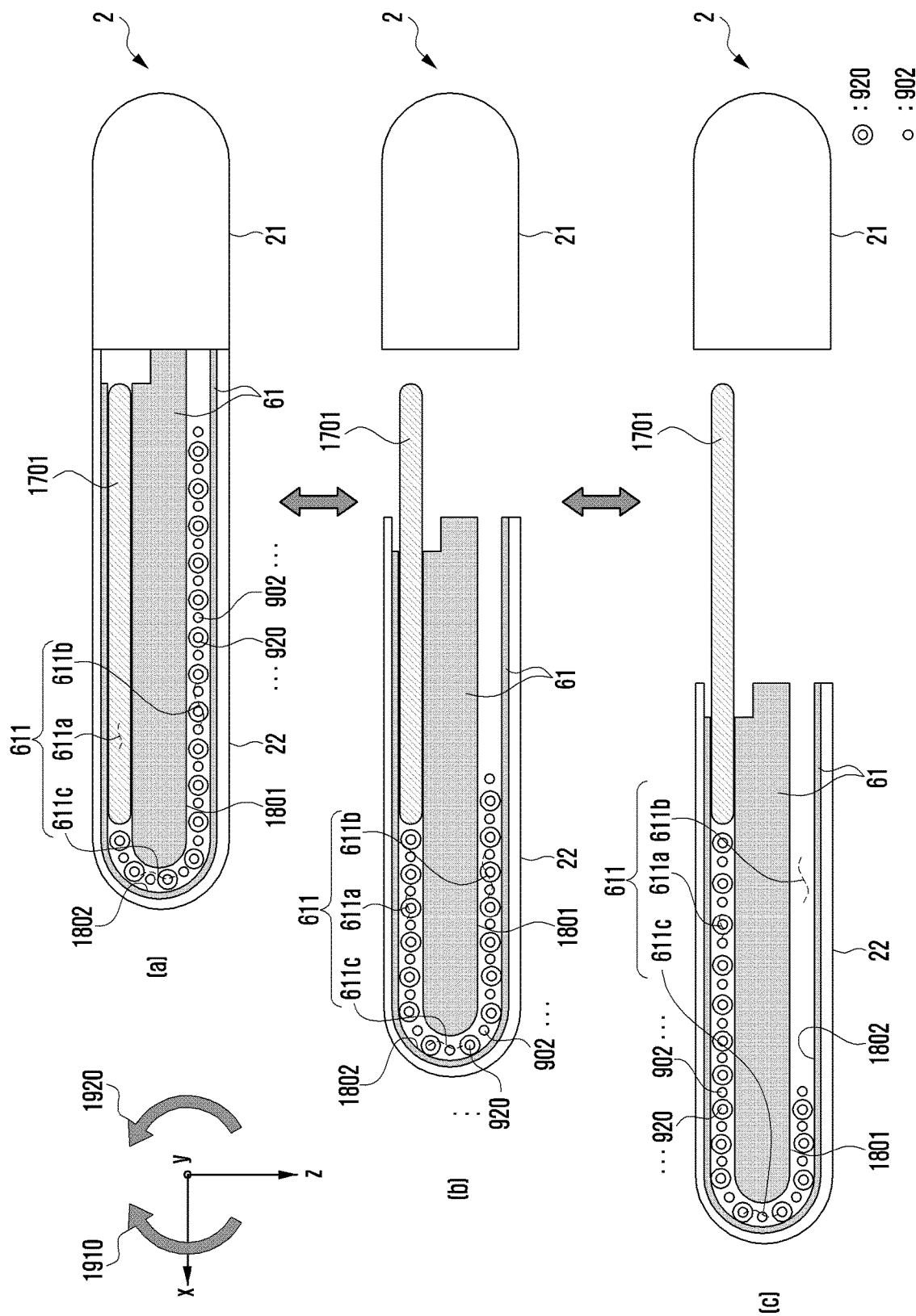
FIG. 19 illustrates cross-sectional structures of a closed state, an intermediate state, and an open state of an electronic device according to an embodiment of the disclosure.

FIG. 19 illustrates cross-sectional structures (a), (b), and (c) of a closed state, an intermediate state, and an open state of an electronic device according to an embodiment of the disclosure.

FIG. 19 illustrates a cross-sectional structure of a line D spaced parallel to a +y-axis direction from the center line C of FIGS. 2A, 2B, 3A, and 3B. Reference (a) denotes a cross-sectional structure of the electronic device 2 in a closed state. Reference (b) denotes a cross-sectional structure of the electronic device 2 in an intermediate state. Reference (c) denotes a cross-sectional structure of the electronic device 2 in an open state.

Referring to FIGS. 18 and 19, a portion of the plurality of support bars 800 may include the rotation part 920 positioned at or inserted into the first guide rail 611 of the third support structure 61. Another portion of the plurality of support bars 800 may include the second shaft 902 positioned at or inserted into the first guide rail 611 of the third support structure 61. The first support structure 41 of FIG. 4 may include a first slide 1701 positioned at or inserted into the first guide rail 611. The first guide rail 611 may be extended along a movement path of the display support structure 50 of FIG. 4. In an embodiment, the first guide rail 611 may include a first rail part 611a, a second rail part 611b, and a third rail part 611c connecting the first rail part 611a and the second rail part 611b. The first rail part 611a and the second rail part 611b may have a linear shape extended in a slide-out direction (e.g., +x-axis direction) of the second housing part 22. The first rail part 611a may be positioned closer to the screen S (see FIG. 2A) than the second rail part 611b. The first rail part 611a may be parallel to the first flat portion S1 (see FIG. 2A) of the screen S. The second rail part 611b may be positioned closer to the first rear surface B1 (see FIG. 2B) than the first rail part 611a. The second rail part 611b may be parallel to the second flat portion B11 (see FIG. 2B) of the first rear surface B1. The third rail part 611c may have a curved shape extended to correspond to the curved portion 422a included in the fourth support member 422 of FIG. 4. The third rail part 611c may be, for example, bent and extended with a radius of curvature smaller than a radius of curvature at which the second area CD of the flexible display 30 is bent to correspond to the curved portion 422a.

There may be a first state change of the electronic device 2, which is switched from a state (see (a) of FIG. 19) in which the second housing part 22 is slid out in a +x axis direction with respect to the first housing part 21 to be closed to an intermediate state (see (b) of FIG. 19) or which is switched from the intermediate state 19B to an open state (see (c) of FIG. 19). There may be a second state change of the electronic device 2, which is switched from a state (see (c) of FIG. 19) in which the second housing part 22 is slid in in a −x axis direction with respect to the first housing part 21 to be open to an intermediate state (see (b) of FIG. 19) or which is switched from an intermediate state (see (b) of FIG. 19) to a closed state (see (a) of FIG. 19). In the first state change, the plurality of support bars 800 may be guided and moved to the first guide rail 611, and at least one rotation part 920 positioned in the first guide rail 611 may rotate in a first direction 1910 by friction with the rail 611. In the second state change, the plurality of support bars 800 may be guided and moved to the first guide rail 611, and at least one rotation part 920 positioned in the first guide rail 611 may rotate in a second direction 1920 opposite to the first direction 1910 by friction with the rail 611. According to an embodiment, the first guide rail 611 may include a first surface 1801 and a second surface 1802. The first surface 1801 and the second surface 1802 may be extended substantially in parallel with a separation space therebetween. The first surface 1801 and the second surface 1802 may be spaced apart from each other to face each other with the first portion 801 of FIG. 8 inserted into the first guide rail 611 therebetween. In the first state change or the second state change of the electronic device 2, the outer circumferential surface 922 (see FIG. 8) of the rotation part 920 may rotate by friction with the first surface 1801 or the second surface 1802.

Referring to FIGS. 8, 9, and 19, a separation distance between the first surface 1801 and the second surface 1802 of the guide rail 611 may be greater than a third diameter D3 of the outer circumferential surface 922 of the rotation part 920. In a first state change or a second state change of the electronic device 2, the outer circumferential surface 922 of the rotation part 920 may come into contact with one of the first surface 1801 and the second surface 1802 of the first guide rail 611. For example, in the first state change, the outer circumferential surface 922 of the at least one rotation part 920 may come into contact with the second surface 1802 of the first guide rail 611. In some cases, in the first state change, the outer circumferential surface 922 of the at least one rotation part 920 may come into contact with the first surface 1801 of the first guide rail 611. For example, in the second state change, the outer circumferential surface 922 of the at least one rotation part 920 may come into contact with the first surface 1801 of the first guide rail 611. In some cases, in the second state change, the outer circumferential surface 922 of the at least one rotation part 920 may come into contact with the second surface 1802 of the first guide rail 611. At least one (e.g., the flexible display 30 and the support sheet 70) included in the display assembly 700 illustrated in FIG. 7 may have a restoring force to restore from a bent state to an unfolded state. The restoring force of the display assembly 700, a motion or force transmitted between the components in the first state change or the second state change, and/or a tolerance between the components act in a complex way, so that the outer circumferential surface 922 of the at least one rotation part 920 may come into contact with one of the first surface 1801 and the second surface 1802 of the first guide rail 611.

Figure 20:
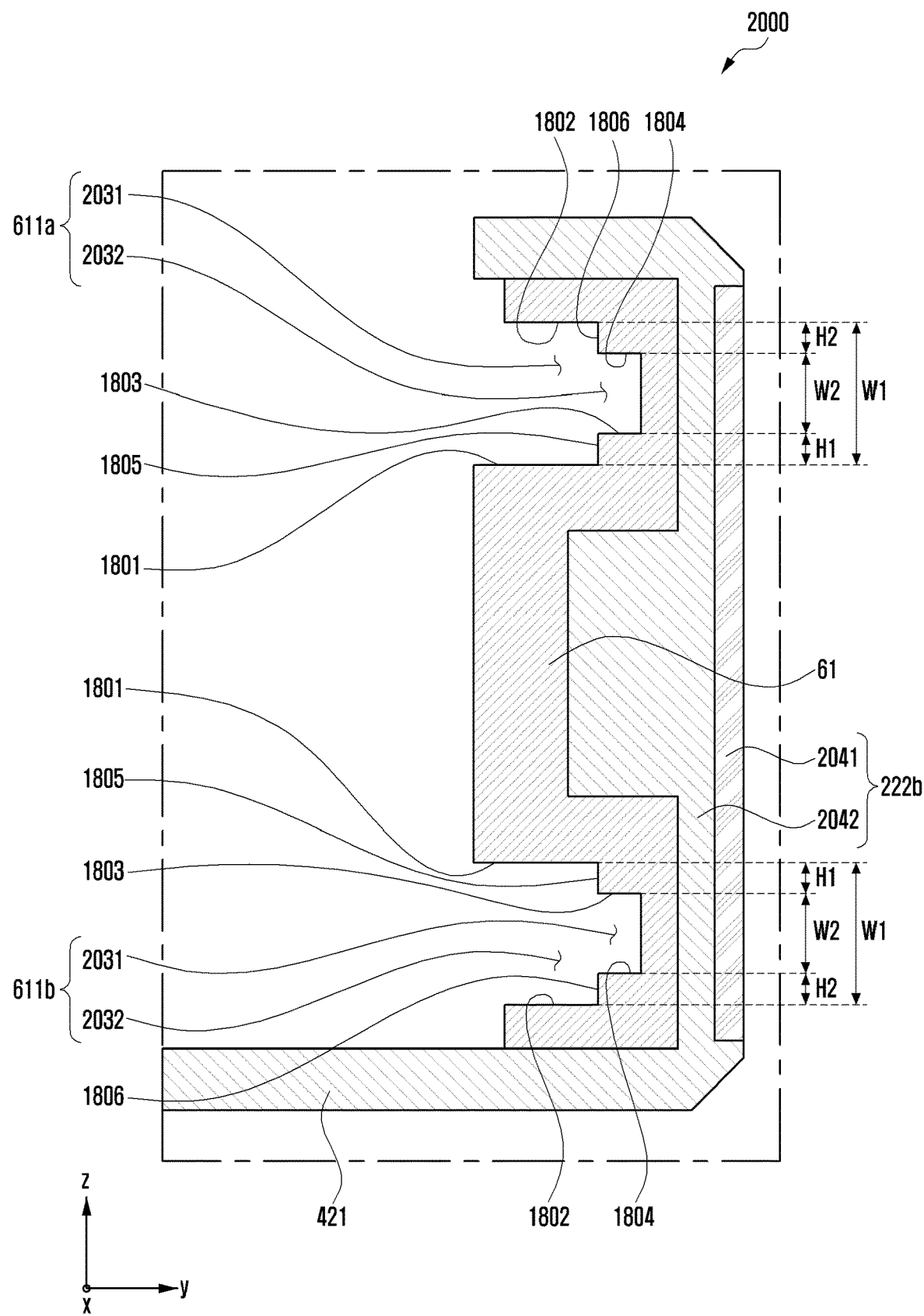
FIG. 20 schematically illustrates a cross-sectional structure of a portion of an electronic device taken along line E-E' of FIG. 2A according to an embodiment of the disclosure.

FIG. 20 schematically illustrates a cross-sectional structure of a portion of the electronic device taken along line E-E' of FIG. 2A according to an embodiment of the disclosure.

Referring to FIGS. 4 and 20, a cross-sectional structure 2000 may include the third support structure 61, the second cover portion 222b, and/or the third support member 421. The third support structure 61 may be disposed at or coupled to the second cover portion 222b. The second cover portion 222b may include, for example, two portions 2041 and 2042 coupled to each other. In some embodiments, the two portions 2041 and 2042 may be integrally formed.

Referring to FIGS. 18, 19, and 20, the first rail part 611a, the second rail part 611b, and the third rail part 611c of the first guide rail 611 may include a first recess 2031 and a second recess 2032. Although not illustrated, the third rail part 611c may be extended between the first rail part 611a and the second rail part 611b in a curved shape with the same cross-sectional structure as that illustrated in FIG. 20. In an embodiment, the first recess 2031 and the second recess 2032 may be formed in a space of a concave shape in a direction (e.g., +y-axis direction) from the second portion 802 to the first portion 801 in the plurality of support bars 800 illustrated in FIG. 8. The first recess 2031 and the second recess 2032 are positioned to overlap in the +y-axis direction, and the second recess 2032 may include a second space extended in the +y-axis direction from the first space of the first recess 2031. The first recess 2031 may include the first surface 1801 and the second surface 1802 facing each other with a separation space of a first width W1 therebetween. The first surface 1801 and the second surface 1802 may be extended substantially parallel to each other and be parallel to a direction (e.g., y-axis direction) in which the axis of rotation (e.g., a first shaft 910) of the rotation part 920 illustrated in FIG. 9 is extended. The second recess 2032 may include a third surface 1803 and a fourth surface 1804 facing each other with a separation space of a second width W2 smaller than the first width W1 therebetween. The third surface 1803 and the fourth surface 1804 may be extended substantially parallel to each other and be parallel to a direction (e.g., y-axis direction) in which the axis of rotation (e.g., the first shaft 910) of the rotation part 920 illustrated in FIG. 9 is extended. A first height difference H1 between the first surface 1801 and the third surface 1803 may be substantially the same as a second height difference H2 between the second surface 1802 and the fourth surface 1804. In some embodiments, the first height difference H1 and the second height difference H2 may be different from each other.

The first guide rail 611 may include a fifth surface 1805 between the first surface 1801 and the third surface 1803. The first guide rail 611 may also include a sixth surface 1806 between the second surface 1802 and the fourth surface 1804. The fifth surface 1805 may be perpendicular to the first surface 1801 or the third surface 1803, and the sixth surface 1806 may be perpendicular to the second surface 1802 or the fourth surface 1804. The fifth surface 1805 or the sixth surface 1806 may face in a −y axis direction, and be formed without a difference in height in the −y axis direction. In some embodiments, the fifth surface 1805 and the sixth surface 1806 may be formed to have a height difference in the −y axis direction.

According to some embodiments, the third surface 1803 may be formed as an inclined surface that is not parallel to the first surface 1801. In some embodiments, the fourth surface 1804 may be formed as an inclined surface that is not parallel to the second surface 1802.

According to some embodiments, the fifth surface 1805 may be formed as an inclined surface that is not perpendicular to the first surface 1801 or the third surface 1803. In some embodiments, the fourth surface 1804 may be formed as an inclined surface that is not perpendicular to the second surface 1802 or the fourth surface 1804.

According to an embodiment, the electronic device 2 may include a cross-sectional structure (e.g., a cross-sectional structure of the fourth support structure 62, the third cover portion 222c, and the third support member 421 of FIG. 4) substantially symmetrical to the cross-sectional structure 2000 illustrated in FIG. 20 in relation to the second guide rail 621 of FIG. 4 based on a center line C (see FIG. 2A, 2B, 3A, or 3B).

Figure 21:
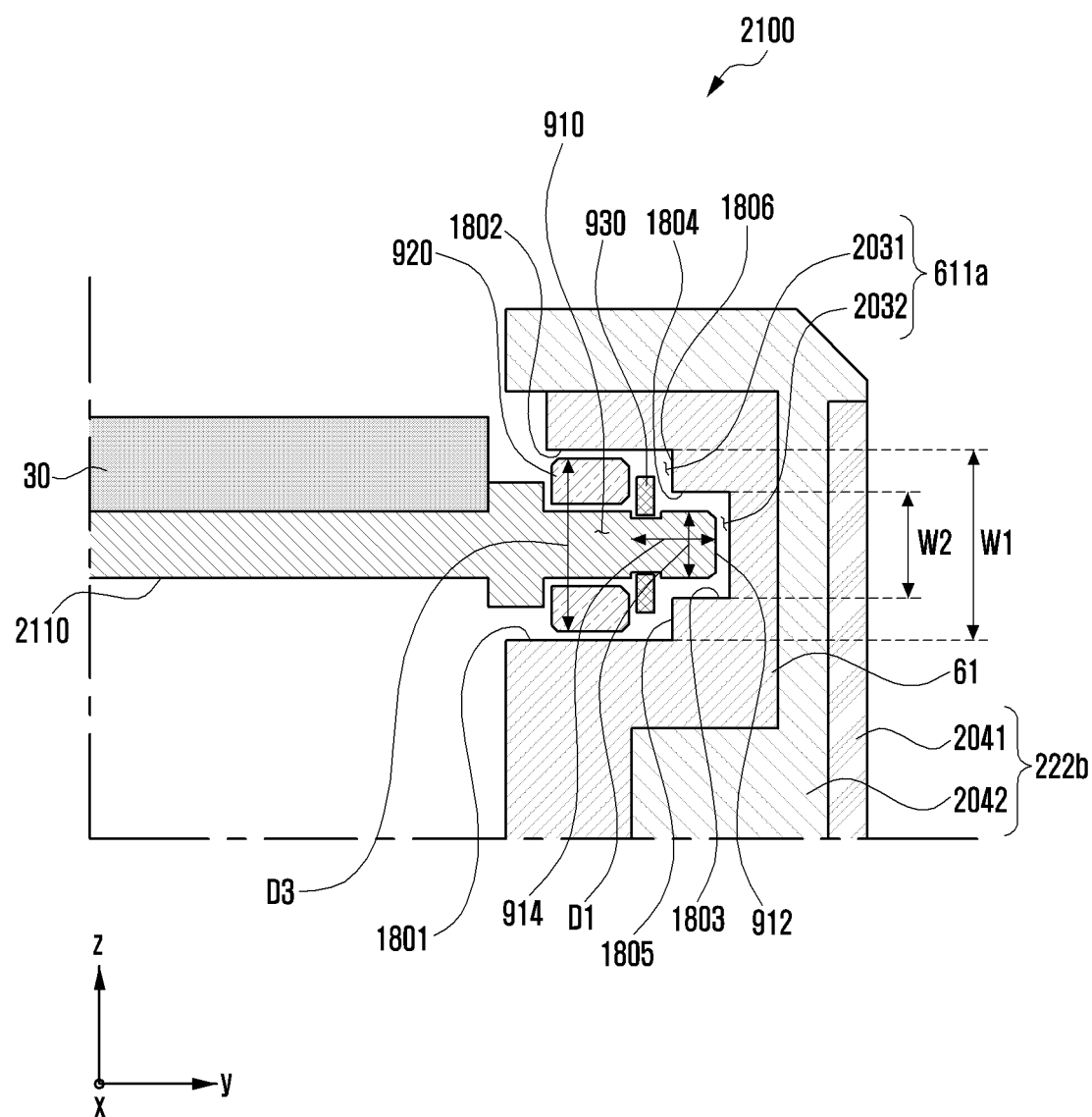
FIG. 21 schematically illustrates a cross-sectional structure in a state in which some of the plurality of support bars of FIG. 8 coupled to a flexible display are positioned in a first rail part of a first guide rail according to an embodiment of the disclosure.

FIG. 21 schematically illustrates a cross-sectional structure in a state in which some of the plurality of support bars of FIG. 8 coupled to the flexible display are positioned in the first rail part of the first guide rail according to an embodiment of the disclosure.

Referring to FIGS. 19, 20, and 21, the first shaft 910, the rotation part 920, and the separation prevention part 930 positioned in some support bars 2110 may be inserted into the first rail part 611a of the first guide rails 611 of a cross-sectional structure 2100. The first shaft 910 may be partially inserted into the second recess 2032 through the first recess 2031. The first shaft 910 may include a portion (e.g., the second extension portion 914 of FIGS. 8 and 21) protruded in the +y-axis direction with respect to the separation preventing portion 930, and the second recess 2032 may serve to receive this portion. The rotation part 920 and the separation prevention part 930 may be positioned in the first recess 2031. The third diameter D3 of the outer circumferential surface 922 (see FIG. 8) of the rotation part 920 may be smaller than the first width W1 of the first recess 2031. The first diameter D1 of the first shaft 910 may be smaller than the second width W2 of the second recess 2032. In a state change of the electronic device 2 (e.g., switch between a closed state and an open state), when the first portion 801 (see FIG. 8) of the plurality of support bars 800 is guided and moved to the first guide rail 611, the rotation part 920 may rotate by friction with the first surface 1801 or the second surface 1802 of the first rail part 611a.

According to an embodiment, a difference between the third diameter D3 and the first width W1 may be smaller than a difference between the first diameter D1 and the second width W2. Therefore, the rotation part 920 may come into contact with the first surface 1801 or the second surface 1802 of the first rail part 611a, but the first shaft 910 may not come into contact with the third surface 1803 and the fourth surface 1804 of the first rail part 611a. In a state change of the electronic device 2 (e.g., a switch between the closed state of FIG. 5 and the open state of FIG. 6), because the first shaft 910 does not come into contact with the third surface 1803 the fourth surface 1804 of the first rail part 611a, a loss of motion transmission or a loss of force transmission by friction may be reduced.

According to an embodiment, the separation prevention part 930 may overlap the fifth surface 1805 and/or the sixth surface 1806 when viewed in the y-axis direction. A movement of the display assembly 700 of FIG. 7 in the +y-axis direction may be restricted due to interference between the separation prevention part 930 and the fifth surface 1805 (or the sixth surface 1806). Therefore, an end portion 912 of the first shaft 910 may not come into contact with the surface of the second recess 2032 in the first rail part 611a. In a state change of the electronic device 2, because the end portion 912 of the first shaft 910 does not come into contact with the surface of the first rail part 611, a loss of motion transmission or a loss of force transmission by friction may be reduced. In some embodiments, in the first rail part 611a, the third surface 1803 and the fifth surface 1805 may be omitted, and the first surface 1801 may be extended. In some embodiments, in the first rail part 611a, the fourth surface 1804 and the sixth surface 1806 may be omitted, and the second surface 1802 may be extended.

According to some embodiments, as the display assembly 700 of FIG. 7 is moved in the +y direction, the end portion 912 of the first shaft 910 may come into contact with the surface of the second recess 2032 facing therewith, but the separation prevention part 930 may not come into contact with the fifth surface 1805 and/or the sixth surface 1806. In a state change of the electronic device 2, because the separation prevention part 930 does not come into contact with the fifth surface 1805 and/or the sixth surface 1806, a loss of motion transmission or a loss of force transmission by friction may be reduced.

Figure 22:
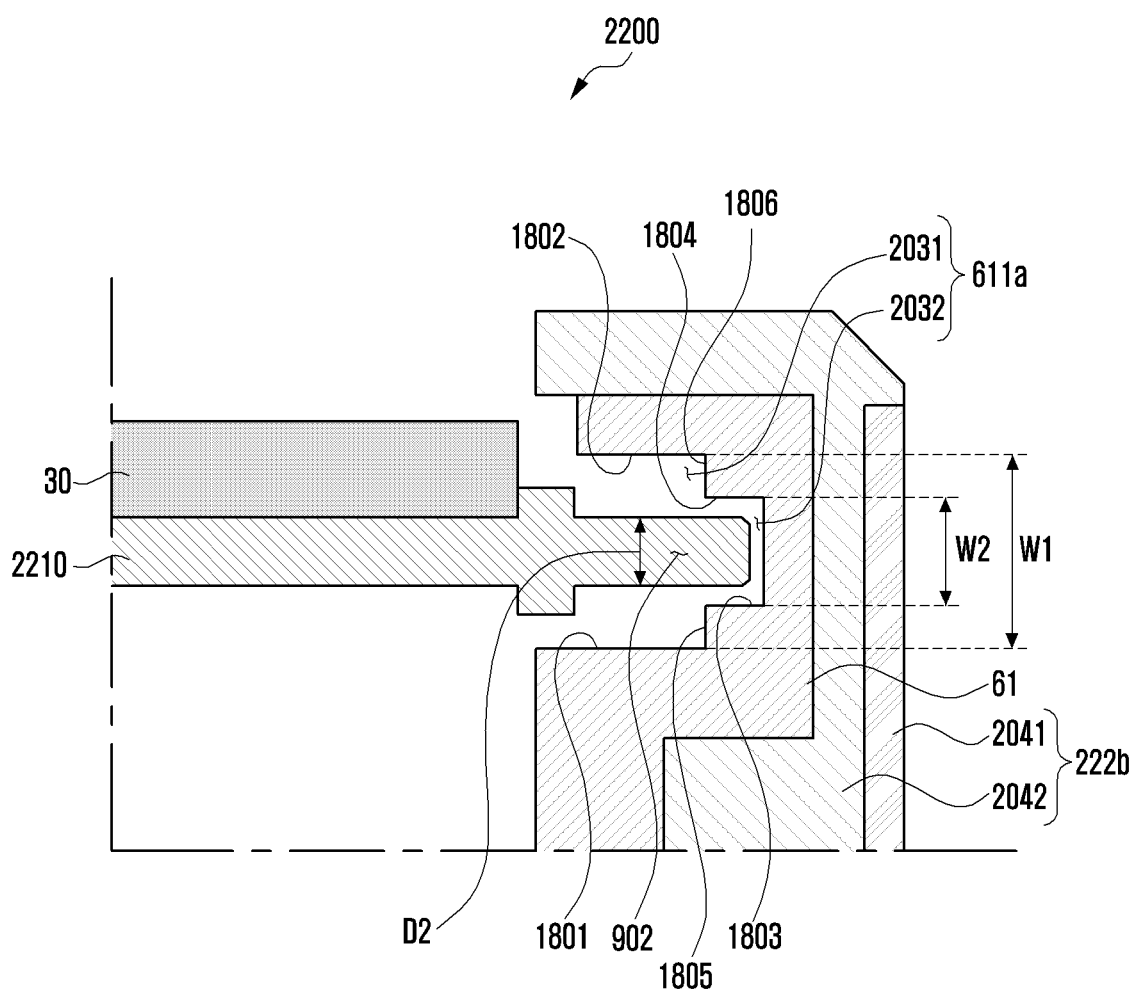
FIG. 22 schematically illustrates a cross-sectional structure in a state in which some of the plurality of support bars of FIG. 8 coupled to a flexible display are positioned in a first rail part of a first guide rail according to an embodiment of the disclosure.

FIG. 22 schematically illustrates a cross-sectional structure in a state in which some of the plurality of support bars of FIG. 8 coupled to the flexible display are positioned in the first rail part of the first guide rail according to an embodiment of the disclosure.

Referring to FIGS. 19, 20, and 22, the second shaft 902 positioned in some support bars 2210 may be inserted into the first rail part 611a of the first guide rail 611 in a cross-sectional structure 2200. The second shaft 902 may be partially inserted into the second recess 2032 through the first recess 2031. A second diameter D2 of the second shaft 902 may be smaller than a second width W2 of the second recess 2032. In an embodiment, a difference between the first diameter D1 (see FIG. 21) of the rotation part 920 and the first width W1 of the first recess 2031 may be smaller than a difference between the second diameter D2 of the second shaft 902 and the second width W2 of the second recess 2032. Therefore, the rotation part 920 positioned in the first portion 801 (see FIG. 8 or 9) of one first type support bar 810 may come into contact with the first surface 1801 or the second surface 1802 of the first rail part 611a, but it may be difficult that the second shaft 902 positioned in the first portion 801 of the second type support bar 820 adjacent thereto comes into contact with the third surface 1803 and the fourth surface 1804 of the first rail part 611a due to elasticity of the display assembly 700 of FIG. 7. In a state change of the electronic device 2, because the second shaft 902 does not come into contact with the surface of the first rail part 611a, a loss of motion transmission or a loss of force transmission by friction may be reduced.

Referring to FIGS. 4, 21, and 22, the electronic device 2 may be implemented in the method described with reference to FIG. 21 or 22 with respect to the second guide rail 621 of the fourth support structure 62 and the support bars corresponding to the second guide rail 621. Accordingly, in a state change of the electronic device 2, a frictional force between the second guide rail 621 and the support bars may be reduced.

Figure 23:
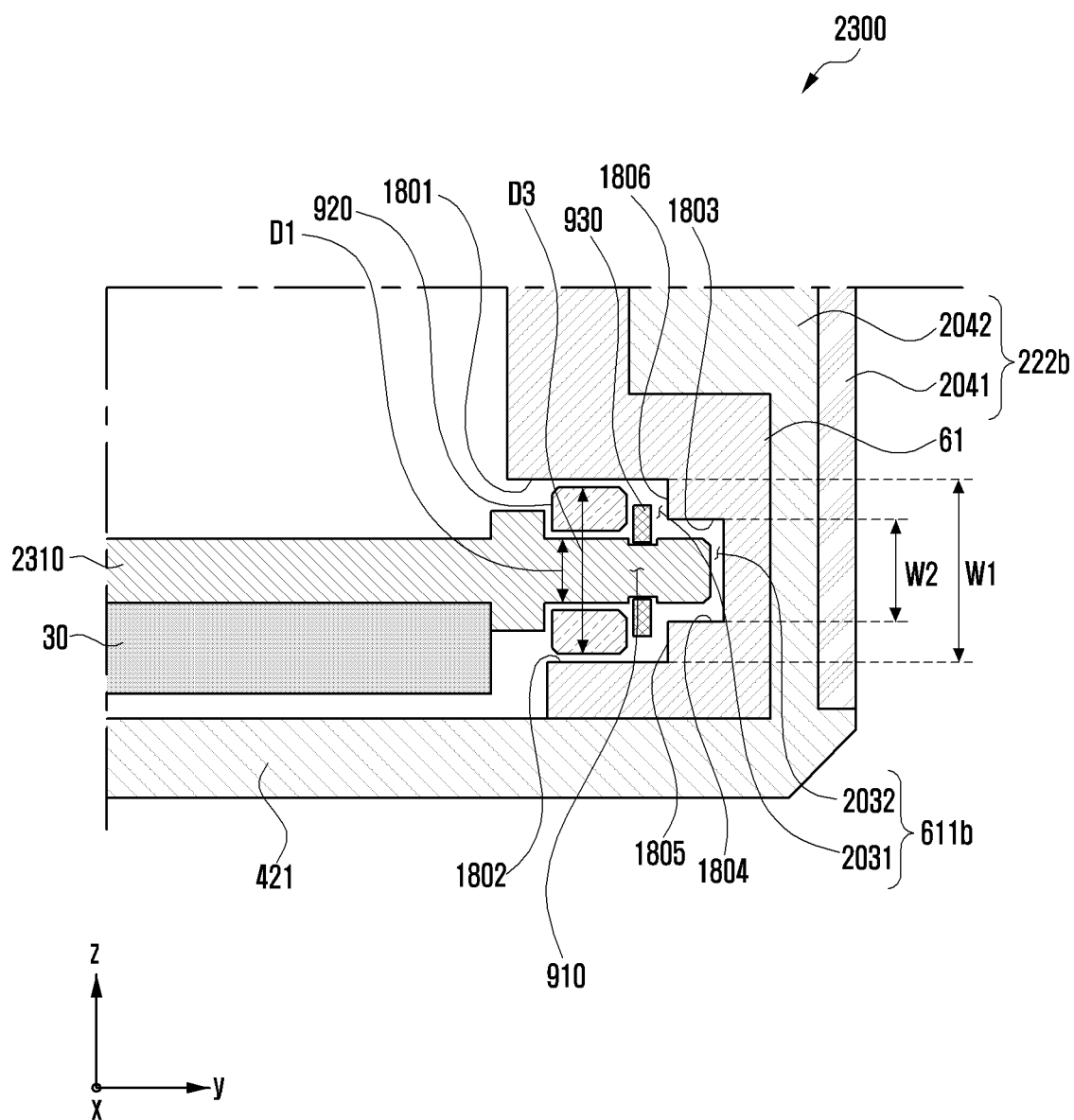
FIG. 23 schematically illustrates a cross-sectional structure in a state in which some of the plurality of support bars of FIG. 8 coupled to a flexible display are positioned in a second rail part of a first guide rail according to an embodiment of the disclosure.

FIG. 23 schematically illustrates a cross-sectional structure in a state in which some of the plurality of support bars of FIG. 8 coupled to the flexible display are positioned in the second rail part of the first guide rail according to an embodiment of the disclosure.

Referring to FIGS. 19, 20, and 23, the first shaft 910, the rotation part 920, and the separation prevention part 930 positioned in some support bars 2310 may be inserted into the second rail part 611b of the first guide rail 611 in a cross-sectional structure 2300. The first shaft 910 may be partially inserted into the second recess 2032 through the first recess 2031. The rotation part 920 and the separation prevention part 930 may be positioned in the first recess 2031. The third diameter D3 of the outer circumferential surface 922 (see FIG. 8) of the rotation part 920 may be smaller than the first width W1 of the first recess 2031. The first diameter D1 of the first shaft 910 may be smaller than the second width W2 of the second recess 2032. In a state change of the electronic device 2 (e.g., switch between a closed state and an open state), when the first portion 801 (see FIG. 8) of the plurality of support bars 800 is guided and moved to the first guide rail 611, the rotation part 920 may rotate by friction with the first surface 1801 or the second surface 1802 of the second rail part 611b.

According to an embodiment, a difference between the third diameter D3 and the first width W1 may be smaller than a difference between the first diameter D1 and the second width W2. Therefore, the rotation part 920 may come into contact with the first surface 1801 or the second surface 1802 of the second rail part 611b, but the first shaft 910 may not come into contact with the third surface 1803 and the fourth surface 1804 of the second rail part 611b. In a state change of the electronic device 2, because the first shaft 910 does not come into contact with surfaces (e.g., the third surface 1803 and the fourth surface 1804) of the second rail part 611b, a loss of motion transmission or a loss of force transmission by friction may be reduced.

According to an embodiment, the separation prevention part 930 may overlap the fifth surface 1805 and/or the sixth surface 1806 when viewed in the y-axis direction. A movement of the display assembly 700 of FIG. 7 in the +y-axis direction may be restricted due to interference between the separation prevention part 930 and the fifth surface 1805 (or the sixth surface 1806). Therefore, the end portion 912 of the first shaft 910 may not come into contact with the surface of the second recess 2032 in the second rail part 611b. In a state change of the electronic device 2, because the end portion 912 of the first shaft 910 does not come into contact with the surface of the second rail 611b, a loss of motion transmission or a loss of force transmission by friction may be reduced. In some embodiments, in the second rail part 611b, the third surface 1803 and the fifth surface 1805 may be omitted, and the first surface 1801 may be extended. In some embodiments, in the second rail part 611b, the fourth surface 1804 and the sixth surface 1806 may be omitted, and the second surface 1802 may be extended.

Figure 24:
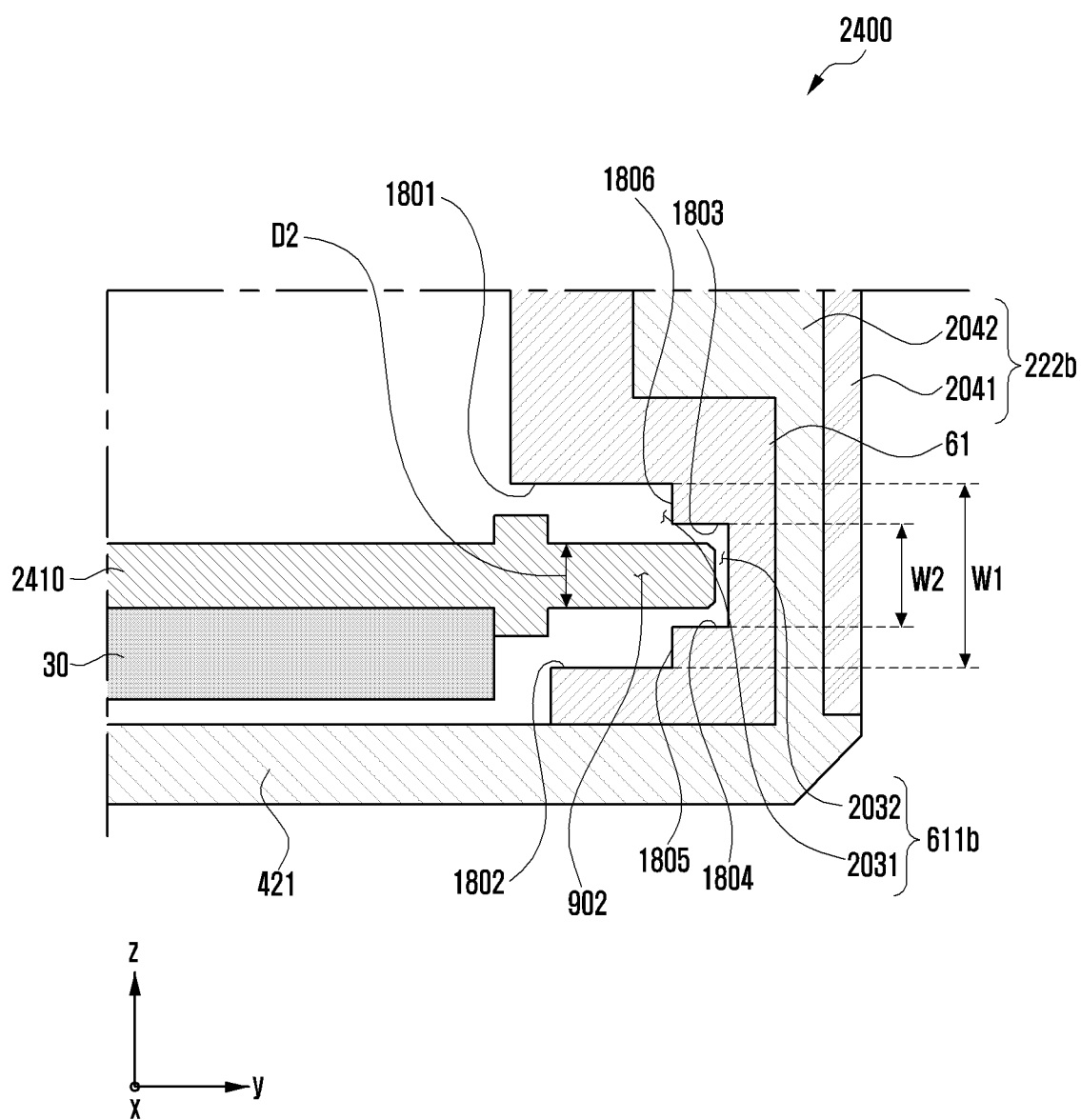
FIG. 24 schematically illustrates a cross-sectional structure in a state in which some of the plurality of support bars of FIG. 8 coupled to a flexible display are positioned in a second rail part of a first guide rail according to an embodiment of the disclosure.

FIG. 24 schematically illustrates a cross-sectional structure in a state in which some of the plurality of support bars of FIG. 8 coupled to the flexible display are positioned in the second rail part of the first guide rail according to an embodiment of the disclosure.

Referring to FIGS. 19, 20, and 24, the second shaft 902 positioned in some support bars 2410 may be inserted into the second rail part 611b of the first guide rail 611 in a cross-sectional structure 2400. The second shaft 902 may be partially inserted into the second recess 2032 through the first recess 2031. The second diameter D2 of the second shaft 902 may be smaller than the second width W2 of the second recess 2032. In an embodiment, a difference between the first diameter D1 (see FIG. 21) of the rotation part 920 and the first width W1 of the first recess 2031 may be smaller than a difference between the second diameter D2 of the second shaft 902 and the second width W2 of the second recess 2032. Therefore, the rotation part 920 positioned in the first portion 801 (see FIG. 8 or 9) of one first type support bar 810 may come into contact with the first surface 1801 or the second surface 1802 of the second rail part 611b, but it may be difficult that the second shaft 902 positioned in the first portion 801 of the second type support bar 820 adjacent thereto comes into contact with the third surface 1803 and the fourth surface 1804 of the second rail part 611b due to elasticity of the display assembly 700 of FIG. 7. In a state change of the electronic device 2, because the second shaft 902 does not come into contact with the surface of the second rail part 611b, a loss of motion transmission or a loss of force transmission by friction may be reduced.

Referring to FIGS. 4, 23, and 24, the electronic device 2 may be implemented in the method described with reference to FIG. 23 or 24 with respect to the second guide rail 621 of the fourth support structure 62 and the support bars corresponding to the second guide rail 621. Accordingly, in a state change of the electronic device 2, a frictional force between the second guide rail 621 and the support bars may be reduced.

Figure 25:
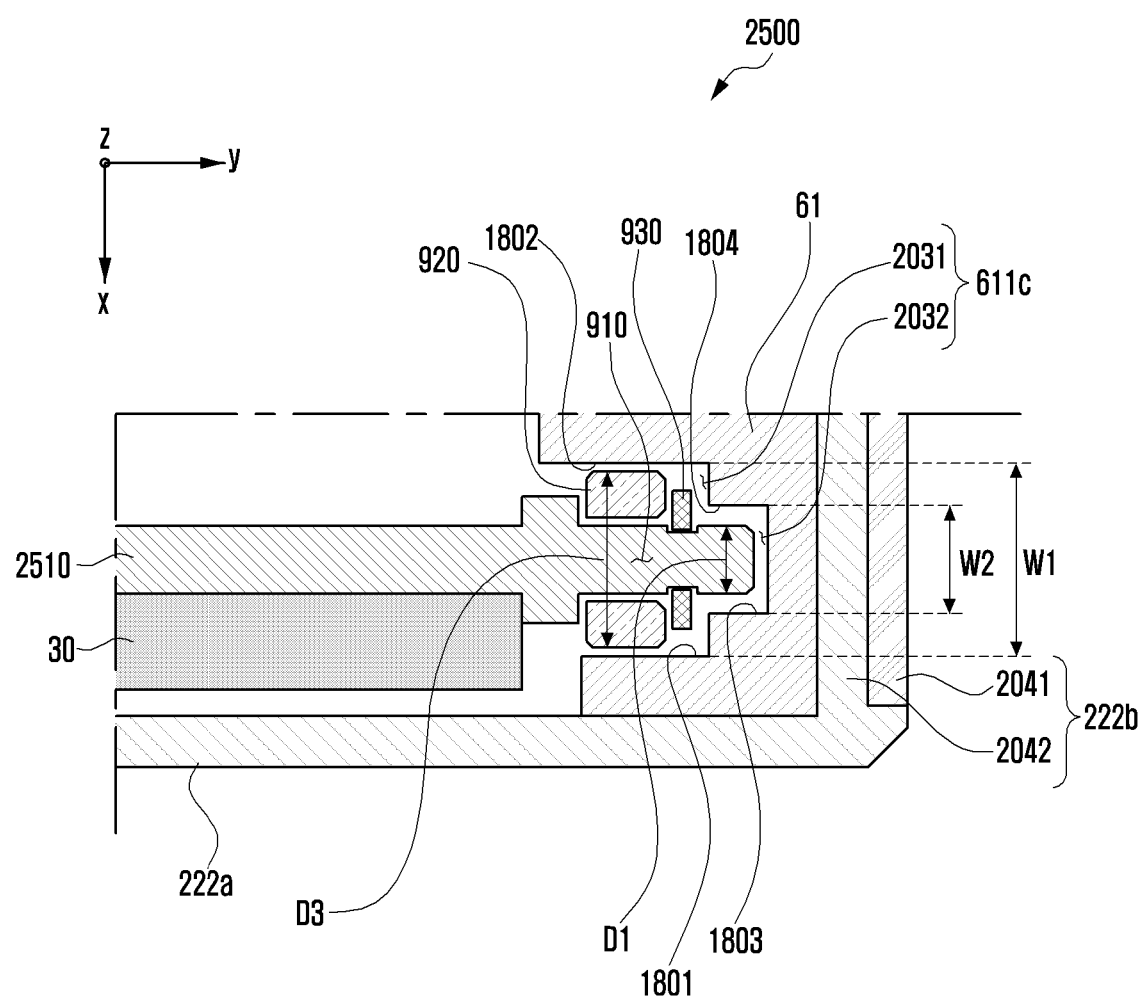
FIG. 25 schematically illustrates a cross-sectional structure in a state in which some of the plurality of support bars of FIG. 8 coupled to a flexible display are positioned in a third rail part of a first guide rail according to an embodiment of the disclosure.

FIG. 25 schematically illustrates a cross-sectional structure in a state in which some of the plurality of support bars of FIG. 8 coupled to the flexible display are positioned in the third rail part of the first guide rail according to an embodiment of the disclosure. A cross-sectional structure 2500 of FIG. 25 may correspond to, for example, a cross-section of the third rail 611c in an x-y plane of FIG. 19.

Referring to FIG. 25, the cross-sectional structure 2500 may include the third support structure 61, the first cover portion 222a, or the second cover portion 222b.

The first shaft 910, the rotation part 920, and the separation prevention part 930 positioned in some support bars 2510 may be inserted into the third rail part 611c of the first guide rail 611. The first shaft 910 may be partially inserted into the second recess 2032 through the first recess 2031.

The rotation part 920 and the separation prevention part 930 may be positioned in the first recess 2031. The third diameter D3 of the outer circumferential surface 922 (see FIG. 8) of the rotation part 920 may be smaller than the first width W1 of the first recess 2031. The first diameter D1 of the first shaft 910 may be smaller than the second width W2 of the second recess 2032. In a state change (e.g., switch between an open state and a closed state) of the electronic device 2, when the first portion 801 (see FIG. 8) of the plurality of support bars 800 is guided and moved to the first guide rail 611, the rotation part 920 may rotate by friction with the first surface 1801 or the second surface 1802 of the third rail part 611c.

According to an embodiment, a difference between the third diameter D3 and the first width W1 may be smaller than a difference between the first diameter D1 and the second width W2. Therefore, the rotation part 920 may come into contact with the first surface 1801 or the second surface 1802 of the first guide rail 611, but the first shaft 910 may not come into contact with the surface (e.g., the third surface 1803 and the fourth surface 1804) of the third rail part 611c. In a state change of the electronic device 2, because the first shaft 910 does not come into contact with the surface of the third rail 611c, a loss of motion transmission or a loss of force transmission by friction may be reduced.

Figure 26:
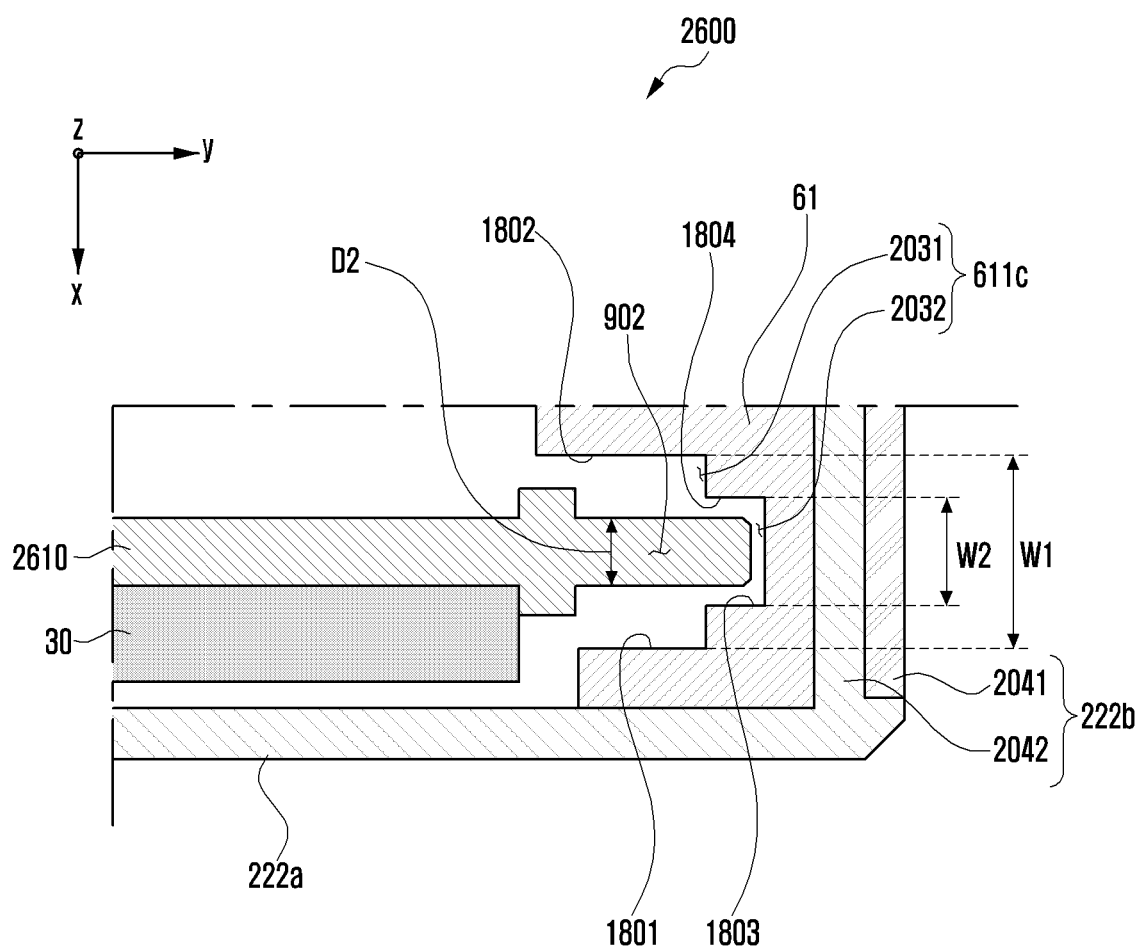
FIG. 26 schematically illustrates a cross-sectional structure in a state in which some of the plurality of support bars of FIG. 8 coupled to a flexible display are positioned in a third rail part of a first guide rail according to an embodiment of the disclosure.

FIG. 26 schematically illustrates a cross-sectional structure in a state in which some of the plurality of support bars of FIG. 8 coupled to the flexible display are positioned in the third rail part of the first guide rail according to an embodiment of the disclosure. A cross-sectional structure 2600 of FIG. 26 may represent, for example, a cross-section of the third rail 611c in the x-y plane of FIG. 19.

Referring to FIG. 26, the second shaft 902 positioned in some support bars 2610 may be inserted into the third rail part 611c of the first guide rail 611. The second shaft 902 may be partially inserted into the second recess 2032 through the first recess 2031. The second diameter D2 of the second shaft 902 may be smaller than the second width W2 of the second recess 2032. In an embodiment, a difference between the first diameter D1 of the rotation part 920 and the first width W1 of the first recess 2031 may be smaller than a difference between the second diameter D2 of the second shaft 902 and the second width W2 of the second recess 2032. Therefore, the rotation part 920 positioned in the first portion 801 (see FIG. 8 or 9) of one first type support bar 810 may come into contact with the first surface 1801 or the second surface 1802 of the third rail part 611c, but it may be difficult that the second shaft 902 positioned in the first portion 801 of the second type support bar 820 adjacent thereto comes into contact with the third surface 1803 and the fourth surface 1804 of the third rail part 611c due to elasticity of the display assembly 700 of FIG. 7. In a state change of the electronic device 2, because the second shaft 902 does not come into contact with surfaces (e.g., the third surface 1803 and the fourth surface 1804) of the third rail part 611c, a loss of motion transmission or a loss of force transmission by friction may be reduced. In a state change of the electronic device 2, because the second shaft 902 does not come into contact with the surface of the third rail part 611c, a loss of motion transmission or a loss of force transmission by friction may be reduced.

Referring to FIGS. 4, 25, and 26, the electronic device 2 may be implemented in the method described with reference to FIG. 25 or 26 with respect to the second guide rail 621 of the fourth support structure 62 and the support bars corresponding to the second guide rail 621. Accordingly, in a state change of the electronic device 2, a frictional force between the second guide rail 621 and the support bars may be reduced.

Figure 27:
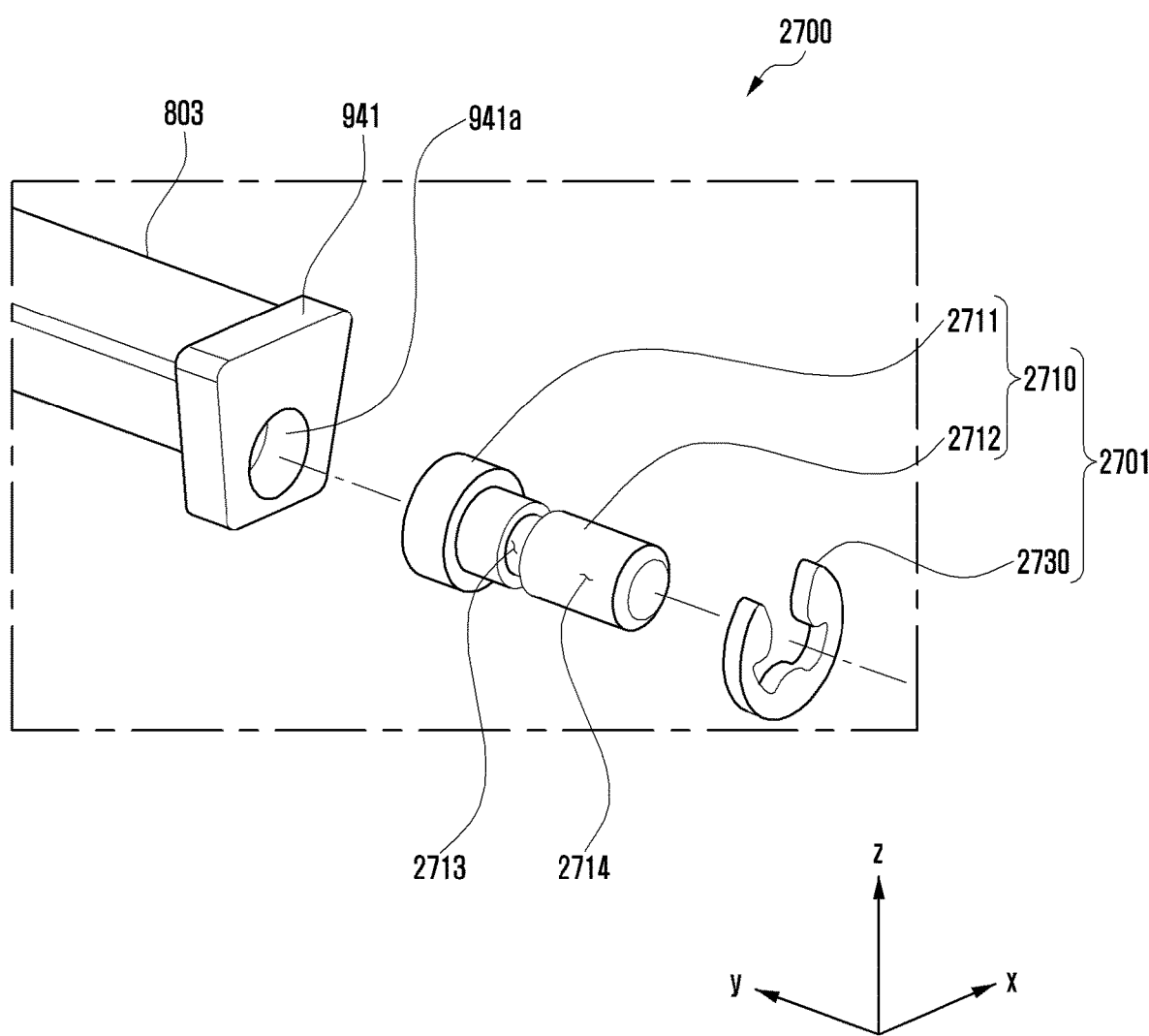
FIG. 27 illustrates a support bar according to an embodiment of the disclosure.

FIG. 27 illustrates a support bar according to an embodiment of the disclosure.

Figure 28:
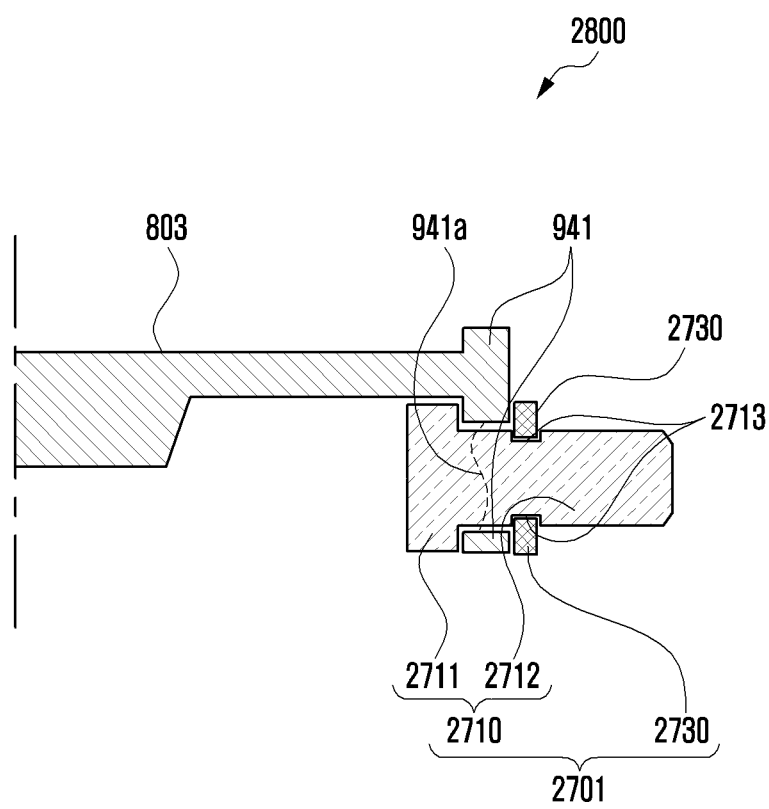
FIG. 28 illustrates a cross-sectional structure of the support bar of FIG. 27 according to an embodiment of the disclosure.

FIG. 28 illustrates a cross-sectional structure of the support bar of FIG. 27 according to an embodiment of the disclosure.

According to various embodiments, the display support structure 50 of FIG. 4 may be implemented by arranging a plurality of support bars 2700 (e.g., fifth type support bar) according to the embodiment of FIG. 27. In some embodiments, the display support structure 50 may be implemented in a form in which the fifth type support bar 2700 and the second type support bar 820 of FIG. 9 are repeatedly arranged.

Referring to FIGS. 27 and 28, the support bar 2700 may include a rotation device 2701 rotatably coupled to one end portion of the third portion 803 and as shown in the cross-sectional structure 2800. In an embodiment, the rotation device 2701 may include a rotation part 2710 and a separation prevention part 2730. The rotation part 2710 may be rotatable with respect to the third portion 803. The rotation part 2710 may include, for example, a head 2711 and a shaft 2712 extended from the head 2711. The shaft 2712 may have a round bar shape. The head 2711 may have a round shape having a larger diameter than that of the shaft 2712. The shaft 2712 may be positioned to penetrate a hole 941a formed in the first wall 941 of the third portion 803. The head 2711 may prevent the shaft 2712 from being separated from the third portion 803 in the −y-axis direction. In some embodiments, the head 2711 may be referred to as a 'separation prevention part.' The separation prevention part 2730 may prevent the rotation part 2710 from being separated from the third portion 803 in the +y-axis direction. The separation prevention part 2730 may include, for example, an E-ring. The shaft 2712 may include a recess 2713 formed in a cylindrical surface 2714, and the E-ring may be fastened to the shaft 2712 in the recess 2713. In order to reduce a loss of motion transmission or a loss of force transmission by reducing a frictional force between the rotation part 2710 and the third portion 803, a lubricant (e.g., grease) may be interposed or may be coated in the friction part between the rotation part 2710 and the third portion 803. The support bar 2700 may include a rotation device rotatably coupled to the other end portion of the third portion 803 in substantially the same manner as that of the rotation device 2701 rotatably coupled to one end portion of the third portion 803. In some embodiments, the rotation part 2710 may be referred to as a 'rotation pin.'

Figure 29:
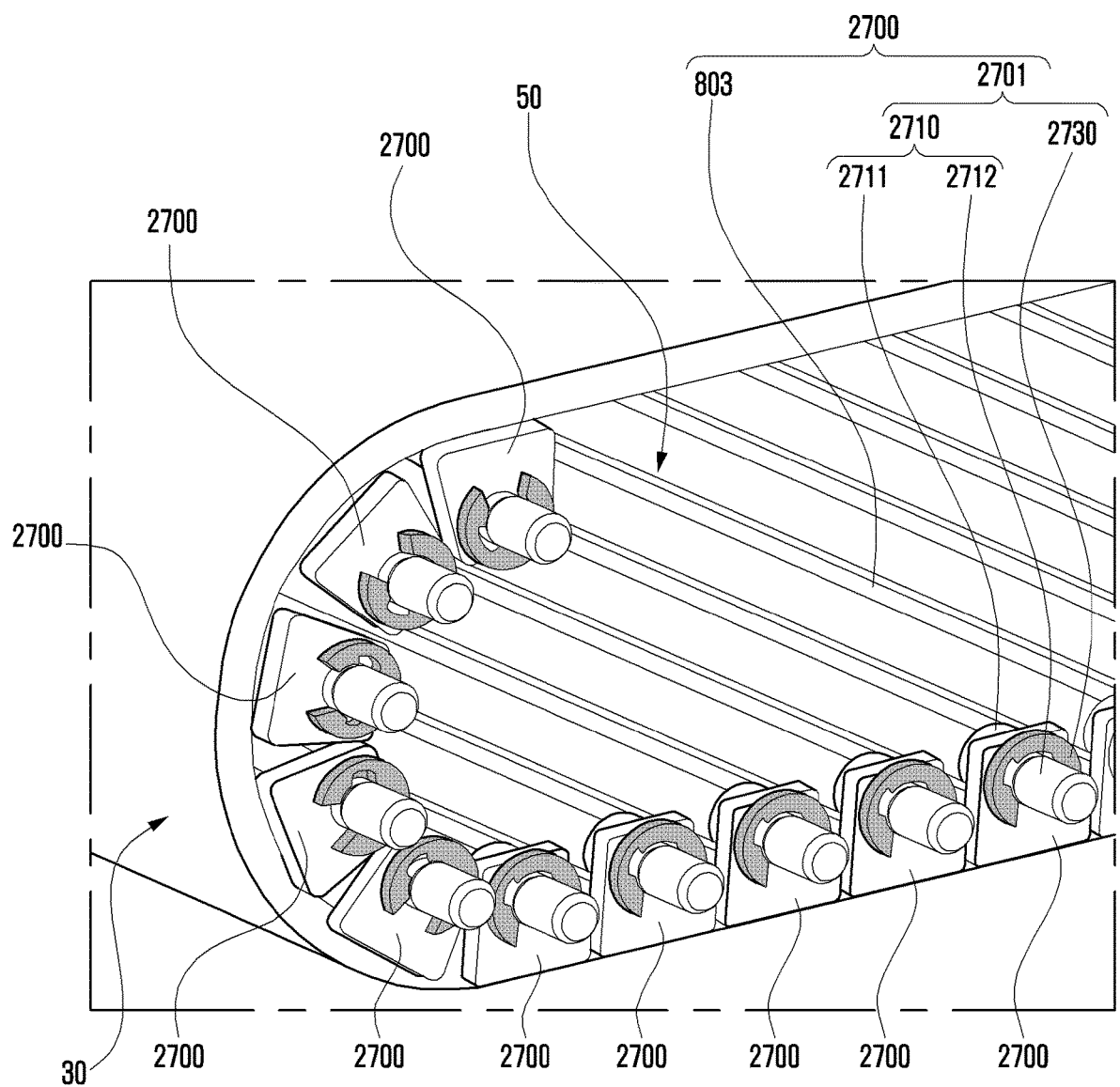
FIG. 29 illustrates a flexible display and a display support structure according to an embodiment of the disclosure.

FIG. 29 illustrates a flexible display and a display support structure according to an embodiment of the disclosure.

Referring to FIG. 29, the display support structure 50 may be implemented by including a plurality of support bars 2700 according to the embodiment of FIG. 27. In an embodiment, the shaft 2712 of the rotation part 2710 positioned at one side of the support bar 2700 may be positioned at or inserted into the first guide rail 611 included in the third support structure 61 of FIG. 4. A shaft of another rotation part positioned at the other side of the support bar 2700 may be positioned at or inserted into the second guide rail 621 included in the fourth support structure 62 of FIG. 4.

Figure 30:
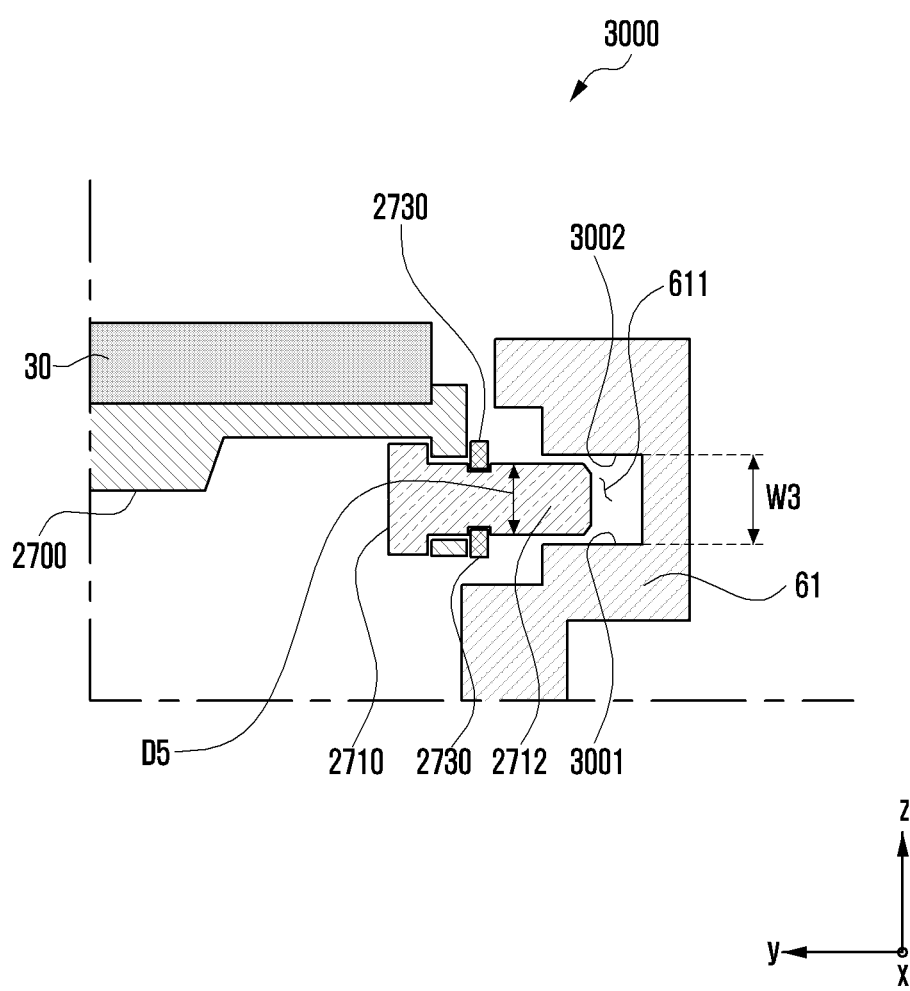
FIG. 30 illustrates a partial cross-sectional structure of the electronic device of FIG. 2A including the support bar of FIG. 27 according to an embodiment of the disclosure.

FIG. 30 illustrates a partial cross-sectional structure of the electronic device of FIG. 2A including the support bar of FIG. 27 according to an embodiment of the disclosure.

Referring to FIGS. 27, 28, and 30, for example, a cross-sectional structure 3000 may include a flexible display 30, a support bar 2700, and/or a third support structure 61. A first guide rail 611 included in the third support structure 61 may include a first surface 3001 (e.g., the first surface 1801 of FIG. 19) and a second surface 3002 (e.g., the second surface 1802 of FIG. 19). The shaft 2712 of the rotation part 2710 included in the support bar 2700 may be inserted into the first guide rail 611. In an embodiment, a diameter D5 of the shaft 2712 may be smaller than a width W3 between the first surface 3001 and the second surface 3002. In a state change of the electronic device 2 (e.g., switch between a closed state and an open state), when a first portion (e.g., the first portion 801 of FIG. 8) of the plurality of support bars is guided and moved to the first guide rail 611, the cylindrical surface 2714 (see FIG. 27) of the shaft 2712 may come into contact with the first surface 3001 or the second surface 3002 of the first guide rail 611. The rotation part 2710 may rotate by friction with the first surface 3001 or the second surface 3002.

The electronic device 2 of FIG. 4 may be implemented in the method described with reference to FIG. 27, 28, or 29 with respect to the second guide rail 621 of the fourth support structure 62 and the support bars corresponding to the second guide rail 621. Accordingly, in a state change of the electronic device 2, a frictional force between the second guide rail 621 and the support bars may be reduced.

Figure 31:
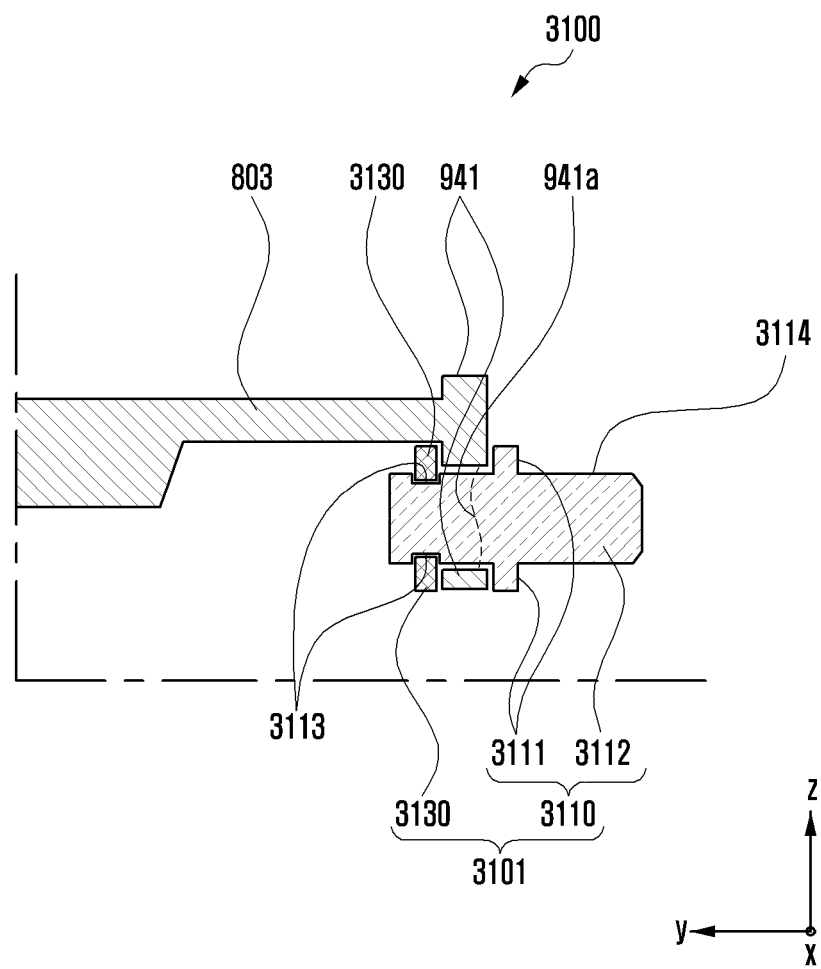
FIG. 31 illustrates a cross-sectional structure of a support bar according to an embodiment of the disclosure.

FIG. 31 illustrates a cross-sectional structure of a support bar according to an embodiment of the disclosure.

According to various embodiments, the display support structure 50 of FIG. 4 may be implemented by arranging a plurality of support bars 3100 (e.g., sixth type support bar) according to the embodiment of FIG. 31. In some embodiments, the display support structure 50 may be implemented in a form in which the sixth type support bar 3100 and the second type support bar 820 of FIG. 9 are repeatedly arranged.

Referring to FIG. 31, the support bar 3100 may include a rotation device 3101 rotatably coupled to one end portion of the third portion 803. In an embodiment, the rotation device 3101 may include a rotation part 3110 and a separation prevention part 3130. The rotation part 3110 may be rotatable with respect to the third portion 803. The rotation part 3110 may include, for example, a round bar-shaped shaft (e.g., pin) 3112 and a protrusion 3111. The protrusion 3111 may be implemented in a form protruded from an outer circumferential surface of the shaft 3112. The protrusion 3111 may be integrally formed with the shaft 3112. In some embodiments, the protrusion 3111 may be provided separately from the shaft 3112 to be coupled to the shaft 3112. The shaft 3112 may be positioned to penetrate the hole 941a formed in the first wall 941 of the third portion 803. The protrusion 3111 may prevent the shaft 3112 from being separated from the third portion 803 in a +y-axis direction. In some embodiments, the protrusion 3111 may be referred to as a 'separation prevention part.' The separation prevention part 3130 may prevent the rotation part 3110 from being separated from the third portion 803 in −y-axis direction. The separation prevention part 3130 may include, for example, an E-ring. The shaft 3112 may include a recess 3113 formed in a cylindrical surface 3014, and the E-ring may be fastened to the shaft 3112 in the recess 3113. In order to reduce a loss of motion transmission or a loss of force transmission by reducing a frictional force between the rotation part 3110 and the third portion 803, a lubricant (e.g., grease) may be interposed or may be coated in a friction part between the rotation part 3110 and the third portion 803. The support bar 3100 may include a rotation device rotatably coupled to the other end portion of the third portion 803 in substantially the same manner as the rotation device 3101 rotatably coupled to one end portion of the third portion 803.

Figure 32:
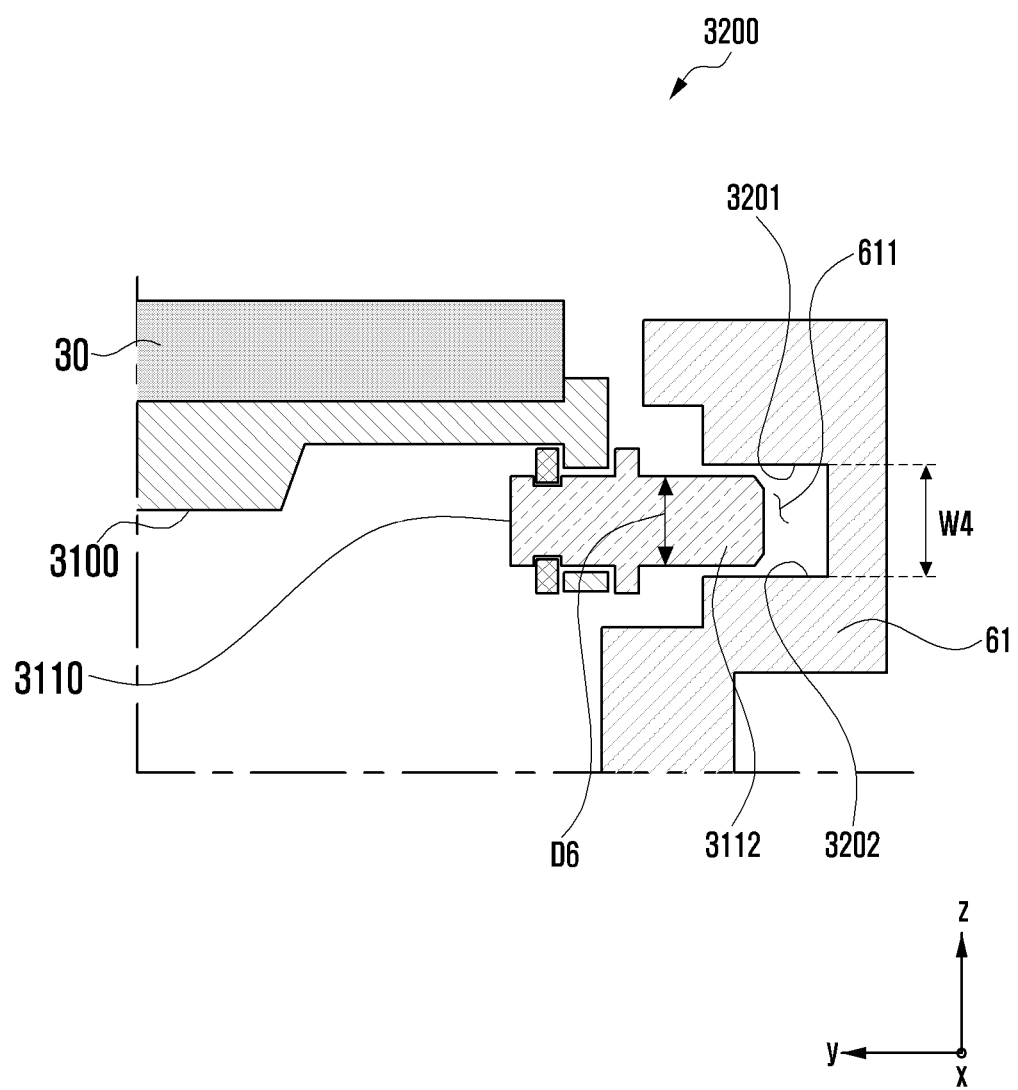
FIG. 32 illustrates a partial cross-sectional structure of the electronic device of FIG. 2A including the support bar of FIG. 31 according to an embodiment of the disclosure.

FIG. 32 illustrates a partial cross-sectional structure of the electronic device of FIG. 2A including the support bar of FIG. 31 according to an embodiment of the disclosure.

Referring to FIGS. 31 and 32, for example, a cross-sectional structure 3200 may include the flexible display 30, a support bar 3100, and/or the third support structure 61. The first guide rail 611 included in the third support structure 61 may include a first surface 3201 (e.g., the first surface 1801 of FIG. 19) and a second surface 3202 (e.g., the second surface 1802 of FIG. 19). The shaft 3112 of the rotation part 3110 included in the support bar 3100 may be inserted into the first guide rail 611. In an embodiment, a diameter D6 of the shaft 3112 may be smaller than a width W4 between the first surface 3201 and the second surface 3202. In a state change (e.g., switch between a closed state and an open state) of the electronic device 2, when a first portion (e.g., the first portion 801 of FIG. 8) of the plurality of support bars is guided and moved to the first guide rail 611, an outer circumferential surface 3114 (see FIG. 31) of the shaft 3212 may come into contact with the first surface 3201 or the second surface 3202. The rotation part 3110 may rotate by friction with the first surface 3201 or the second surface 3202.

The electronic device 2 of FIG. 4 may be implemented in the method described with reference to FIG. 31 or 32 with respect to the second guide rail 621 of the fourth support structure 62 and support bars corresponding to the second guide rail 621. Accordingly, in a state change of the electronic device 2, a frictional force between the second guide rail 621 and the support bars may be reduced.

According to an embodiment of the disclosure, the electronic device (e.g., the electronic device 2 of FIG. 4) may include a housing (e.g., the housing 20 of FIG. 2A). The electronic device may include a flexible display (e.g., the flexible display 30 of FIG. 4) positioned in the housing so that at least a portion thereof is drawn outside the housing or introduced into an inner space of the housing. The electronic device may include a display support structure (e.g., the display support structure 50 of FIG. 4) including a plurality of support bars (e.g., the plurality of support bars 800 of FIG. 8) supporting a rear surface of the flexible display. The plurality of support bars each may include a first end portion (e.g., the first portion 801 of FIG. 9), a second end portion (e.g., the second portion 802 of FIG. 9), and a display support (e.g., the third portion 803 of FIG. 9) positioned to correspond to the flexible display between the first end portion and the second end. The electronic device may include a first guide rail (e.g., the first guide rail 611 of FIG. 4) including a recess into which first end portions (e.g., the first end portions 8011 of FIG. 9) of the plurality of support bars are inserted and formed along a path in which the display support structure is moved when at least a portion of the flexible display is drawn outside the housing or introduced into an inner space of the housing. The electronic device may include a second guide rail (e.g., the second guide rail 621 of FIG. 4) formed along the path. The second guide rail may include a recess into which second end portions (e.g., the second end portions 8021 of FIG. 9) of the plurality of support bars are inserted. The electronic device may include a rotation part (e.g., the rotation part 920 of FIG. 8 or 9) rotatably positioned in at least one of the first end portions in the recess of the first guide rail and rotatably positioned in at least one of the second end portions in the recess of the second guide rail.

According to an embodiment of the disclosure, a recess of the first guide rail (e.g., the first guide rail 611 of FIG. 4) and a recess of the second guide rail (e.g., the second guide rail 621 of FIG. 4) may include a first surface (e.g., the first surface 1801 of FIG. 20) and a second surface (e.g., the second surface 1802 of FIG. 20) positioned to face each other with a separation space therebetween. When the display support structure (e.g., the display support structure 50 of FIG. 4) is moved, the rotation part (e.g., the rotation part 920 of FIG. 18) may include a cylindrical surface (e.g., the outer circumferential surface 922 of FIG. 8) rotated by friction with the first surface or the second surface.

According to an embodiment of the disclosure, the diameter (e.g., the third diameter D3 of FIG. 21) of the cylindrical surface (e.g., the outer circumferential surface 922 of FIG. 8) may be smaller than a separation distance (e.g., the first width W1) between the first surface (e.g., the first surface 1801 of FIG. 21) and the second surface (e.g., the second surface 1802 of FIG. 21).

According to an embodiment of the disclosure, the first end portion (e.g., the first portion 801 of FIG. 9) and the second end portion (e.g., the second portion 802 of FIG. 9) may include a round bar-shaped shaft extended from the display support part (e.g., the third portion 803 of FIG. 9). The shaft may include a first shaft (e.g., the first shaft 910 of FIG. 9) in which the rotation part is positioned or a second shaft (e.g., the second shaft 902 of FIG. 9) in which the rotation part is not positioned. The rotation part (e.g., the rotation part 920 of FIG. 9) may include a circular ring-shaped roller rotatably positioned in the first shaft penetrating a hole (e.g., the hole 921 of FIG. 8) included therein.

According to an embodiment of the disclosure, the first shaft (e.g., the first shaft 910 of FIG. 9) may include a first extension portion (e.g., the first extension portion 913 of FIG. 8) in which the roller (e.g., the rotation part 920 of FIG. 9) is rotatably positioned and a second extension portion (e.g., the second extension portion 914 of FIG. 8) extended from the first extension portion and protruded from the roller. The recess of the first guide rail (e.g., the first guide rail 611 of FIG. 4) and the recess of the second guide rail (e.g., the second guide rail 621 of FIG. 4) may include a first recess (e.g., the first recess 2031 of FIG. 21) and a second recess (e.g., the second recess 2032 of FIG. 21). The first recess may include a first surface (e.g., the first surface 1801 of FIG. 21) and a second surface (e.g., the second surface 1802 of FIG. 21) positioned to face each other with a separation space therebetween. The roller (e.g., the rotation part 920 of FIG. 21) may be positioned in the first recess. The second recess may be extended from the first recess. The second recess may include a third surface (e.g., the third surface 1803 of FIG. 21) and a fourth surface (e.g., the fourth surface 1804 of FIG. 21) positioned to face each other with a separation space therebetween. The second extension portion (e.g., the second extension portion 914 of FIG. 8 or 21) may be positioned in the second recess. The roller may include a cylindrical surface (e.g., the outer circumferential surface 922 of FIG. 8) rotated by friction with the first surface or the second surface when the display support structure (e.g., the display support structure 50 of FIG. 4) is moved. A diameter (e.g., the third diameter D3 of FIG. 21) of a cylindrical surface of the roller may be smaller than a first separation distance (e.g., the first width W1 of FIG. 21) between the first surface and the second surface. A diameter (e.g., the first diameter D1 of FIG. 21) of the first shaft (e.g., the first shaft 910 of FIG. 21) may be smaller than a second separation distance (e.g., the second width W2 of FIG. 21) between the third surface and the fourth surface.

According to an embodiment of the disclosure, a difference between a diameter (e.g., the third diameter D3 of FIG. 21) of the cylindrical surface (e.g., the outer circumferential surface 922 of FIG. 8) and the first separation distance (e.g., the first width W1 of FIG. 21) may be smaller than a difference between the diameter (e.g., the first diameter D1 of FIG. 21) of the first shaft (e.g., the first shaft 910 of FIG. 21) and the second separation distance (e.g., the second width W1 of FIG. 21).

According to an embodiment of the disclosure, the first shaft (e.g., the first shaft 910 of FIG. 9) and the second shaft (e.g., the second shaft 902 of FIG. 9) may have the same diameter.

According to another embodiment of the disclosure, the first shaft (e.g., the first shaft 910 of FIG. 9) and the second shaft (e.g., the second shaft 902 of FIG. 9) may be extended to the same length. A diameter (e.g., the first diameter D1 of FIG. 21) of the first shaft and a diameter (e.g., the second diameter D2 of FIG. 22) of the second shaft may be different from each other. A difference between a diameter (e.g., the third diameter D3 of FIG. 21) of the cylindrical surface (e.g., the outer circumferential surface 922 of FIG. 8) and the first separation distance (e.g., the first width W1 of FIG. 21) may be smaller than a difference between a diameter (e.g., the second diameter D2 of FIG. 22) of the second shaft (e.g., the second shaft 902 of FIG. 22) and the second separation distance (e.g., the second width W2 of FIG. 22).

According to an embodiment of the disclosure, the electronic device (e.g., the electronic device 2 of FIG. 4) may further include a separation prevention member (e.g., the separation preventing portion 930 of FIG. 21) fastened to the second extension portion (e.g., the second extension portion 914 of FIG. 21) in the first recess (e.g., the first recess 2031 of FIG. 21).

According to an embodiment of the disclosure, the rotation part may include a rotation pin (e.g., the rotation part 2710 of FIG. 27 or the rotation part 3110 of FIG. 31) rotatably positioned in a hole (e.g., the hole 941a of FIG. 27 or 31) formed in the display support part (e.g., the third portion 803 of FIG. 27 or 31).

According to an embodiment of the disclosure, the electronic device (e.g., the electronic device 2 of FIG. 4) may further include a separation prevention member (e.g., the separation prevention part 2730 of FIG. 27) fastened to the rotation pin (e.g., the rotation part 2710 of FIG. 27). The separation prevention member may be interposed between the hole (e.g., the hole 941a of FIG. 27) and the first guide rail (e.g., the first guide rail 611 of FIG. 30) or the second guide rail in which the rotation part is positioned.

According to another embodiment of the disclosure, the electronic device (e.g., the electronic device 2 of FIG. 4) may further include a separation prevention member (e.g., the separation prevention member 3130 of FIG. 31) fastened to the rotation pin (e.g., the rotation part 3110 of FIG. 31). The separation prevention member may be positioned opposite to the first guide rail (e.g., the first guide rail 611 of FIG. 32) or the second guide rail in which the rotation part is positioned based on the hole (e.g., the hole 941a of FIG. 31).

According to an embodiment of the disclosure, at least one support bar of the plurality of support bars may include the rotation part positioned at both the first end portion and the second end portion (e.g., the first type support bar 810 of the FIG. 8).

According to another embodiment of the disclosure, at least one support bar of the plurality of support bars may include the rotation part positioned at one of the first end portion and the second end portion (e.g., the third part type support bar 1310 or the fourth type support bar 1320 of FIG. 13).

According to an embodiment of the disclosure, the rotation part may be positioned in the first support bar among the first support bar and a second support bar adjacent to each other among the plurality of support bars, and be positioned at both the first end portion and the second end portion of the first support bar (e.g., the plurality of support bars 800 of FIG. 8).

According to another embodiment of the disclosure, in a first support bar and a second support bar adjacent to each other among the plurality of support bars, the rotation part may be positioned at the first end portion among the first end portion and the second end portion of the first support bar and be positioned at the second end portion among the first end portion and the second end portion of the second support bar (e.g., the plurality of support bars 1300 of FIG. 13).

According to an embodiment of the disclosure, the housing (e.g., the housing 20 of FIG. 2A) may include a first housing part (e.g., the first housing part 21 of FIG. 4), and a second housing part (e.g., the second housing part 22 of FIG. 4) slidable with respect to the first housing part. The flexible display (e.g., the flexible display 30 of FIG. 4) may include a first area (e.g., the first area ① of FIG. 4) corresponding to the first housing part and a second area (e.g., the second area ② of FIG. 4) drawn outside the housing or introduced into the inner space of the housing according to sliding of the second housing part.

According to an embodiment of the disclosure, the display support structure (e.g., the display support structure 50 of FIG. 4) may be positioned to correspond to a rear surface of the second area (e.g., the second area ② of FIG. 4).

According to an embodiment of the disclosure, the electronic device (e.g., the electronic device 2 of FIG. 4) may include a housing (e.g., the housing 20 of FIG. 2A). The electronic device may include a flexible display (e.g., the flexible display 30 of FIG. 4) positioned in the housing so that at least a portion thereof is drawn outside the housing or introduced into an inner space of the housing. The electronic device may include a display support structure (e.g., the display support structure 50 of FIG. 4) including a plurality of support bars (e.g., a plurality of support bars 800 of FIG. 8) positioned in the rear surface of the flexible display. The electronic device may include a first guide rail (e.g., the first guide rail 611 of FIG. 4) formed along a movement path of the plurality of support bars corresponding to one end portion (e.g., the first portions 8011 of FIG. 9) of the plurality of support bars. The electronic device may include a second guide rail (e.g., the second guide rail 621 of FIG. 4) formed along the movement path corresponding to other end portions (e.g., the second portions 8021 of FIG. 9) of the plurality of support bars. The electronic device may include a rotation part (e.g., the rotation part 920 of FIG. 8 or 9) rotatably positioned in at least one of the one end portions and at least one of the other end portions.

According to an embodiment of the disclosure, the first guide rail (e.g., the first guide rail 611 of FIG. 4) and the second guide rail (e.g., the second guide rail 621 of FIG. 4) may include a first surface (e.g., the first surface 1801 of FIG. 20) and a second surface (e.g., the second surface 1802 of FIG. 20) positioned to face each other with a separation distance therebetween. When the display support structure (e.g., the display support structure 50 of FIG. 4) is moved, the rotation part (e.g., the rotation part 920 of FIG. 18) may include a cylindrical surface (e.g., the outer circumferential surface 922 of FIG. 8) rotating by friction with the first surface or the second surface. A diameter (e.g., the third diameter D3 of FIG. 21) of the cylindrical surface may be smaller than a separation distance (e.g., the first width W1) between the first surface (e.g., the first surface 1801 of FIG. 21) and the second surface 1802 (e.g., the second surface of FIG. 21).

While the disclosure has been shown and described with reference to various embodiments thereof, it will be understood by those skilled in the art that various changes in form and detail may be made therein without departing from the spirit and scope of the disclosure as defined by the appended claims and their equivalents.

The invention claimed is:

1. An electronic device, comprising:
   a housing;
   a flexible display disposed in the housing so that at least a portion of the flexible display is either drawn outside from an inner space of the housing or introduced into the inner space of the housing;
   a display support structure including a plurality of support bars supporting a rear surface of the flexible display, wherein the plurality of support bars each comprise:
      a first end portion,
      a second end portion, and
      a display support disposed to correspond to the flexible display between the first end portion and the second end portion;
   a first guide rail including a first guide recess formed along a path in which the display support structure is moved when at least the portion of the flexible display is drawn outside from the housing or introduced into the inner space of the housing, the first end portion of each of the plurality of support bars being inserted into the first guide recess;
   a second guide rail including a second guide recess formed along the path, the second end portion of each of the plurality of support bars being inserted into the second guide recess; and
   a rotation part rotatably disposed in the first end portion of at least one of the plurality of support bars in the first guide recess of the first guide rail and rotatably disposed in the second end portion of at least one of the plurality of support bars in the second guide recess of the second guide rail.

2. The electronic device of claim 1,
   wherein the first guide recess of the first guide rail and the second guide recess of the second guide rail comprise a first surface and second surface disposed to face each other with a separation space therebetween, and
   wherein the rotation part comprises a cylindrical surface rotated by friction with the first surface or the second surface while the display support structure is being moved.

3. The electronic device of claim 2, wherein a diameter of the cylindrical surface is smaller than a separation distance between the first surface and the second surface.

4. The electronic device of claim 1,
   wherein the first end portion and the second end portion comprise a round bar-shaped shaft extending from the display support,
   wherein the round bar-shaped shaft comprises at least one of a first shaft in which the rotation part is disposed or a second shaft in which the rotation part is not disposed, and
   wherein the rotation part comprises a circular ring-shaped roller rotatably disposed in the first shaft penetrating a hole included in the rotation part.

5. The electronic device of claim 4,
wherein the first shaft comprises:
a first extension portion in which the circular ring-shaped roller is rotatably disposed; and
a second extension portion extending from the first extension portion and protruding from the circular ring-shaped roller,
wherein the first guide recess of the first guide rail and the second guide recess of the second guide rail comprise:
a first recess including a first surface and second surface disposed to face each other with a separation space therebetween, and in which the circular ring-shaped roller is disposed; and
a second recess extended from the first recess and including a third surface and a fourth surface disposed to face each other with a separation space therebetween, the second extension portion being inserted into the second recess,
wherein the circular ring-shaped roller comprises a cylindrical surface rotated by friction with the first surface or the second surface while the display support structure is being moved,
wherein a diameter of the cylindrical surface of the circular ring-shaped roller is smaller than a first separation distance between the first surface and the second surface, and
wherein a diameter of the first shaft is smaller than a second separation distance between the third surface and the fourth surface.

6. The electronic device of claim 5, wherein a difference between the diameter of the cylindrical surface and the first separation distance is smaller than a difference between the diameter of the first shaft and the second separation distance.

7. The electronic device of claim 6, wherein the first shaft and the second shaft have a same diameter.

8. The electronic device of claim 6,
wherein the first shaft and the second shaft are extended to a same length,
wherein the diameter of the first shaft and a diameter of the second shaft are different from each other, and
wherein a difference between the diameter of the cylindrical surface and the first separation distance is smaller than a difference between the diameter of the second shaft and the second separation distance.

9. The electronic device of claim 5, further comprising:
a separation prevention member fastened to the second extension portion in the first recess.

10. The electronic device of claim 1, wherein the rotation part comprises a rotation pin rotatably disposed in a hole formed in the display support.

11. The electronic device of claim 10, further comprising:
a separation prevention member fastened to the rotation pin,
wherein the separation prevention member is interposed between the hole and the first guide rail or the second guide rail in which the rotation part is disposed.

12. The electronic device of claim 10, further comprising:
a separation prevention member fastened to the rotation pin,
wherein the separation prevention member is disposed opposite to the first guide rail or the second guide rail in which the rotation part is disposed based on the hole.

13. The electronic device of claim 1, wherein at least one support bar of the plurality of support bars comprises the rotation part disposed at both the first end portion and the second end portion.

14. The electronic device of claim 1, wherein at least one support bar of the plurality of support bars comprises the rotation part disposed at one of the first end portion and the second end portion.

15. The electronic device of claim 1,
wherein the rotation part is disposed at a first support bar among the first support bar and second support bar adjacent to each other among the plurality of support bars, and
wherein the rotation part is disposed at both the first end portion and the second end portion of the first support bar.

16. The electronic device of claim 1,
wherein, in a first support bar and a second support bar adjacent to each other among the plurality of support bars, the rotation part is disposed at one first end portion among the first end portion and the second end portion of the first support bar, and
wherein, in at least two support bars adjacent to each other among the plurality of support bars, the rotation part is disposed at one second end portion among the first end portion and the second end portion of the second support bar.

17. The electronic device of claim 1,
wherein the housing comprises a first housing part and a second housing part slidable with respect to the first housing part, and
wherein the flexible display comprises a first area corresponding to the first housing part and a second area drawn outside the housing or introduced into the inner space of the housing according to sliding of the second housing part.

18. The electronic device of claim 17, wherein the display support structure is disposed to correspond to a rear surface of the second area.

19. An electronic device, comprising:
a housing;
a flexible display, wherein at least a portion of the flexible display is configured to slide out from an inner space of the housing or slide into the inner space of the housing;
a display support structure including a plurality of support bars disposed in a rear surface of the flexible display;
a first guide rail formed along a movement path of the plurality of support bars to correspond to first end portions of the plurality of support bars; and
a first rotation part rotatably disposed on at least one of the first end portions of the plurality of support bars and located in the first guide rail,
wherein the first end portions comprise a first shaft in which the first rotation part is disposed or a second shaft in which the first rotation part is not disposed.

20. The electronic device of claim 19,
wherein the first guide rail comprises a recess including a first surface and a second surface disposed to face each other with a separation space therebetween,
wherein the first rotation part comprises a cylindrical surface rotating by friction with the first surface or the second surface while the display support structure is being moved, and
wherein a diameter of the cylindrical surface is smaller than a separation distance between the first surface and the second surface.

21. The electronic device of claim 19,
wherein the housing comprises a first housing part and a second housing part slidable with respect to the first housing part, and wherein the flexible display comprises a first area corresponding to the first housing part and a second area either drawn outside from the inner space of the housing or introduced into the inner space of the housing according to a sliding of the second housing part.

22. The electronic device of claim 19,
wherein the flexible display comprises a screen including a first flat portion, a first curved portion, and a second curved portion,
wherein the first flat portion is interposed between the first curved portion and the second curved portion, and
wherein the first curved portion and the second curved portion are curved from the first flat portion toward a rear surface of the electronic device.

23. The electronic device of claim 22,
wherein the first curved portion and the second curved portion are symmetrical with the first flat portion interposed therebetween, and
wherein the first flat portion is configured to expand or contract according to a change in state of the electronic device.

\* \* \* \* \*